(12) United States Patent
Ogawa et al.

(10) Patent No.: US 6,952,049 B1
(45) Date of Patent: Oct. 4, 2005

(54) CAPACITOR-BUILT-IN TYPE PRINTED WIRING SUBSTRATE, PRINTED WIRING SUBSTRATE, AND CAPACITOR

(75) Inventors: Kouki Ogawa, Aichi (JP); Eiji Kodera, Gifu (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/538,469

(22) Filed: Mar. 29, 2000

(30) Foreign Application Priority Data

| Mar. 30, 1999 | (JP) | ................................. | 11-089490 |
| Jul. 30, 1999 | (JP) | ................................. | 11-216887 |

(51) Int. Cl.7 ......................................... H01L 23/053
(52) U.S. Cl. ........................ 257/700; 257/701; 257/702
(58) Field of Search .............................. 257/700, 701, 257/702–707, 678

(56) References Cited

U.S. PATENT DOCUMENTS

| 4,143,508 | A |   | 3/1979  | Ohno |              |
|-----------|---|---|---------|------|--------------|
| 4,328,530 | A |   | 5/1982  | Bajorek et al. | |
| 4,453,176 | A |   | 6/1984  | Chance et al. |  |
| 5,177,670 | A |   | 1/1993  | Shinohara et al. | |
| 5,729,053 | A |   | 3/1998  | Orthmann |     |
| 5,831,833 | A | * | 11/1998 | Shirakawa ................... 361/762 |
| 5,866,952 | A |   | 2/1999  | Wojnarowski et al. ...... 257/788 |
| 6,023,407 | A | * | 2/2000  | Farooq ........................ 361/303 |
| 6,043,987 | A | * | 3/2000  | Goodwin ..................... 257/724 |
| 6,218,729 | B1 | * | 4/2001  | Zavrel, Jr. ................... 257/698 |
| 6,222,246 | B1 | * | 4/2001  | Mak ............................ 257/532 |
| 6,239,485 | B1 | * | 5/2001  | Peters ......................... 257/700 |

FOREIGN PATENT DOCUMENTS

| JP | 4-356998    | A |   | 12/1992 |
|----|-------------|---|---|---------|
| JP | 406232301   | A | * | 8/1994  |
| JP | 6-326472    | A |   | 11/1994 |
| JP | 7-263619    | A |   | 10/1995 |
| JP | 11-45955    | A |   | 2/1999  |
| JP | 11-74648    |   |   | 3/1999  |
| JP | 11-74648    | A |   | 3/1999  |
| JP | 11-126978   | A |   | 5/1999  |
| JP | 11-317490   |   |   | 11/1999 |

* cited by examiner

OTHER PUBLICATIONS

European Search Report for EP 00 30 2581 dated Oct. 14, 2003.

Primary Examiner—Hoai Pham
Assistant Examiner—Nathan W. Ha
(74) Attorney, Agent, or Firm—Sughrue Mion, PLLC

(57) ABSTRACT

A capacitor-built-in-type printed wiring substrate which can reliably eliminate noise and attain extremely low resistance and low inductance in connections between an IC chip and the capacitor, and a printed wiring substrate and capacitor for use in the same. A capacitor-built-in-type printed wiring substrate 100 on which an IC chip is mounted includes a capacitor-built-in-type printed wiring substrate 110 and an IC chip 101 mounted on the capacitor-built-in-type printed wiring substrate 110. A printed wiring substrate 120 includes a number of connection-to-IC substrate bumps 152 and a closed-bottomed capacitor accommodation cavity 121 formed therein. A capacitor 130 is disposed in the cavity 121 and includes a pair of electrode groups 133E and 133F and a number of connection-to-IC capacitor bumps 131 connected to either one of the paired electrode groups 133E and 133F. The connection-to-IC capacitor bumps 131 are flip-chip-bonded to corresponding connection-to-capacitor bumps 103 on the IC chip 101. The connection-to-IC substrate bumps 152 are flip-chip-bonded to corresponding connection-to-substrate bumps 104 on the IC chip 101.

16 Claims, 28 Drawing Sheets

CAPACITOR-BUILT-IN TYPE PRINTED WIRING SUBSTRATE, PRINTED WIRING SUBSTRATE, AND CAPACITOR

BACKGROUND OF THE INVENTION

1. Field of the Invention

The present invention relates to a capacitor-built-in-type printed wiring substrate. More particularly, the invention relates to a capacitor-built-in-type printed wiring substrate on which an IC chip or IC-chip-carrying printed wiring substrate is mounted while connection terminals formed on the capacitor and those formed on the printed wiring substrate are connected to the IC chip or IC-chip-carrying printed wiring substrate, as well as to a capacitor-built-in-type printed wiring substrate capable of being connected to an IC chip or IC-chip-carrying printed wiring substrate. Also, the invention relates to a printed wiring substrate and a capacitor for use in the capacitor-built-in-type printed wiring substrate.

2. Description of the Related Art

With advancement of integrated-circuit technology, the operating speed of an IC chip has increased, potentially involving malfunction caused by superposition of noise on, for example, a power line. As a measure for eliminating noise, as shown in FIG. 30, a chip capacitor 3 is mounted on an upper surface 2A or on a lower surface 2B of a printed wiring substrate 2 on which an IC chip 1 is mounted. Capacitor connection lines 4 to be connected to two electrodes of the capacitor 3 are disposed in the printed wiring substrate 2. The chip capacitor 3 is connected to the IC chip 1 via the capacitor connection lines 4 and flip-chip pads 5.

3. Problems to be Solved by the Invention

However, the above process requires a designer to previously reserve area for mounting of the chip capacitor 3, thereby lowering the degree of freedom in mounting of other electronic components and attachment of a reinforcing member for reinforcing the printed wiring substrate. Further, the presence of other circuit lines tends to cause the capacitor connection lines 4, which extend between the IC chip 1 and the chip capacitor 3, to become relatively long and thin. As a result, the resistance and inductance of the capacitor connection line 4 itself tend to increase, failing to sufficiently meet demand for low resistance and low inductance.

In order to cope with the above problem, a capacitor may be integrally formed in a printed wiring substrate. Specifically, resin insulation layers and wiring layers formed on both sides of a core substrate are partially utilized so as to form a capacitor structure in which a resin insulation layer serving as a dielectric layer is sandwiched between opposed wiring layers (electrode layers). However, in the event the capacitor becomes defective due to short circuit or defective insulation resistance, the entire value-added printed wiring substrate must be discarded, representing a considerable loss. Thus, the manufacturing cost of a printed wiring substrate increases. Moreover, even when high-dielectric-constant ceramic powder is mixed in, the specific dielectric constant of the resin insulation layer is generally 40 to 50 at the highest, and hence the built-in capacitor encounters difficulty in attaining a sufficiently large capacitance.

The printed wiring substrate may assume a size substantially equal to that of an IC chip. A CSP (chip scale package) is an example of such a printed wiring substrate. When the printed wiring substrate assumes the form of a CSP, the printed wiring substrate (CSP) on which an IC chip is mounted is itself mounted on another printed wiring substrate. Even in this case, a need to eliminate noise may arise. However, as in the case described above, the other printed wiring substrate encounters difficulty in carrying a chip capacitor while meeting demand for attainment of low resistance and low inductance or in forming therein a capacitor of large capacitance.

Also, for example, in order to enable insertion and connection of a printed wiring substrate having BGA-type terminals to a socket or through-holes of a motherboard or in order to ease thermal stress arising between the printed wiring substrate and the socket or motherboard, an interposer may be interposed between the printed wiring substrate and the socket or motherboard to thereby establish connection therebetween. Even when such an interposer is used, need to eliminate noise by means of a capacitor may arise.

SUMMARY OF THE INVENTION

The present invention has been achieved in view of the above problems, and an object of the invention is to provide a capacitor-built-in-type printed wiring substrate which can reliably eliminate noise and attains extremely low resistance and low inductance involved in connection between an IC chip and the capacitor, as well as to provide a capacitor-built-in-type printed wiring substrate which attains extremely low resistance and low inductance involved in connection between an IC-chip-carrying printed wiring substrate and the capacitor. Another object of the present invention is to provide a capacitor-built-in-type printed wiring substrate capable of carrying an IC chip or IC-chip-carrying printed wiring substrate. Still another object of the present invention is to provide a printed wiring substrate and a capacitor for use in such a capacitor-built-in-type printed wiring substrate.

To achieve this object, the present invention provides a capacitor-built-in-type printed wiring substrate on which an IC chip is mounted and which is characterized by the following. The capacitor comprises a pair of electrodes or electrode groups; and a plurality of capacitor terminals, each terminal being electrically connected to either one of the paired electrodes or electrode groups, the paired electrodes or electrode groups each being electrically connected to at least one of the plurality of capacitor terminals. The printed wiring substrate comprises a plurality of substrate terminals. The plurality of capacitor terminals of the capacitor are respectively flip-chip-bonded to a plurality of connection-to-capacitor terminals of the IC chip. The plurality of substrate terminals of the printed wiring substrate are respectively flip-chip-bonded to a plurality of connection-to-substrate terminals of the IC chip.

In the capacitor-built-in-type printed wiring substrate, the IC chip has the plurality of connection-to-capacitor terminals for connection to the capacitor and the plurality of connection-to-substrate terminals for connection to the printed wiring substrate. The printed wiring substrate is flip-chip-bonded to the plurality of connection-to-substrate terminals of the IC chip, by means of the plurality of corresponding substrate terminals. Accordingly, signals can be input to and output from the IC chip through circuit lines formed in the printed wiring substrate. Also, power potential and ground potential can be supplied to the IC chip.

Further, since the capacitor is flip-chip-bonded to the plurality of connection-to-capacitor terminals of the IC chip, by means of the plurality of corresponding capacitor terminals, resistance and inductance involved in the connection are extremely low. Further, the capacitor terminals of the capacitor are each electrically connected to either one of the paired electrodes or electrode groups, and the paired electrodes or electrode groups are each electrically connected to at least one of the plurality of capacitor terminals.

Specifically, the IC chip is connected to the paired electrodes (or electrode groups). Thus, for example, through connection of one electrode (electrode group) to a power line formed in the IC chip and connection of the other electrode (electrode group) to other power line (for example, the grounding line), noise which enters a power wiring layer can be reliably eliminated by means of the capacitor. Further, since the capacitor is directly connected to the IC chip, noise which may enter somewhere between the IC chip and the capacitor can be suppressed to a significantly low level. Thus, a problem, such as malfunction, can be prevented, thereby providing high reliability.

Since the capacitance of the capacitor can be freely selected, a capacitor of large capacitance attained through use of ceramic of high dielectric constant can be employed, thereby further improving noise elimination capability.

The present invention also provides a capacitor-built-in-type printed wiring substrate on which an IC-chip-carrying printed wiring substrate is mounted and which is characterized by the following. The capacitor comprises a pair of electrodes or electrode groups; and a plurality of capacitor terminals, each terminal being electrically connected to either one of the paired electrodes or electrode groups, the paired electrodes or electrode groups each being electrically connected to at least one of the plurality of capacitor terminals. The printed wiring substrate comprises a plurality of substrate terminals. The plurality of capacitor terminals of the capacitor are respectively bonded in a connection-face-to-connection-face manner to a plurality of connection-to-capacitor terminals of the IC-chip-carrying printed wiring substrate. The plurality of substrate terminals of the printed wiring substrate are respectively bonded in a connection-face-to-connection-face manner to a plurality of connection-to-substrate terminals of the IC-chip-carrying printed wiring substrate.

In the capacitor-built-in-type printed wiring substrate of the present invention on which the IC-chip-carrying printed wiring substrate is mounted, the IC-chip-carrying printed wiring substrate (hereinafter may be referred to merely as "IC-carrying substrate") has the plurality of connection-to-capacitor terminals for connection to the capacitor and the plurality of connection-to-substrate terminals for connection to the printed wiring substrate. The printed wiring substrate is bonded in a connection-face-to-connection-face manner to the plurality of connection-to-substrate terminals of the IC-carrying substrate, by means of the plurality of corresponding substrate terminals. Accordingly, signals can be input to and output from the IC-carrying substrate through circuit lines formed in the printed wiring substrate. Also, power potential and ground potential can be supplied to the IC-carrying substrate.

Further, since the capacitor is bonded in a connection-face-to-connection-face manner to the plurality of connection-to-capacitor terminals of the IC-carrying substrate, by means of the plurality of corresponding capacitor terminals, resistance and inductance involved in the connection are extremely low. Further, the capacitor terminals of the capacitor are each electrically connected to either one of the paired electrodes or electrode groups, and the paired electrodes or electrode groups are each electrically connected to at least one of the plurality of capacitor terminals.

Specifically, the IC-carrying substrate is connected to the paired electrodes (or electrode groups). Thus, for example, through connection of one electrode (electrode group) to a power line formed in the IC-carrying substrate and connection of the other electrode (electrode group) to other power line (for example, grounding line), noise which enters a power wiring layer can be reliably eliminated by means of the capacitor. Further, since the capacitor is directly connected to the IC-carrying substrate, noise which may enter somewhere between the IC-carrying substrate and the capacitor can be suppressed to a significantly low level. Thus, a problem, such as malfunction, can be prevented, thereby providing high reliability.

Since the capacitance of the capacitor can be freely selected, a capacitor of large capacitance attained through use of ceramic of high dielectric constant can be employed, thereby further improving noise elimination capability.

The IC-chip-carrying printed wiring substrate may be of any type, so long as an IC chip is mounted thereon. Examples of such an IC-chip-carrying printed wiring substrate include an ordinary printed wiring substrate or a printed wiring substrate assuming a size substantially equal to that of an IC chip, such as a CSP.

The capacitor-built-in-type printed wiring substrate on which the IC-carrying substrate is mounted may be of any type, so long as the IC-carrying substrate is mounted thereon. Examples of such a capacitor-built-in-type printed wiring substrate include an ordinary printed wiring substrate on which an IC-chip-carrying CSP is mounted, or an interposer on which an IC-chip-carrying ordinary printed wiring substrate is mounted to thereby be interposed between the ordinary printed wiring substrate and another printed wiring substrate, such as a motherboard, or a socket.

Bonding in a connection-face-to-connection-face manner is used for connection between the capacitor terminals and the connection-to-capacitor terminals of the IC-carrying substrate and between the substrate terminals and the connection-to-substrate terminals of the IC-carrying substrate. Specifically, pads and bumps formed on a connection face of the capacitor or printed wiring substrate (corresponding to the capacitor terminals and the substrate terminals) are bonded to lands and bumps which are formed on a connection face of the IC-carrying substrate in a predetermined pattern, such as LGA or BGA, or to butt connection pins which are formed on a connection face of the IC-carrying substrate in a predetermined pattern, such as butt joint PGA, (corresponding to the connection-to-capacitor terminals and the connection-to-substrate terminals), by means of a conductive material, such as solder or conductive resin, while the connection faces are disposed in opposition to each other.

Preferably, the above-described capacitor-built-in-type printed wiring substrate is characterized in that the IC-chip-carrying printed wiring substrate is a CSP on which the IC chip is mounted.

In the capacitor-built-in-type printed wiring substrate of the present invention, the IC-chip-carrying printed wiring substrate mounted thereon is a CSP on which the IC chip is mounted. Accordingly, the capacitor connected to the connection-to-capacitor terminals of the CSP are connected to the IC chip via the CSP, which is substantially functionally equivalent to the case where the capacitor is directly connected to the IC chip. Thus, for example, through connection of one electrode (electrode group) to a power line formed in the IC chip via the CSP and connection of the other electrode (electrode group) to other power line (for example, the grounding line) formed in the IC chip via the CSP, noise can be eliminated to thereby prevent malfunctioning of the IC chip.

Notably, the CSP may be of known structure and material. For example, ceramic, such as alumina ceramic, or a resin, such as polyimide, is used as a base material. A via conductor extending through the base material is formed of tungsten, molybdenum, copper plating, or solder.

The present invention further provides a capacitor-built-in-type printed wiring substrate on which an IC chip or IC-chip-carrying printed wiring substrate can be mounted and which is characterized by the following. The capacitor comprises a pair of electrodes or electrode groups; and a plurality of capacitor terminals capable of being respectively flip-chip-bonded or bonded in a connection-face-to-connection-face manner to a plurality of connection-to-capacitor terminals of the IC chip or IC-chip-carrying printed wiring substrate, each terminal being electrically connected to either one of the paired electrodes or electrode groups, the paired electrodes or electrode groups each being electrically connected to at least one of the plurality of capacitor terminals. The printed wiring substrate comprises a plurality of substrate terminals capable of being respectively flip-chip-bonded or bonded in a connection-face-to-connection-face manner to a plurality of connection-to-substrate terminals of the IC chip or IC-chip-carrying printed wiring substrate.

The capacitor-built-in-type printed wiring substrate of the present invention can carry the IC chip or IC-chip-carrying printed wiring substrate having the plurality of connection-to-capacitor terminals for connection to the capacitor and the plurality of connection-to-substrate terminals for connection to the printed wiring substrate. The printed wiring substrate can be flip-chip-bonded or bonded in a connection-face-to-connection-face manner to the plurality of connection-to-substrate terminals of the IC chip or IC-chip-carrying printed wiring substrate, by means of the plurality of corresponding substrate terminals. Accordingly, signals can be input to and output from the IC chip or IC-chip-carrying printed wiring substrate through circuit lines formed in the printed wiring substrate. Also, power potential and ground potential can be supplied as needed to the IC chip or IC-chip-carrying printed wiring substrate.

Further, the capacitor can be flip-chip-bonded or bonded in a connection-face-to-connection-face manner to the plurality of connection-to-capacitor terminals of the IC chip or IC-chip-carrying printed wiring substrate, by means of the plurality of corresponding capacitor terminals. Accordingly, connection to the IC chip or IC-carrying substrate can be established while resistance and inductance involved in the connection are maintained low. Further, the capacitor terminals of the capacitor are each electrically connected to either one of the paired electrodes or electrode groups, and the paired electrodes or electrode groups are each electrically connected to at least one of the plurality of capacitor terminals.

Specifically, when the IC chip or IC-chip-carrying printed wiring substrate having the plurality of connection-to-capacitor terminals and the plurality of connection-to-substrate terminals is connected to the capacitor-built-in-type printed wiring substrate, the IC chip or IC-chip-carrying printed wiring substrate is connected to the paired electrodes (or electrode groups) of the capacitor. Thus, for example, through connection of one electrode (electrode group) to a power line formed in the IC chip (or IC-chip-carrying printed wiring substrate) and connection of the other electrode (electrode group) to other power line (for example, the grounding line), superposed noise can be reliably eliminated by means of the capacitor. Further, since the capacitor is directly connected to the IC chip (or IC-chip-carrying printed wiring substrate), noise which may enter somewhere between the IC chip (or IC-chip-carrying printed wiring substrate) and the capacitor can be suppressed to a significantly low level. Thus, a problem, such as malfunction, can be prevented, thereby providing high reliability.

The capacitor terminals and substrate terminals may assume an adequate form according to the form of the connection-to-capacitor terminals and connection-to-substrate terminals of the IC chip (or IC-chip-carrying printed wiring substrate) to be connected thereto. Examples of such a form include a flip-chip pad, a flip-chip bump of solder, a pad, a bump, or a butt connection pin.

Preferably, the above-described capacitor-built-in-type printed wiring substrate is characterized in that the capacitor and the printed wiring substrate are fixed together by means of insulating resin.

Since, in the capacitor-built-in-type printed wiring substrate of the present invention, the capacitor and the printed wiring substrate are fixed together, the capacitor and the printed wiring substrate can be handled as a single unit, thereby facilitating handling. In connection to the IC chip (or IC-chip-carrying printed wiring substrate), connection between the capacitor terminals of the capacitor and the connection-to-capacitor terminals of the IC chip (or IC-chip-carrying printed wiring substrate) and connection between the substrate terminals of the printed wiring substrate and the connection-to-substrate terminals of the IC chip (or IC-chip-carrying printed wiring substrate) can be conducted easily and simultaneously, thereby facilitating connection of the IC chip (or connection of the IC-chip-carrying printed wiring substrate). Since the printed wiring substrate and the capacitor are integrated into a single unit, there is no need to attach a capacitor to the printed wiring substrate in a later stage. Thus, the expense of mounting a chip capacitor does not arise, thereby providing an inexpensive capacitor-built-in-type printed wiring substrate. Also, there is provided a high degree of freedom with respect to mounting of other electronic components and attachment of a reinforcing plate.

Preferably, the above-described capacitor-built-in-type printed wiring substrate is characterized in that the capacitor comprises a first capacitor main-surface, on which the plurality of capacitor terminals are formed; the printed wiring substrate comprises a first substrate main-surface, on which the plurality of substrate terminals are formed; and the plurality of capacitor terminals and the plurality of substrate terminals are substantially coplanar.

In the capacitor-built-in-type printed wiring substrate of the present invention, the plurality of capacitor terminals and the plurality of substrate terminals are substantially coplanar. Thus, the plurality of connection-to-capacitor terminals and the plurality of connection-to-substrate terminals may be formed to be coplanar on the IC chip (or IC-chip-carrying printed wiring substrate) to be connected. More specifically, a number of connection terminals assuming a substantially identical shape may be formed on a connection plane of the IC chip (or IC-chip-carrying printed wiring substrate) so as to serve as the plurality of connection-to-capacitor terminals and the plurality of connection-to-substrate terminals. Accordingly, the IC chip (or IC-chip-carrying printed wiring substrate) can be formed easily. Also, connection of the IC chip (or IC-chip-carrying printed wiring substrate) to the capacitor and printed wiring substrate is further facilitated.

Preferably, the above-described capacitor-built-in-type printed wiring substrate is characterized in that the printed wiring substrate comprises a capacitor accommodation cavity for accommodating the capacitor, and a cavity periphery region located around the capacitor accommodation cavity; and the plurality of substrate terminals are formed in the cavity periphery region.

In the capacitor-built-in-type printed wiring substrate of the present invention, the printed wiring substrate comprises the capacitor accommodation cavity in which the capacitor is to be disposed, and the cavity periphery region which is located around the capacitor accommodation cavity and on which the plurality of substrate terminals are formed. Accordingly, the capacitor terminals and the substrate terminals are densely located on and around the capacitor. Therefore, the planar size of the IC chip (or IC-chip-carrying printed wiring substrate) to be connected to the terminals can be made as small as possible, thereby preventing a problem in which the planar size cannot be reduced due to arrangement of the terminals. Thus, the unit price of the IC-chip (or IC-chip-carrying printed wiring substrate) to be mounted can be reduced, thereby enabling provision of an inexpensive capacitor-built-in-type printed wiring substrate on which the IC chip (or IC-chip-carrying printed wiring substrate) is mounted.

Notably, the capacitor accommodation cavity may assume any form, so long as the capacitor can be accommodated therein. Examples of such a form include a closed-bottomed cavity formed through partial sinking of the printed wiring substrate, or a through hole extending through the printed wiring substrate in the thickness direction. The capacitor accommodation cavity is not necessarily located in a substantially central region of the printed wiring substrate, but may be located in a peripheral region of the printed wiring substrate. Accordingly, the capacitor accommodation cavity is not required to have a shape, such as the shape of a through hole, which is completely surrounded by the printing wiring substrate, and may have a shape such that the cavity wall is partially cur or removed over the entire depth (for example, may have the shape of a squarish letter U). Similarly, the closed-bottomed capacitor accommodation cavity may be formed such that the bottom portion of the closed-bottomed capacitor accommodation cavity is exposed from a side surface of the printed wiring substrate.

Preferably, the above-described capacitor-built-in-type printed wiring substrate is characterized in that the printed wiring substrate comprises a capacitor accommodation cavity for accommodating the capacitor; and the capacitor accommodation cavity comprises a capacitor position restriction portion which abuts the capacitor disposed therein so as to restrict the position of the capacitor in the depth direction thereof.

In the capacitor-built-in-type printed wiring substrate of the present invention, the capacitor accommodation cavity is provided with the capacitor position restriction portion. Through disposal of the capacitor within the capacitor accommodation cavity such that the capacitor abuts the capacitor position restriction portion, the capacitor can be easily positioned in the depth direction of the capacitor accommodation cavity. Accordingly, the capacitor terminals formed on the capacitor can be easily positioned in the depth direction.

In consideration of the shape (size) of the capacitor, the capacitor position restriction portion may assume any form, so long as the position of the capacitor can be restricted in the depth direction of the capacitor accommodation cavity. For example, the capacitor position restriction portion may assume the form of a protrusion which projects radially inward on the bottom of the closed-bottomed capacitor accommodation cavity or in the vicinity of an end (upper end or lower end) of a through capacitor accommodation cavity.

Preferably, the above-described capacitor-built-in-type printed wiring substrate is characterized by the following. The printed wiring substrate substantially assumes a plate shape having a first substrate main-surface and a second substrate main-surface, and comprises a closed-bottomed capacitor accommodation cavity which is sunk below the first substrate main-surface toward the second substrate main-surface and is adapted to accommodate the capacitor; a plurality of second-surface substrate terminals formed on the second substrate main-surface; and a plurality of connection lines extending from some of the plurality of second-surface substrate terminals to a bottom surface of the closed-bottomed capacitor accommodation cavity. The capacitor is disposed in the closed-bottomed capacitor accommodation cavity and comprises a first capacitor main-surface; a second capacitor main-surface substantially parallel to the first capacitor main-surface; and a plurality of second-surface capacitor terminals formed on the second capacitor main-surface, each terminal being electrically connected to either one of the paired electrodes or electrode groups, the paired electrodes or electrode groups each being electrically connected to at least one of the plurality of second-surface capacitor terminals. The plurality of substrate terminals are formed on the first substrate main-surface. The plurality of capacitor terminals are formed on the first capacitor main-surface. The plurality of second-surface capacitor terminals are connected to the corresponding connection lines which extend to the bottom surface of the closed-bottomed capacitor accommodation cavity.

In the capacitor-built-in-type printed wiring substrate of the present invention, the printed wiring substrate comprises the closed-bottomed capacitor accommodation cavity, the substrate terminals, the second-surface substrate terminals, and the connection lines. The capacitor comprises the capacitor terminals formed on the first capacitor main-surface and the second-surface capacitor terminals formed on the second capacitor main-surface. Further, the second-surface capacitor terminals of the capacitor disposed in the closed-bottomed capacitor accommodation cavity are connected to the corresponding connection lines. Accordingly, the printed wiring substrate can be directly connected to the IC chip (or IC-chip-carrying printed wiring substrate) and to another printed wiring substrate. The capacitor can be directly connected to the IC chip (or IC-chip-carrying printed wiring substrate) by means of the capacitor terminals as well as to another printed wiring substrate, such as a motherboard, through bringing out of both poles of the capacitor from the second-surface capacitor terminals to the second-surface substrate terminals via the connection lines.

Thus, the capacitor can be disposed close to the IC chip (or IC-chip-carrying printed wiring substrate), and the capacitor can be disposed in the vicinity of the second-surface substrate terminals and in the vicinity of another printed wiring substrate connected to the second-surface substrate terminals. Therefore, noise which may enter somewhere therebetween can be reduced to very low level.

The capacitor terminals are connected via either one of the paired electrodes (electrode groups) to those second-surface substrate terminals which are connected to the second-surface capacitor terminals via the connection lines. Thus, through connection of the second-surface substrate terminal connected to the second-surface capacitor terminal to a power line or grounding line formed in the other printed wiring substrate, power potential or ground potential (power current or ground current) can be supplied from the other printed wiring substrate to the IC chip (or IC-chip-carrying printed wiring substrate) via the connection lines and through the paired electrodes (electrode groups) of the capacitor. Further, as mentioned above, noise can be eliminated by means of the capacitor.

Since connection to the other printed wiring substrate is established by means of the second-surface substrate terminals of the printed wiring substrate of the invention, there is no need to consider connection to the capacitor, thereby facilitating connection to the other printed wiring substrate.

Preferably, the above-described capacitor-built-in-type printed wiring substrate is characterized by the following. The printed wiring substrate assumes a substantially plate shape having a first substrate main-surface and a second substrate main-surface, and comprises a through capacitor accommodation cavity which extends through the printed wiring substrate between the first substrate main-surface and the second substrate main-surface and is adapted to accommodate the capacitor; and a plurality of second-surface substrate terminals formed on the second substrate main-surface. The capacitor is disposed in the through capacitor accommodation cavity, and comprises a first capacitor main-surface; a second capacitor main-surface substantially parallel to the first capacitor main-surface; and a plurality of second-surface capacitor terminals formed on the second capacitor main-surface, each terminal being electrically connected to either one of the paired electrodes or electrode groups, the paired electrodes or electrode groups each being electrically connected to at least one of the plurality of second-surface capacitor terminals. The plurality of substrate terminals are formed on the first substrate main-surface. The plurality of capacitor terminals are formed on the first capacitor main-surface.

In the capacitor-built-in-type printed wiring substrate of the present invention, the printed wiring substrate comprises the through capacitor accommodation cavity, the substrate terminals, and the second-surface substrate terminals. The capacitor comprises the capacitor terminals formed on the first capacitor main-surface and the second-surface capacitor terminals formed on the second capacitor main-surface. Accordingly, the printed wiring substrate can be directly connected to the IC chip (or IC-chip-carrying printed wiring substrate) and to another printed wiring substrate. Similarly, the capacitor can be directly connected to the IC chip (or IC-chip-carrying printed wiring substrate) by means of the capacitor terminals. Also, both poles of the capacitor can be directly connected to another printed wiring substrate, such as a motherboard, by means of the second-surface capacitor terminals.

Thus, the capacitor can be disposed close to the IC chip (or IC-chip-carrying printed wiring substrate), and the capacitor can be disposed in the vicinity of the other printed wiring substrate. Therefore, noise which may enter somewhere therebetween can be reduced to very low level.

The capacitor terminals are connected to the second-surface capacitor terminals via either one of the paired electrodes (electrode groups). Thus, through connection of the second-surface substrate terminal to a power line or grounding line formed in the other printed wiring substrate, such as a motherboard, power potential or ground potential (power current or ground current) can be supplied from the other printed wiring substrate to the IC chip (or IC-chip-carrying printed wiring substrate) through the paired electrodes (electrode groups) of the capacitor without use of the circuit lines formed in the printed wiring substrate of the invention, thereby attaining connection at low resistance and low inductance. Further, noise can be eliminated by means of the capacitor.

Preferably, the above-described capacitor-built-in-type printed wiring substrate is characterized in that the plurality of second-surface capacitor terminals are disposed at intervals greater than those at which the plurality of capacitor terminals are disposed.

In the capacitor-built-in-type printed wiring substrate of the present invention, the interval between the second-surface capacitor terminals is greater than that between the capacitor terminals. One side of the capacitor is connected to the IC chip or CSP, whereas the other side of the capacitor is connected to another printed wiring substrate, such as a motherboard, in which connection terminals are generally disposed at intervals greater than those at which the connection terminals of the IC chip (or CSP) are disposed. For connection with the other printed wiring substrate, the interval of the second-surface capacitor terminals may be adjusted accordingly.

Preferably, the above-described capacitor-built-in-type printed wiring substrate is characterized in that the printed wiring substrate serves as an interposer interposed between the IC-chip-carrying printed wiring substrate and the other printed wiring substrate.

In the case of a conventional capacitor-built-in-type printed wiring substrate, when a capacitor itself is defective or when the capacitor becomes defective during attachment or connection of the capacitor to the printed wiring substrate, the printed wiring substrate must often be discarded together with the capacitor. When the printed wiring substrate itself is expensive because of complicated structure and wiring, discarding of the printed wiring substrate represents a considerable loss. If an IC chip is discarded together with the printed wiring substrate, the loss increases further.

By contrast, in the case of the capacitor-built-in-type printed wiring substrate of the present invention, the printed wiring substrate to which the capacitor is attached can carry an IC-chip-carrying printed wiring substrate to thereby serve as an interposer interposed between the IC-chip-carrying printed wiring substrate and another printed wiring substrate. Thus, the capacitor-built-in-type printed wiring substrate of the present invention assumes a simple structure and becomes inexpensive. Even when the capacitor itself is defective or when the capacitor becomes defective during attachment of the capacitor to the printed wiring substrate, merely the inexpensive interposer may be discarded without need to discard the IC-chip-carrying printed wiring substrate, thereby reducing loss involved.

Further means for solution is a printed wiring substrate to be connected to an IC chip or IC-chip-carrying printed wiring substrate comprising a plurality of connection-to-capacitor terminals for connection to a capacitor and a plurality of connection-to-substrate terminals for connection to a printed wiring substrate, the printed wiring substrate being characterized by comprising a plurality of substrate terminals capable of being respectively flip-chip-bonded or bonded in a connection-face-to-connection-face manner to the plurality of connection-to-substrate terminals of the IC chip or IC-chip-carrying printed wiring substrate.

The printed wiring substrate of the present invention comprises the plurality of substrate terminals capable of being flip-chip-bonded or bonded in a connection-face-to-connection-face manner to the plurality of connection-to-substrate terminals of the IC chip or IC-chip-carrying printed wiring substrate which comprises the plurality of connection-to-capacitor terminals for connection to the capacitor and the plurality of connection-to-substrate terminals for connection to the printed wiring substrate. Accordingly, when such an IC chip or IC-chip-carrying printed wiring substrate is to be connected to the printed wiring substrate of the present invention, the connection-to-substrate terminals and the substrate terminals can be flip-chip-bonded together or bonded together in a connection-face-to-connection-face manner. Simultaneously or in a separate step, the capacitor is connected to the connection-to-capacitor terminals, thereby connecting the capacitor to the IC chip or IC-chip-carrying printed wiring substrate without use of circuit lines formed in the printed wiring substrate.

Preferably, the above-described printed wiring substrate is characterized by comprising a capacitor accommodation cavity for accommodating the capacitor, and a cavity periphery region located around the capacitor accommodation cavity, and is characterized in that the plurality of substrate terminals are formed in the cavity periphery region.

Since this printed wiring substrate comprises the capacitor accommodation cavity and the cavity periphery region, the substrate terminals are densely located inn the cavity periphery region. Accordingly, the planar size of the IC chip or IC-chip-carrying printed wiring substrate (particularly CSP) to be connected to the printed wiring substrate and capacitor can be made as small as possible, thereby preventing a problem in which the planar size cannot be reduced due to arrangement of the substrate terminals of the printed wiring substrate. Thus, the unit price of the IC-chip or IC-chip-carrying printed wiring substrate to be mounted can be reduced, thereby enabling provision of an inexpensive capacitor-built-in-type printed wiring substrate on which the IC chip or IC-chip-carrying printed wiring substrate is mounted.

Preferably, the above-described printed wiring substrate is characterized by comprising a capacitor accommodation cavity for accommodating the capacitor and is characterized in that the capacitor accommodation cavity comprises a capacitor position restriction portion which abuts the capacitor disposed therein so as to restrict the position of the capacitor in the depth direction thereof.

In this printed wiring substrate, the capacitor accommodation cavity is provided with the capacitor position restriction portion. Through disposal of the capacitor within the capacitor accommodation cavity such that the capacitor abuts the capacitor position restriction portion, the capacitor can be easily positioned in the depth direction of the capacitor accommodation cavity. Accordingly, the connection terminals formed on the capacitor for connection to the IC chip or IC-chip-carrying printed wiring substrate can be easily positioned in the depth direction.

Preferably, the above-described printed wiring substrate is characterized by the following. The printed wiring substrate assumes a substantially plate shape having a first substrate main-surface and a second substrate main-surface, and comprises a closed-bottomed capacitor accommodation cavity which is sunk below the first substrate main-surface toward the second substrate main-surface and is adapted to accommodate the capacitor; a plurality of second-surface substrate terminals formed on the second substrate main-surface; and a plurality of connection lines extending from some of the plurality of second-surface substrate terminals to a bottom surface of the closed-bottomed capacitor accommodation cavity. The substrate terminals are formed on the first substrate main-surface.

This printed wiring substrate comprises the closed-bottomed capacitor accommodation cavity, the substrate terminals, the second-surface substrate terminals, and the connection lines. Thus, the first substrate main-surface can be connected to the IC chip or IC-chip-carrying printed wiring substrate, while the second substrate main-surface can be connected to another printed wiring substrate, such as a motherboard. The capacitor capable of being connected to the IC chip or IC-chip-carrying printed wiring substrate is disposed in the closed-bottomed capacitor accommodation cavity, and the paired electrodes are connected to the corresponding connection lines. Thus, while the capacitor is held within the cavity and is connected to the IC chip (or IC-chip-carrying printed wiring substrate), the other printed wiring substrate connected to the second substrate main-surface can be connected to the capacitor through the second-surface substrate terminals and connection lines.

Thus, the capacitor can be disposed close to the IC chip or IC-chip-carrying printed wiring substrate, and the capacitor can be disposed in the vicinity of the second-surface substrate terminals and of the other printed wiring substrate connected to the second-surface substrate terminals. Therefore, noise which may enter somewhere therebetween can be reduced to very low level.

The capacitor terminals are connected via either one of the paired electrodes (electrode groups) to those second-surface substrate terminals which are connected to the second-surface capacitor terminals via the connection lines. Thus, through connection of the second-surface substrate terminal connected to the second-surface capacitor terminal to a power line or grounding line formed in another printed wiring substrate, such as a motherboard, power potential or ground potential (power current or ground current) can be supplied from the other printed wiring substrate to the IC chip or IC-chip-carrying printed wiring substrate via the connection lines formed in the printed wiring substrate of the present invention and through the paired electrodes (electrode groups) of the capacitor. Further, noise can be eliminated by means of the capacitor as mentioned above.

Since connection to another printed wiring substrate is established by means of the second-surface substrate terminals of the printed wiring substrate of the invention, there is no need to consider connection to the capacitor, thereby facilitating connection to the other printed wiring substrate.

Preferably, the above-described printed wiring substrate is characterized by the following. The printed wiring substrate assumes a substantially plate shape having a first substrate main-surface and a second substrate main-surface, and comprises a through capacitor accommodation cavity which extends through the printed wiring substrate between the first substrate main-surface and the second substrate main-surface and is adapted to accommodate the capacitor; and a plurality of second-surface substrate terminals formed on the second substrate main-surface. The substrate terminals are formed on the first substrate main-surface.

This printed wiring substrate comprises the substrate terminals, the through capacitor accommodation cavity, and the second-surface substrate terminals. Thus, this printed wiring substrate can be connected to the IC chip (or IC-chip-carrying printed wiring substrate) by means of the substrate terminals and to another printed wiring substrate, such as a motherboard, by means of the second-surface substrate terminals.

The capacitor capable of being connected to the IC chip or IC-chip-carrying printed wiring substrate is disposed in the through capacitor accommodation cavity, thereby becoming able to be directly connected to the IC chip (or IC-chip-carrying printed wiring substrate). Thus, the capacitor can be disposed close to the IC chip (or IC-chip-carrying printed wiring substrate). Further, through provision of the opposite side of the capacitor with capacitor terminals connectable to a printed wiring substrate, the capacitor can be directly connected on one side to the IC chip (or IC-chipcarrying printed wiring board), and both poles of the capacitor can be directly connected on the other side to another printed wiring substrate. Thus, the capacitor can be disposed close to the IC chip (or IC-chip-carrying printed wiring substrate), and the capacitor can be disposed in the vicinity of the other printed wiring substrate. Therefore, noise which may enter somewhere therebetween can be reduced to very low level. Further, power potential or ground potential can be supplied to the IC chip (or IC-chip-carrying printed wiring substrate) through the paired electrodes (electrode groups) of the capacitor without use of the circuit lines formed in the printed wiring substrate of the invention.

The present invention further provides a capacitor to be connected to an IC chip or IC-chip-carrying printed wiring substrate comprising a plurality of connection-to-capacitor terminals for connection to the capacitor and a plurality of connection-to-substrate terminals for connection to a printed wiring substrate. The capacitor is characterized by comprising a pair of electrodes or electrode groups; and a plurality of capacitor terminals capable of being respectively flip-chip-bonded or bonded in a connection-face-to-connection-face manner to the plurality of connection-to-capacitor terminals of the IC chip or IC-chip-carrying printed wiring substrate, each terminal being electrically connected to either one of the paired electrodes or electrode groups, the paired electrodes or electrode groups each being electrically connected to at least one of the plurality of capacitor terminals.

The capacitor of the present invention comprises the paired electrodes (electrode groups) and the capacitor terminals. The capacitor terminals are each electrically connected to either one of the paired electrodes or electrode groups, and the paired electrodes or electrode groups are each electrically connected to at least one of the plurality of capacitor terminals. Specifically, when the IC chip (or IC-chip-carrying printed wiring substrate) having the plurality of connection-to-capacitor terminals and the plurality of connection-to-substrate terminals is connected to the capacitor, the IC chip (or IC-chip-carrying printed wiring substrate) is connected to the paired electrodes (or electrode groups) of the capacitor. Thus, for example, through connection of one electrode (electrode group) to a power line formed in the IC chip (or IC-chip-carrying printed wiring substrate) and connection of the other electrode (electrode group) to other power line (for example, the grounding line), noise which enters the power line can be reliably eliminated by means of the capacitor. Further, since the capacitor terminals can be directly flip-chip-bonded (or can be bonded in a connection-face-to-connection-face manner) to the connection-to-capacitor terminals of the IC chip (or IC-chip-carrying printed wiring substrate), connection can be established while low resistance and low inductance are involved, and noise which may enter somewhere between the IC chip (or IC-chip-carrying printed wiring substrate) and the capacitor can be suppressed to a significantly low level. Thus, a problem, such as malfunction, which would otherwise arise can be prevented, thereby improving reliability.

Preferably, the above-described capacitor is characterized by the following. The capacitor comprises a first capacitor main-surface; a second capacitor main-surface substantially parallel to the first capacitor main-surface; and a plurality of second-surface capacitor terminals formed on the second capacitor main-surface and capable of being connected to the plurality of connection lines extending to the bottom surface of the closed-bottomed capacitor accommodation cavity of the printed wiring substrate, the second-surface capacitor terminals each being electrically connected to either one of the paired electrodes or electrode groups, the paired electrodes or electrode groups each being electrically connected to at least one of the plurality of second-surface capacitor terminals. The plurality of capacitor terminals are formed on the first capacitor main-surface.

This capacitor comprises the second-surface capacitor terminals formed on the second capacitor main-surface in addition to the capacitor terminals. The second-surface capacitor terminals can be connected to the connection lines extending to the bottom surface of the closed-bottomed capacitor accommodation cavity or to the connection terminals of another printed wiring substrate. Accordingly, this capacitor enables connection of the first capacitor main-surface to the IC chip (or IC-chip-carrying printed wiring substrate) and enables connection of the second capacitor main-surface to the connection lines of the printed wiring substrate or directly to connection terminals of another printed wiring substrate, such as a motherboard. Thus, power current or ground current can be supplied from the connection lines of the printed wiring substrate or the connection terminals of the other printed wiring substrate to the IC chip (or IC-chip-carrying printed wiring substrate) through the paired electrodes (electrode layers). Further, noise which may be generated between the power potential and the ground potential can be eliminated.

Preferably, the above-described capacitor is characterized in that the plurality of second-surface capacitor terminals are disposed at intervals greater than those at which the plurality of capacitor terminals are disposed.

Generally, connection terminals used for connection between printed wiring substrates are disposed at intervals greater than those at which connection terminals used for connection between an IC chip (or CSP) and a printed wiring substrate are disposed. Thus, through adequate selection of intervals at which the capacitor terminals and the second-surface capacitor terminals are disposed, the capacitor can be easily connected to the IC chip (or IC-chip-carrying printed wiring substrate, such as a CSP) and to the printed wiring substrate or another printed wiring substrate.

BRIEF DESCRIPTION OF THE DRAWINGS

FIGS. 2a–2c comprise views showing the capacitor to be disposed in the capacitor accommodation cavity formed in the printed wiring substrate according to embodiment 1, wherein FIG. 2(a) is a perspective view of the capacitor; FIG. 2(b) is a sectional view for explaining the internal structure of the capacitor; and FIG. 2(c) is a circuit diagram showing the relationship between the capacitor and connection-to-IC capacitor bumps.

FIGS. 16a–16c comprise views showing the capacitor to be disposed in the capacitor accommodation cavity formed in the printed wiring substrate according to embodiment 2, wherein FIG. 16(a) is a perspective view of the capacitor; FIG. 16(b) is a sectional view for explaining the internal structure of the capacitor; and FIG. 16(c) is a circuit diagram showing the relationship among the capacitor, solder bumps, and connection-to-IC capacitor bumps.

FIGS. 22a–22b comprise views showing the capacitor to be disposed in the capacitor accommodation cavity formed in the printed wiring substrate according to embodiment 3, wherein FIG. 22(a) is a perspective view of the capacitor; and FIG. 22(b) is a circuit diagram showing the relationship between the capacitor and connection-to-IC capacitor bumps.

FIGS. 23a–23b comprise views showing a core substrate having a through capacitor accommodation cavity formed therein, wherein FIG. 23(a) is a plan view, and FIG. 23(b) is a partially enlarged view.

DETAILED DESCRIPTION OF THE PREFERRED EMBODIMENTS

The present invention will now be described in greater detail by reference to the drawings. However, the present invention should not be construed as being limited thereto.

Embodiment 1

Figure 1:
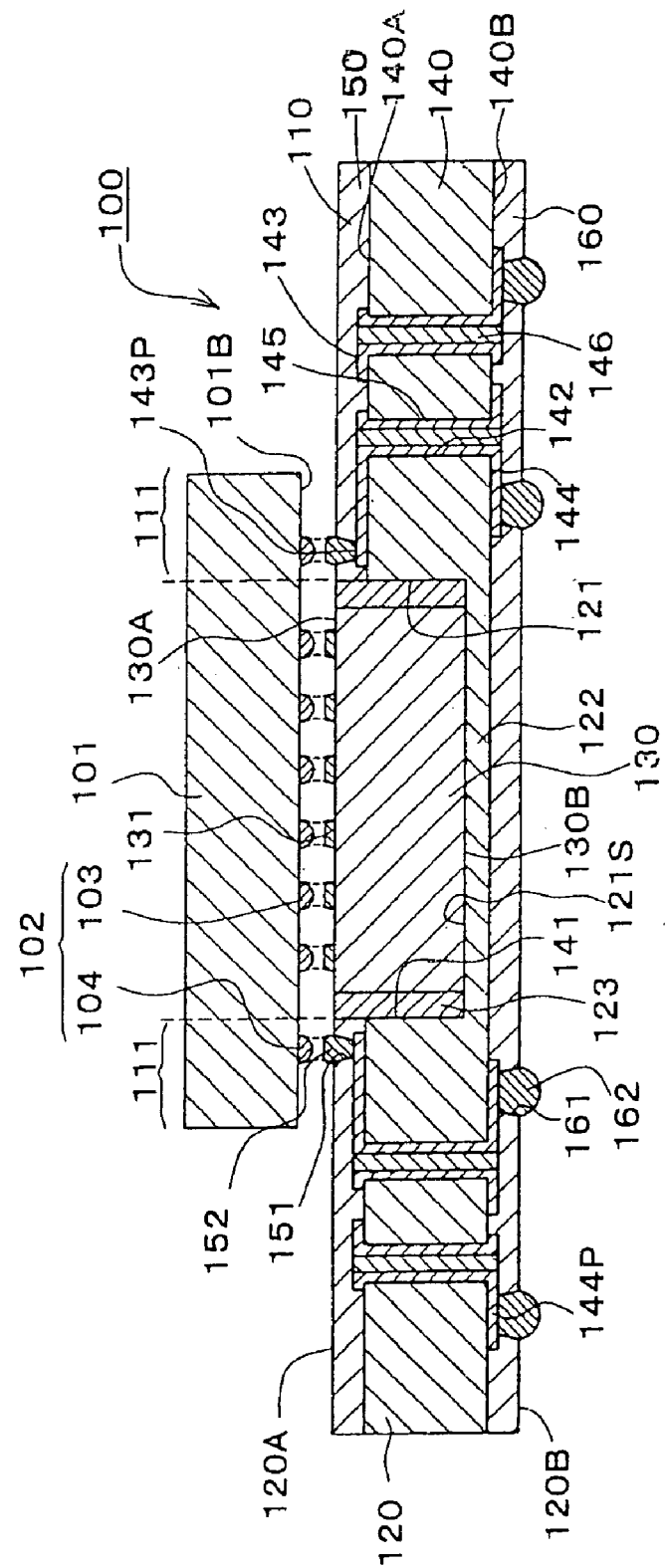
FIG. 1 is a sectional view showing a capacitor-built-in-type printed wiring substrate according to embodiment 1 in which a capacitor is disposed in a closed-bottomed capacitor accommodation cavity which is formed in a printed wiring substrate in such a manner as to open upward in the drawing.

A first embodiment of the present invention will next be described with reference to the accompanying drawings. Referring to FIG. 1, a capacitor-built-in-type printed wiring substrate 100 of the present invention on which an IC chip is mounted includes an IC chip 101 and a capacitor-built-in-type printed wiring substrate 110 on which the IC chip 101 is mounted.

The IC chip 101 includes a number of hemispheric connection terminals 102 formed on a lower surface 101B serving as a connection plane. The connection terminals 102 assume the form of a solder bump made of high-melting-point solder. The connection terminals 102 which are located at a substantially central portion in FIG. 1 serve as connection-to-capacitor bumps 103 to be connected to a capacitor 130, which will be described later. The connection terminals 102 which are located around (in FIG. 1, at the right and left sides of) the connection-to-capacitor bumps 103 serve as connection-to-substrate bumps 104 to be connected to a printed wiring substrate 120, which will be described later.

The capacitor-built-in-type printed wiring substrate 110 includes a printed wiring substrate 120 which assumes a substantially square shape and in which a closed-bottomed capacitor accommodation cavity (hereinafter may be referred to merely as a depression) 121 is formed, and a capacitor 130 disposed within the depression 121. The depression 121 is formed substantially at the center of the printed wiring substrate 120 and assumes a square shape as viewed from above and a closed-bottomed form having a bottom portion 122. The printed wiring substrate 120 and the capacitor 130 are fixedly attached into a single unit by means of an insulating filling resin 123 made of epoxy resin and filled into a gap therebetween. The internal structure of the capacitor 130 (see FIG. 2) will be described later.

A number of connection-to-IC substrate bumps 152 are formed on an upper surface (first substrate main-surface) 120A of the printed wiring substrate 120 in positions corresponding to those of connection-to-substrate bumps 104 of the IC chip 101. The connection-to-IC substrate bumps 152 assume a substantially hemispheric shape while being truncated flat. When the IC chip 101 is mounted on the printed wiring substrate 120, the molten connection-to-IC substrate bumps 152 are fused with the corresponding connection-to-substrate bumps 104 as represented with a dashed line, thereby flip-chip-bonding the IC chip 101 and the printed wiring substrate 120 together. Likewise, as represented with a dashed line, connection-to-IC capacitor bumps 131 are fused with the corresponding connection-to-capacitor bumps 103, thereby flip-chip-bonding the IC chip 101 and the capacitor 130 together.

The printed wiring substrate 120 includes a core substrate 140 made of a glass-epoxy-resin composite material, a wiring layer 143 of copper formed on an upper surface 140A of the core substrate 140, and a wiring layer 144 of copper formed on a lower surface 140B of the core substrate 140. The printed wiring substrate 120 further includes an insulating resin layer 150 which is mainly made of epoxy resin and covers the upper surface 140A and the wiring layer 143, and an insulating resin layer 160 which is mainly made of epoxy resin and covers the lower surface 140B and the wiring layer 144. The wiring layers 143 and 144 are electrically connected by means of a through-hole conductor 145 formed on the inner wall of each core through-hole 142 extending through the core substrate 140. The through-hole conductors 145 are filled with filling resin 146 made of epoxy resin. A closed-bottomed depression 141 which assumes a square shape as viewed from above is formed at the center of the core substrate 140. The core substrate 140 becomes thin at the portion of the depression 141.

Openings 151 are formed in a cavity periphery region 111 of the insulating resin layer 150 located around the depression 121, in positions corresponding to those of the connection-to-substrate bumps 104, and extend from the upper surface 120A of the insulating resin layer 150 to the wiring layer 143. A portion of the wiring layer 143 exposed in each of the openings 151 serves as a connection-to-IC substrate pad (flip-chip pad) 143P for connection to the IC chip 101. The openings 151 are each filled with an Ag—Sn solder such that the Ag—Sn solder assumes a substantially hemispheric shape which is truncated flat and projects beyond the upper surface 120A, thereby forming the connection-to-IC substrate bumps 152.

As will be described later, the connection-to-IC substrate bumps 152 are formed while abutting a plane portion of a jig during their formation process. Thus, their top portions exhibit high coplanarity.

Openings 161 are formed in grid array in a portion of the insulating resin layer 160 corresponding to a peripheral portion of the printed wiring substrate 120, in such a manner as to extend from a lower surface (second substrate main-surface) 120B of the insulating resin layer 160 to the wiring layer 144. A portion of the wiring layer 144 exposed in each of the openings 161 serves as a connection pad 144P for connection to another printed wiring substrate, such as a motherboard. The openings 161 are each filled with an Ag—Sn solder such that the Ag—Sn solder assumes a substantially hemispheric shape which is truncated flat and projects beyond the lower surface 120B, thereby forming the solder bumps 162 on a grid. Thus, the printed wiring substrate 120 is of BGA type. Through connection of the printed wiring substrate 120 to another printed wiring substrate, such as a motherboard, by means of the solder bumps 162, the other substrate can be connected to the IC chip 101 via the printed wiring substrate 120.

The insulating resin layers 150 and 160 serve as solder resist layers during formation of the connection-to-IC substrate bumps 152 and solder bumps 162, respectively, or during connection of the bumps to, for example, the IC chip 101.

As shown in FIG. 2(a), the capacitor 130 includes dielectric layers 132 and electrode layers 133. The dielectric layers 132 are formed of a material having a high specific dielectric constant Er of a few hundreds or more (specifically, ∈r=approx. 19000), specifically a material which contains, as a main component, high-dielectric-constant ceramic, more specifically $BaTiO_3$. The electrode layers 133, which contain Pd as a main component. The dielectric layers 132 and the electrode layers 133 are arranged in alternating layers, thereby forming a laminated ceramic capacitor assuming the form of a substantially square plate. The capacitor 130 differs from an ordinary laminated ceramic capacitor used as a chip capacitor in a manner of leading out electrodes for connection. In the ordinary laminated ceramic capacitor, two electrodes (common electrodes) serving as two poles thereof are lead out from side faces of the laminar structure composed of dielectric layers and electrode layers. By contrast, as shown in FIGS. 2(a) and 2(b), the capacitor 130 includes a number of connection-to-IC capacitor pads 134 (134A, 134B, and 134C in FIG. 2(b)) which are arranged on a capacitor upper-surface (first capacitor main-surface) 130A in positions corresponding to the connection-to-capacitor bumps 103 of the IC chip 101 and which are made of Ag—Sn solder and formed into a substantially hemispheric shape while being truncated flat. The connection-to-IC capacitor bumps 131 (131A, 131B, and 131C represented by a dashed line in FIG. 2(b)) are later formed on the corresponding connection-to-IC capacitor pads 134. The connection-to-IC capacitor bumps 131, through fusion thereof, can be flip-chip-bonded to the connection-to-capacitor bumps 104 of the IC chip 101.

As schematically shown in FIG. 2(b), the electrode layers 133 of the capacitor 130 are divided into a pair of groups 133E and 133F of electrode layers. Electrode layers belonging to the groups 133E and 133F are electrically connected every other layer by means of via conductors 135E and 135F. The group 133E of electrode layers and the group 133F of electrode layers are insulated from each other. Thus, two (a pair of) electrode groups 133E and 133F, which face each other while the dielectric layer 132 is sandwiched therebetween, serve as two electrodes of the capacitor 130.

A portion of the connection-to-IC capacitor pads 134 (central pads 134B in FIG. 2(b)) are connected to a top electrode layer 133ET belonging to the electrode group 133E, by means of a via conductor 135ET which extends through a top dielectric layer 132T which is located in the top position among the dielectric layers 132. The remaining portion of the connection-to-IC capacitor pads 134 (left-hand pads 134A and right-hand pads 134C in FIG. 2(b)) are connected to an electrode layer 133FS located immediately below the top electrode layer 133ET and belonging to the other electrode group 133F, by means of via conductors 135FT and 135FS.

As mentioned above, a number of connection-to-IC capacitor pads 134 and connection-to-IC capacitor bumps 131 are connected to either one of the paired electrode groups 133E and 133F, which serve as two electrodes of the capacitor. Also, the paired electrode groups 133E and 133F are each connected to at least one of the plurality of connection-to-IC capacitor pads 134 (connection-to-IC capacitor bumps 131). That is, certain connection-to-IC capacitor pads 134 (for example, 134B) among the connection-to-IC capacitor pads 134 (connection-to-IC capacitor bumps 131) are connected to one electrode group 133E. Other connection-to-IC capacitor pads 134 (for example, 134A) among the connection-to-IC capacitor pads 134 are connected to the other electrode group 133F. Accordingly, as shown in FIG. 2(c), electrical connection to the paired electrode groups 133E and 133F from above the capacitor 130 can be established through the connection-to-IC capacitor bumps 131 (connection-to-IC capacitor pads 134).

Thus, the IC chip 101 connected to the connection-to-IC capacitor bumps 131 is connected to the paired electrode groups 133E and 133F of the capacitor 130.

As shown in FIG. 1, a capacitor lower-surface (second capacitor main-surface) 130B of the capacitor 130 abuts a bottom surface 121S of the depression 121, whereby the position of the capacitor 130 is determined with respect to the depth direction (vertical direction in FIG. 1). That is, the bottom surface 121S restricts (determines) the position of the connection-to-IC capacitor pads 134 and connection-to-IC capacitor bumps 131 with respect to the depth direction.

The position of each connection-to-IC capacitor pad 134 of the capacitor 130 is highly accurately determined in the depth direction (in the thickness direction of the capacitor; vertical direction in FIG. 1), so that the connection-to-IC capacitor pads 134 are highly coplanar.

As will be described later, the connection-to-IC capacitor bumps 131 are formed while abutting a plane portion of a jig during their formation process. Thus, their top portions exhibit higher coplanarity. Further, as will be described later, the connection-to-IC substrate bumps 152 of the printed wiring substrate 120 and the connection-to-IC capacitor bumps 131 are formed simultaneously while abutting the common plane portion of a jig, and are thus substantially coplanar. Accordingly, the connection-to-capacitor bumps 103 and the connection-to-substrate bumps 104 formed on the lower surface 101B of the IC chip 101 do not need to assume different shapes or heights, but may assume the same shape, thereby facilitating fabrication of the IC chip 101. Also, connection to the IC chip 101 can be established easily and reliably.

Various signals, power potential, and ground potential are input to the IC chip 101 from another printed wiring substrate, such as a motherboard, connected to the lower surface 120B of the printed wiring substrate 120, through the wiring layer 144, through-hole conductors 145, wiring layer 143, connection-to-IC substrate bumps 152, and connection-to-substrate bumps 104. The capacitor 130 connected to a power line and a grounding line in the IC chip 101 eliminates noise superposed on the signals, power potential, and ground potential.

Since the capacitor 130 is directly connected to the IC chip 101, the capacitor 130 is disposed close to the IC chip, thereby enhancing noise elimination capability of the capacitor 130.

A number of connection-to-IC capacitor bumps 131 (connection-to-IC capacitor pads 134) are connected to a number of connection-to-capacitor bumps 103 in parallel. Accordingly, power potential and ground potential can be supplied to relevant points on the IC chip while the electrode groups 133E and 133F of the capacitor 130 are used as common electrodes.

The connection-to-IC substrate bumps 152 (connection-to-IC substrate pads 143P) are formed in the cavity periphery region 111 located around the depression 121; i.e., around the connection-to-IC capacitor bumps 131. Thus, the present embodiment prevents an unavoidable increase in the size (planar size) of the IC chip 101 caused by an increase in an area where the connection terminals 102 of the IC chip 101 to be connected to both the capacitor 130 and the printed wiring substrate 120 are formed. Thus, an IC chip to be used can be of a small size, whereby an inexpensive IC chip can be used. As a result, the capacitor-built-in-type printed wiring substrate 100 on which an IC chip is mounted can become inexpensive.

Figure 3:
FIGS. 3(a) to 3(c) are views for explaining a process for fabricating the capacitor of FIG. 2.
Figure 3:
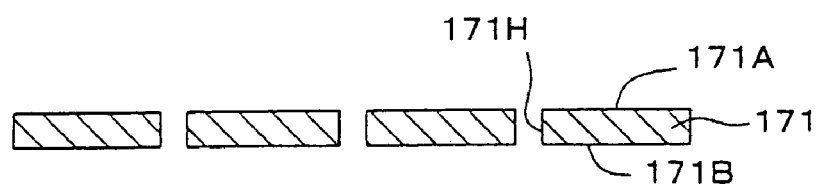
Figure 3:
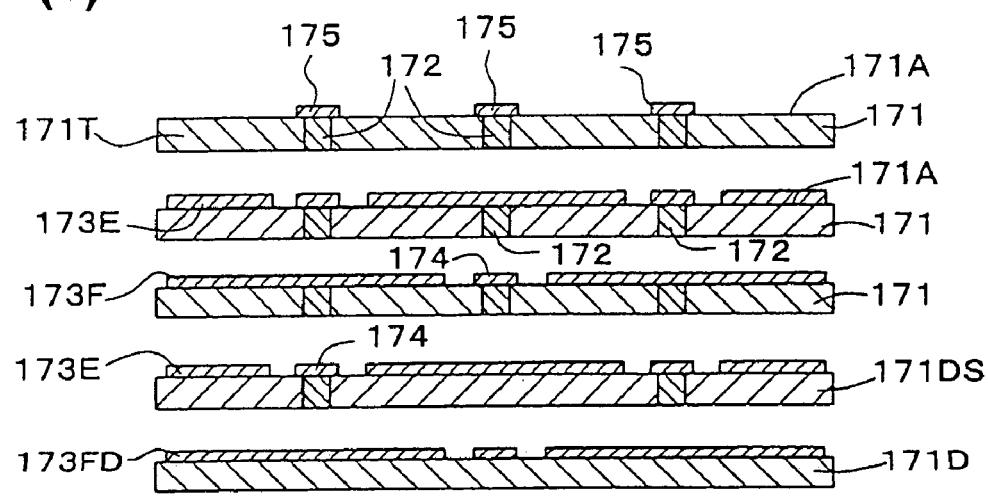

Next will be described a process for fabricating the capacitor-built-in-type printed wiring substrate on which an IC chip is mounted and a process for fabricating the capacitor-built-in-type printed wiring substrate 110. The description includes description of component members of the capacitor-built-in-type printed wiring substrate 110; i.e., the capacitor 130 and the printed wiring substrate 120 as well as description of a process for fabricating the same. First, a process for fabricating the capacitor 130 will be described with reference to FIG. 3. As shown in FIG. 3(a), a number of high-dielectric-constant ceramic green sheets (hereinafter may be referred to merely as sheet or sheets) 171 which contain $BaTiO_3$ powder as a main component are manufactured by means of a known technology of manufacturing green sheets. As shown in FIG. 3(b), via holes 171H are punched in the sheet 171 in predetermined positions in such a manner as to extend between a front surface 171A and a back surface 171B.

As shown in FIG. 3(c), Pd paste is filled into the via holes 171H formed in the sheets 171. Unfired electrode layers 173E and 173F which are made of Pd paste and each assume a predetermined pattern are each formed on the upper surface 171A of the relevant sheet 171. The unfired electrode layer 173E is formed into such a pattern as to be connected to left- and right-hand columns of unfired via conductors 172 and to be not connected to a center column of unfired via conductors 172 in FIG. 3(c). By contrast, the unfired electrode layer 173F is formed into such a pattern as to be connected to the center column of unfired via conductors 172 and to be not connected to the left- and right-hand columns of unfired via conductors 172.

In the case of the vias 172 which are not connected to the unfired electrode layer 173E or 173F, cover pads 174 may be formed, simultaneously with formation of the unfired electrode layers 173E and 173F, on the corresponding unfired via conductors 172 in order to reliably establish electrical connection between the via conductors with respect to the vertical direction during lamination, which will be described later.

Neither of the unfired electrode layers 173E and 173F are formed on an unfired dielectric layer 171T which is disposed uppermost during lamination, which will be described later. Cover pads 175 are merely formed on the unfired dielectric layer 171T in such a manner as to cover the corresponding unfired via conductors 172.

Neither the via holes 171H nor the unfired via conductors 172 are formed in a lowermost unfired dielectric layer 171D. An unfired electrode layer 173FD is formed on the substantially entire surface of the unfired dielectric layer 171D. The unfired via conductors 172 to be connected to the unfired electrode layer 173E (a central unfired via conductor in FIG. 3(c)) is not formed on an unfired dielectric layer 171DS which is disposed on the lowermost unfired dielectric layer 171D.

Figure 2:
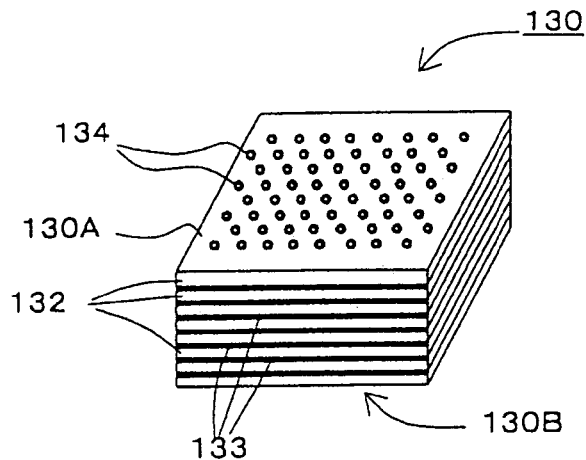
Figure 2:
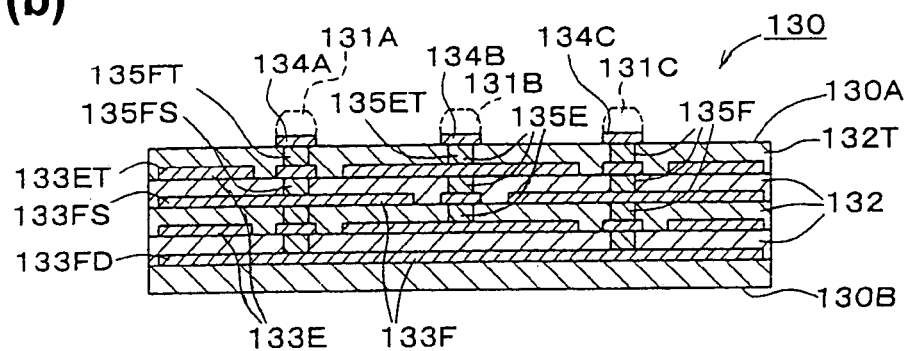
Figure 2:
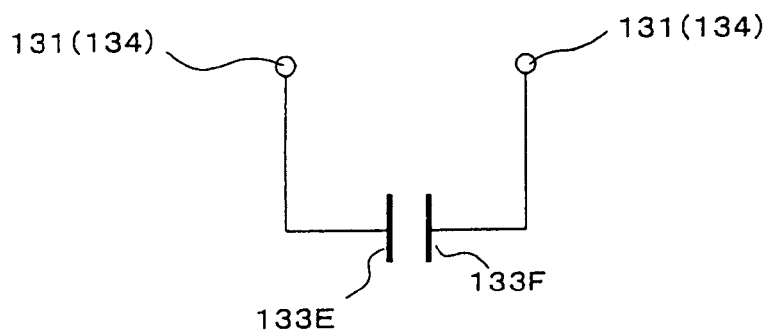

The above-mentioned layers are laminated under pressure, followed by firing (simultaneous firing) to thereby form the capacitor 130 shown in FIG. 2. Since the capacitor 130 is thus formed, after firing, there is no need to form, for example, a common electrode on a side face of a laminar structure composed of the dielectric layers 132 in order to establish connection to the electrode group 133E or 133F. After firing, the laminar structure can be immediately used as a capacitor. Notably, the via conductors 135E and 135F (unfired via conductors 172) are not necessarily formed in a vertically aligned manner, but may be formed in any position within the dielectric layers 132 (unfired dielectric layers 171) while the position of via conductors in upper and lower layers, intervals to the adjacent via conductors 135E or 135F, and patterns of electrode layers are considered.

Accordingly, the position and number of the connection-to-IC capacitor pads 134 (connection-to-IC capacitor bumps 131) can be determined arbitrarily according to the position of the connection-to-capacitor bumps 103 formed on the IC chip 101. In order to provide appropriate wettability during formation of bumps, the connection-to-IC capacitor pads 134 of Pd may be plated with Ni—Au or Cu. A solder resist layer of ceramic or resin may be formed around the connection-to-IC capacitor pads 134 by a known process.

The completed capacitor 130 is checked for short circuit, capacitance, insulation resistance between the electrode groups 133E and 133F, and electrical connection between the connection-to-IC capacitor pads 134 and the electrode groups 133E or insulation between the connection-to-IC pads 134 and the electrode groups 133F. On the basis of results of the check, a defective capacitor 130 is discarded, thereby reducing potential use of a defective capacitor 130 in the subsequent process, which will be described later.

Next, a process for fabricating the printed wiring substrate 120 will be described. First, as shown in FIG. 4(a), there is prepared a core substrate body 147 which is made of a glass-epoxy-resin composite material and is adapted to define a bottom portion.

Figure 4:
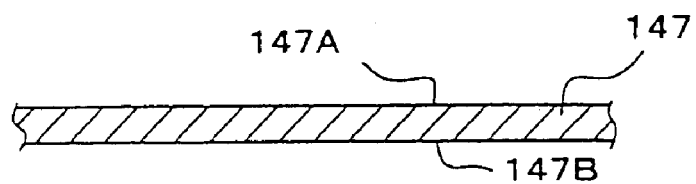
FIGS. 4(a) to 4(d) are views for explaining a first half of a process for fabricating the printed wiring substrate according to embodiment 1 having the capacitor accommodation cavity formed therein.
Figure 4:
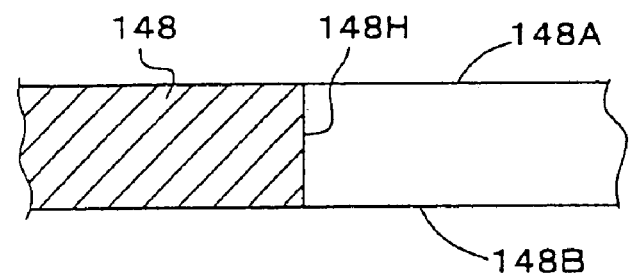
Figure 4:
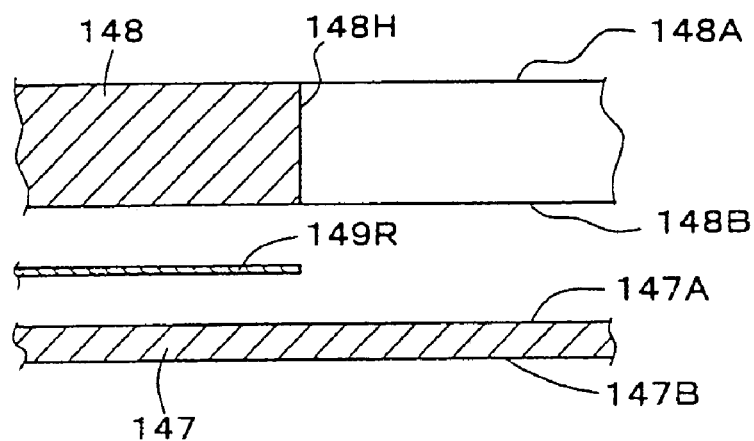
Figure 4:
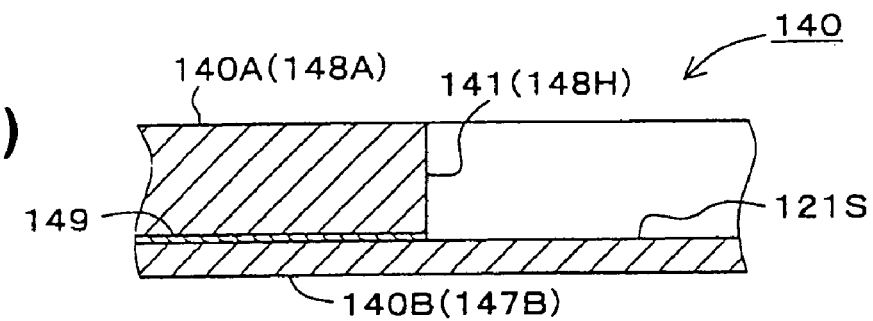

As shown in FIG. 4(b), there is prepared a core substrate body 148 which is made of the glass-epoxy-resin composite material, which is thicker than the core substrate body 147, and which is adapted to define a wall portion. A through-hole 148H adapted to define a depression is formed beforehand in the core substrate body 148 in a position corresponding to the depression 121 (141).

Next, as shown in FIG. 4(c), the core substrate body 148 is superposed on the core substrate body 147 while an adhesive sheet 149R is sandwiched between an upper surface 147A of the core substrate body 147 and a lower surface 148B of the core substrate body 148. The adhesive sheet 149R is made of tack dry epoxy resin and assumes the form of a substantially square frame corresponding to the through-hole 148H adapted to define a depression. The resultant laminate is heated while being pressed. Thus, the core substrate bodies 147 and 148 are bonded together while a boding layer 149 is formed therebetween, thereby forming a core substrate 140 shown in FIG. 4(d). A depression 141 (148H) is formed in the core substrate 140. A portion of the upper surface 147A which is exposed to the interior of the depression 141 serves as the bottom surface 121S of the capacitor accommodation cavity 121.

Next, core through-holes 142 are drilled in the core substrate 140 around the depression 141 in such a manner as to extend between the upper surface 140A and the lower surface 140B. When the diameter of or interval between the core through-holes 142 is to be reduced, laser ($CO_2$ or YAG) may be employed for drilling.

Figure 5:
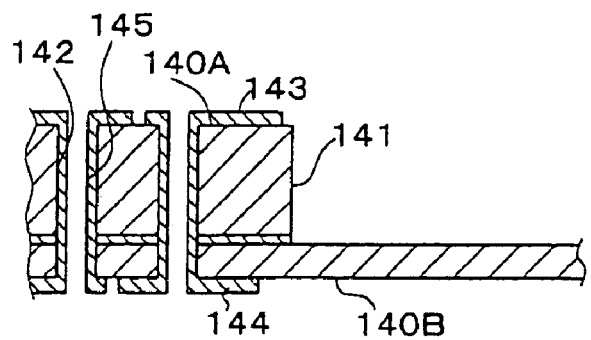
FIGS. 5(a) and 5(b) are views for explaining a second half continued from the first half of FIG. 4 with respect to the process for fabricating the printed wiring substrate according to embodiment 1 having the capacitor accommodation cavity formed therein.
Figure 5:
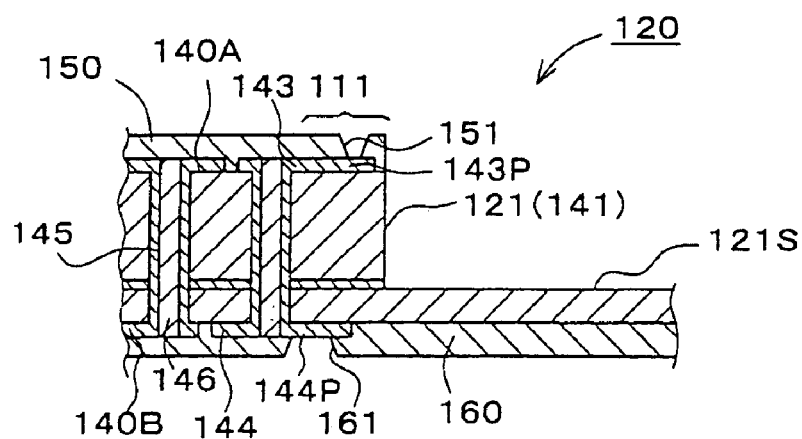

As shown in FIG. 5(a), by means of a known process for forming a wiring layer and a through-hole conductor, the wiring layers 143 and 144 of Cu are formed on the upper surface 140A of the core substrate 140 and on the lower surface 140B of the core substrate 140, respectively, and the through-hole conductors 145 of Cu are formed on the interior walls of and around the corresponding core through-holes 142 in such a manner as to be connected to the wiring layers 143 and 144.

Subsequently, the through-hole conductors 145 are filled with the filling resin 146 of epoxy resin. By means of a known process, the insulating resin layer 150 of epoxy resin is formed on the wiring layer 143 and the upper surface 140A of the core substrate 140; and the insulating resin layer 160 of epoxy resin is formed on the wiring layer 144 and the lower surface 140B of the core substrate 140. Openings 151 are formed in the insulating resin layer 150 in predetermined positions such that the connection-to-IC substrate pads 143P of the wiring layer 143 are exposed therethrough; and openings 161 are formed in the insulating resin layer 160 in predetermined positions such that the connection pads 144P of the wiring layer 144 are exposed therethrough. Thus, as shown in FIG. 5(b), the printed wiring substrate 120 in which the closed-bottomed capacitor accommodation cavity 121 is formed is completed.

Notably, the connection-to-IC capacitor bumps 131 of the capacitor 130 and the connection-to-IC substrate bumps 152 of the printed wiring substrate 120 are not formed yet, but will be formed, as will be described later, after the capacitor 130 is disposed in the depression 121 of the printed wiring substrate 120.

The openings 151 formed in the insulating resin layer 150 are arranged in the cavity periphery region 111 located around the depression 141 (121) for the following reason. The connection-to-IC substrate pads 143P or the connection-to-IC substrate bumps 152 are formed close to the depression 141 (121) so that the connection-to-substrate bumps 104 of the IC chip 101 to be mounted can be positioned as close to the connection-to-capacitor bumps 103 as possible, thereby reducing the planar size of the IC chip 101.

Figure 6:
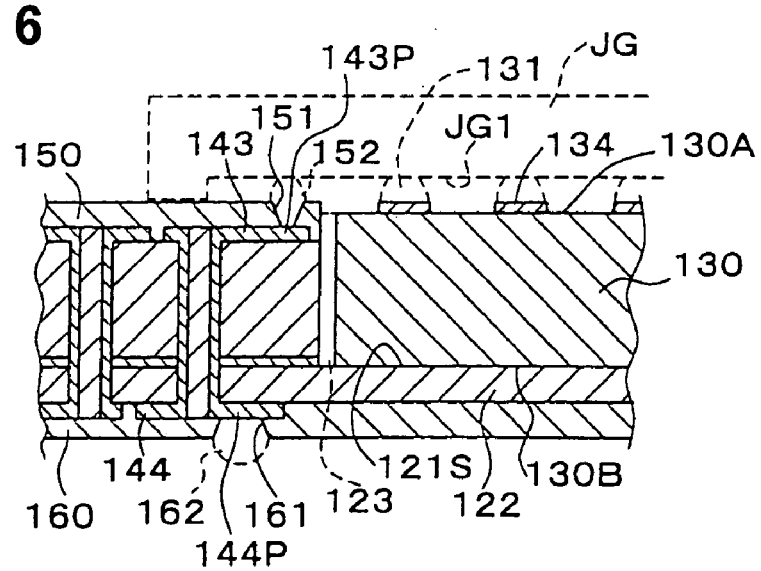
FIG. 6 is a view for explaining a process for fabricating a capacitor-built-in-type printed wiring substrate, illustrating a manner in which the capacitor of FIG. 2 is disposed in the capacitor accommodation cavity of the printed wiring substrate of FIG. 5(b).

Subsequently, as shown in FIG. 6, the capacitor 130 is disposed in the depression 121. In this case, the bottom portion 122 serves as a capacitor position restriction portion. Specifically, the lower surface 130B of the capacitor 130 abuts the bottom surface 121S of the depression 121, whereby the position of the capacitor 130 is restricted with respect to the depth direction (vertical direction in FIG. 1) of the depression 121. Accordingly, the position of the connection-to-IC capacitor pads 134 is determined with respect to the depth direction.

Subsequently, the filling resin 123 is injected into a gap between the depression 121 and the capacitor 130 and is then allowed to set, thereby bonding the printed wiring substrate 120 and the capacitor 130 together.

Further, as represented by a dashed line, solder paste is applied into the openings 151 and onto the connection-to-IC capacitor pads 134. A legged flattening jig JG having a planar portion JG1 is placed on the printed wiring substrate 120. The applied solder paste is caused to melt to thereby form the connection-to-IC substrate bumps 152 and the connection-to-IC capacitor bumps 131. Simultaneously, solder paste is applied into the openings 161. Then, the applied solder is caused to melt, thereby forming the solder bumps 162. Thus, the capacitor-built-in-type printed wiring substrate 110 is completed (see FIG. 1).

In this case, top portions of the formed connection-to-IC substrate bumps 152 and those of the formed connection-to-IC capacitor bumps 131 become flat along the planar portion JG1 of the jig JG to thereby assume favorable coplanarity. Also, top portions of the connection-to-IC substrate bumps 152 become substantially coplanar with those of the connection-to-IC capacitor bumps 131. Accordingly, even when the connection-to-substrate bumps 104 and the connection-to-capacitor bumps 103 formed on the lower surface (connection plane) 101B of the IC chip 101 assume a substantially identical shape, the IC chip 101 can be easily and reliably connected to the printed wiring substrate 120 and to the capacitor 130; i.e., to the capacitor-built-in-type printed wiring substrate 110.

According to the present embodiment, the through-hole conductor 145 is formed on the inner wall of and around the core through-hole 142 and assumes a substantially cylindrical shape. However, a filling resin which contains Cu powder may be filled into the core through-hole 142, and then the upper and lower ends of the core through-hole 142 may be closed by means of a plating layer. This enables forming of the opening 151 or 161 immediately above or below the through-hole conductor 145, whereby the though-hole conductors 145 can be formed at a higher density.

According to the present embodiment, in fabrication of the core substrate 140 in which the depression 141 is formed, the core substrate body 147—defines the bottom portion of the depression 141—and the core substrate body 148—which defines the wall portion of the depression 141—are separately manufactured beforehand and are then bonded together. Thus, the closed-bottomed depression 141 can be formed easily and accurately, so that the core substrate 140 can be formed at low cost.

Modified Embodiment 1

In above-described embodiment 1, the insulating resin layer 150 which also serves as a solder resist layer is formed only on the printed wiring substrate 120. However, simultaneously, the insulating resin layer 150 may also be formed on the upper surface 130A of the capacitor 130. Also, according to embodiment 1, after formation of the wiring layers 143 and 144, the through-hole conductors 145, and the insulating resin layers 150 and 160, the capacitor 130 is disposed in the depression 121 (141). However, after the capacitor 130 is disposed in the depression 141, the wiring layers and other components may be formed.

Figure 7:
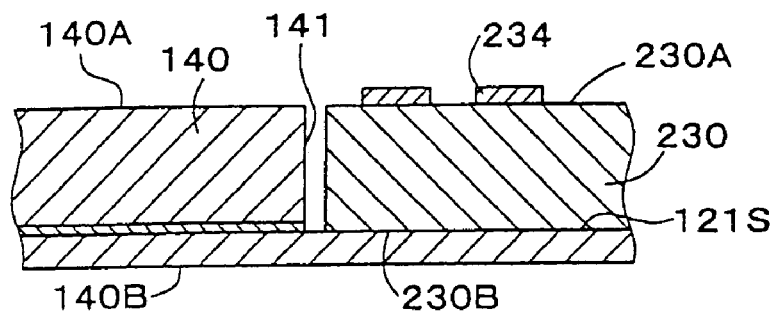
FIGS. 7(a) to 7(c) are views for explaining a first half of a process for fabricating a capacitor-built-in-type printed wiring substrate according to modified embodiment 1 in which an insulating resin layer is also formed on an upper surface of a capacitor.
Figure 7:
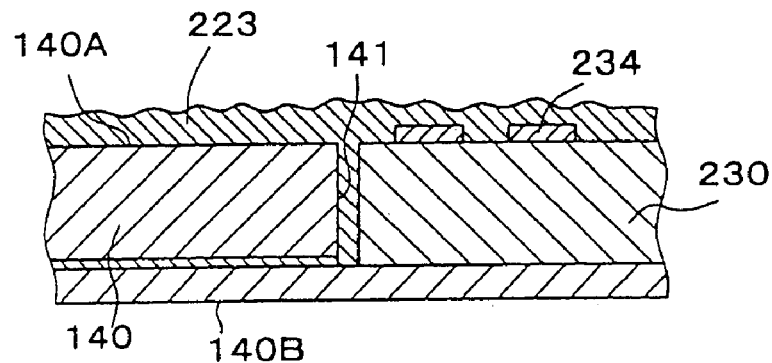
Figure 7:
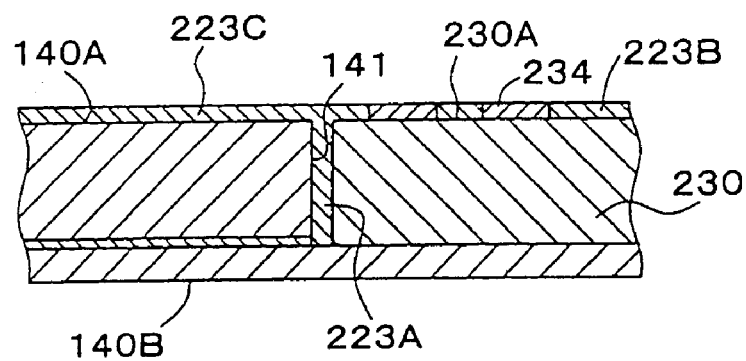

Specifically, as shown in FIG. 7(a), a capacitor 230 is disposed in the depression 141 of the core substrate 140 shown in FIG. 4(d). Notably, the capacitor 230 is similar to the above-described capacitor 130 except that the thickness (dimension between an upper surface 230A and a lower surface 230B) thereof is slightly less than that of the capacitor 130.

Through abutment of the lower surface 230B of the capacitor 230 and the bottom surface 121S of the depression 141, the position of the capacitor 230 is restricted with respect to the depth direction (vertical direction in FIG. 7(a)) of the depression. In the present embodiment, the capacitor 230 assumes such a size that, when the capacitor 230 is disposed in the depression 141, the upper surfaces of connection-to-IC capacitor pads 234 formed on the upper surface 230A are positioned higher than the upper surface 140A of the core substrate 140.

Subsequently, as shown in FIG. 7(b), insulating filling resin 223 of epoxy resin is applied into a gap between the depression 141 and the capacitor 230 and onto the upper surface 230A of the capacitor 230 and the upper surface 140A of the core substrate 140, and is then allowed to set. Thus, the core substrate 140 and the capacitor 230 are bonded together.

Further, as shown in FIG. 7(c), the filling resin 223 applied onto the upper surfaces 140A and 230A is polished so as to expose the upper surfaces of the connection-to-IC capacitor pads 234 flush with each other. The exposed surfaces are polished flat. Thus are formed a filling resin 223A disposed in the gap between the core substrate 140 and the capacitor 230, a filling resin layer 223B disposed on the upper surface 230A of the capacitor 230, and a filling resin layer 223C disposed on the upper surface 140A of the core substrate 140.

Further, as shown in FIG. 8(a), through-holes 30H are drilled in the periphery of the depression 141 in such a manner as to extend between an upper surface 223CU of the filling resin layer 223C and the lower surface 140B of the core substrate body 140. When the diameter of or interval between the through-holes 242 is to be reduced, laser ($CO_2$ or YAG) may be employed for drilling.

Next, by use of a known method, a through-hole conductor 245 of Cu is formed on the interior wall of and around each core through-hole 242. A wiring layer 243 (244) extending from the core through-hole conductor 245 is formed on the upper surface 223CU of the filling resin layer 223C (on the lower surface 140B of the core substrate 140). The connection-to-IC capacitor pads 234 which have been polished flush with the filling resin layer 223B are plated with Cu so as to increase thickness thereof, thereby projecting upward beyond the filling resin layer 223B.

Figure 8:
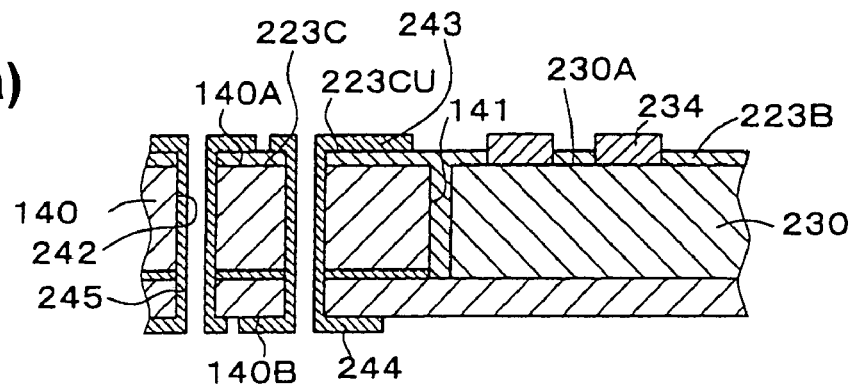
FIGS. 8(a) and 8(b) are views for explaining a second half continued from FIG. 7 with respect to the process for fabricating the printed wiring substrate according to modified embodiment 1.
Figure 8:
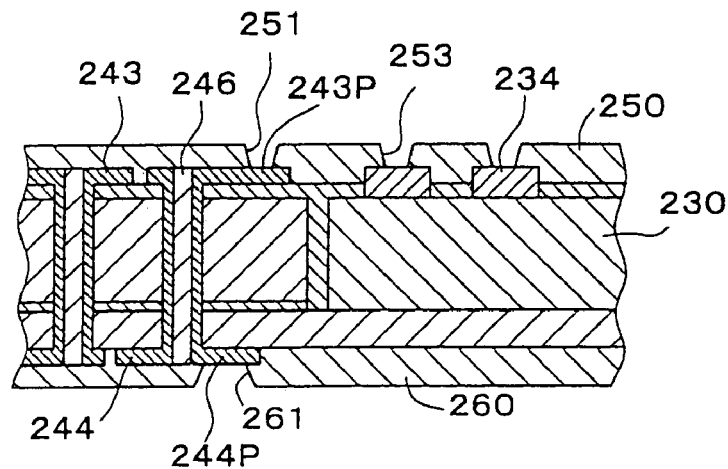

Further, as shown in FIG. 8(*b*), the through-hole conductors 245 are filled with the filling resin 246. By means of a known process for forming an insulating resin layer, an insulating resin layer 250 of epoxy resin is formed on the filling resin layers 223B and 223C and the wiring layer 243; and an insulating resin layer 260 of epoxy resin is formed on the wiring layer 244 and the lower surface 140B of the core substrate 140. Openings 251 are formed in the insulating resin layer 250 in predetermined positions such that connection-to-IC substrate pads 243P of the wiring layer 243 are exposed therethrough; and openings 261 are formed in the insulating resin layer 260 in predetermined positions such that connection pads 244P of the wiring layer 244 are exposed therethrough. Openings 253 are also formed in the insulating resin layer 250 such that the connection-to-IC capacitor pads 234 are exposed therethrough.

Figure 9:
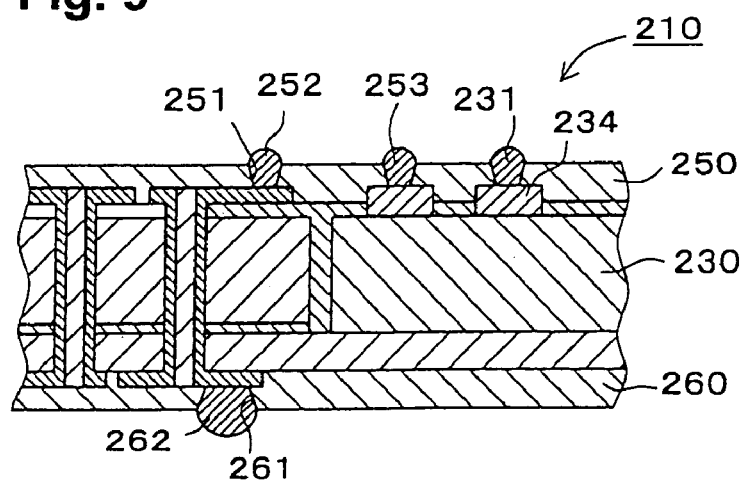
FIG. 9 is a partially enlarged sectional view showing the capacitor-built-in-type printed wiring substrate according to modified embodiment 1.

Subsequently, as shown in FIG. 9, solder paste is applied into the openings 251, 253, and 261. The applied solder paste is caused to melt, thereby completing a capacitor-built-in-type printed wiring substrate 210 having connection-to-IC capacitor bumps 231, connection-to-IC substrate bumps 252, and solder bumps 262. As in the case of embodiment 1, by use of the jig JG, the top portions of the connection-to-IC capacitor bumps 231 and those of the connection-to-IC substrate bumps 252 may be finished flat.

In the thus-formed capacitor-built-in-type printed wiring substrate 210, the insulating resin layer 250 is also formed on and around a peripheral portion of each connection-to-IC capacitor pad 234. Therefore, the insulating resin layer 250 serves as a solder resist layer for the connection-to-IC capacitor pads 234 and the connection-to-IC substrate pads 243P.

Further, as shown in FIG. 8(*a*), the filling resin 223 applied onto the upper surface 140A of the core substrate 140 and onto the upper surface 230A of the capacitor 230 is polished flat, thereby eliminating the influence of a dimensional error of the capacitor 230, a dimensional error of the depression 141, and deformation, such as warpage, of the core substrate 140. The wiring layer 243 is thus prevented from suffering breaking of line or short circuit. Also, the coplanarity of the connection-to-IC substrate pads 243P and that of the connection-to-IC capacitor pads 234 can be improved.

Modified Embodiment 2

Figure 10:
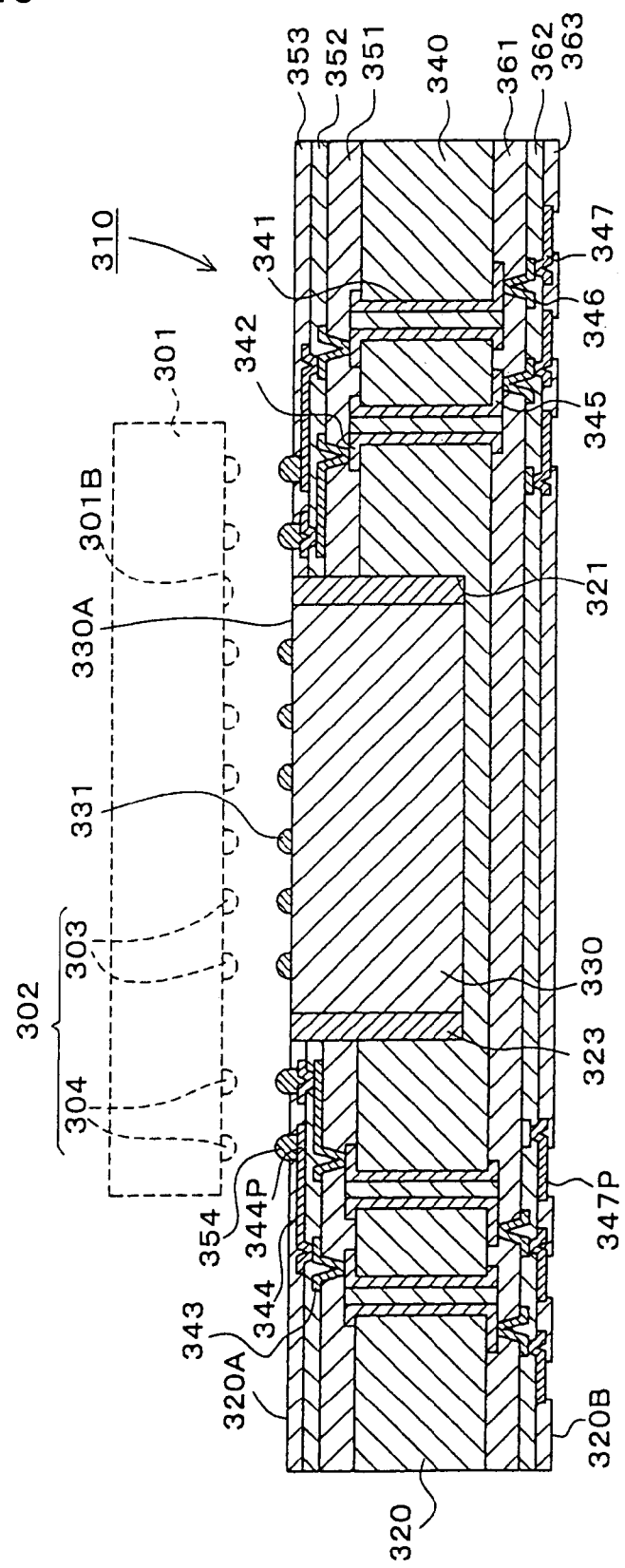
FIG. 10 is a sectional view showing a capacitor-built-in-type printed wiring substrate according to modified embodiment 2 in which a capacitor is disposed in a closed-bottomed capacitor accommodation cavity formed in a printed wiring substrate having a number of insulating resin layers formed thereon.

Embodiment 1 and modified embodiment 1 are described above while mentioning a printed wiring substrate in which a single insulating resin layer 150 (250) is formed on the upper surface of a core substrate, and a single insulating resin layer 160 (260) is formed on the lower surface of the core substrate. However, a plurality of insulating resin layers may be formed on either side of the core substrate. For example, as shown in FIG. 10, three insulating resin layers 351, 352, and 353 (361, 362, and 363) may be formed on the upper (lower) surface of a core substrate 340—which is formed in a manner similar to that in which the core substrate 140 of embodiment 1 is formed—by means of a known buildup process, thereby forming a printed wiring substrate 320 in which a closed-bottomed capacitor accommodation cavity 321 is formed.

The printed wiring substrate 320 includes connection-to-IC substrate bumps 354 formed on its upper surface (first substrate main-surface) 320A, and connection pads 347P formed on its lower surface (second substrate main-surface) 320B. In the printed wiring substrate 320, through-hole conductors 341 are formed in such a manner as to extend through the core substrate 340, and wiring layers 342, 343, 344, 345, 346, and 347 are formed in such a manner as to extend through corresponding insulating resin layers or in such a manner as to be disposed between insulating resin layers, thereby connecting the connection-to-IC substrate bumps 354 and the connection pads 347P.

A capacitor 330 disposed in the capacitor accommodation cavity 321 has a dimension which matches the depth of the capacitor accommodation cavity 321. As in the case of embodiment 1, a number of connection-to-IC capacitor bumps 331 are formed on an upper surface 330A of the capacitor 330.

As in the case of embodiment 1, the printed wiring substrate 320 and the capacitor 330 are fixed together by means of a filling resin 323.

Further, The connection-to-IC capacitor bumps 331 of the capacitor 330 and the connection-to-IC substrate bumps 354 of the printed wiring substrate 320 can be connected to corresponding connection terminals 302; specifically, connection-to-capacitor bumps 303 and connection-to-substrate bumps 304 formed on a lower surface 301B of an IC chip 301 represented with a dashed line.

As described above, even when a number of insulating resin layers (in FIG. 10, three layers on the upper side and three layers on the lower side) are formed, the printed wiring substrate and the capacitor are directly connected to the IC chip. Thus, the present embodiment yields effects similar to those yielded by embodiment 1; for example, noise can be reliably eliminated by means of the capacitor.

Modified Embodiment 3

Figure 11:
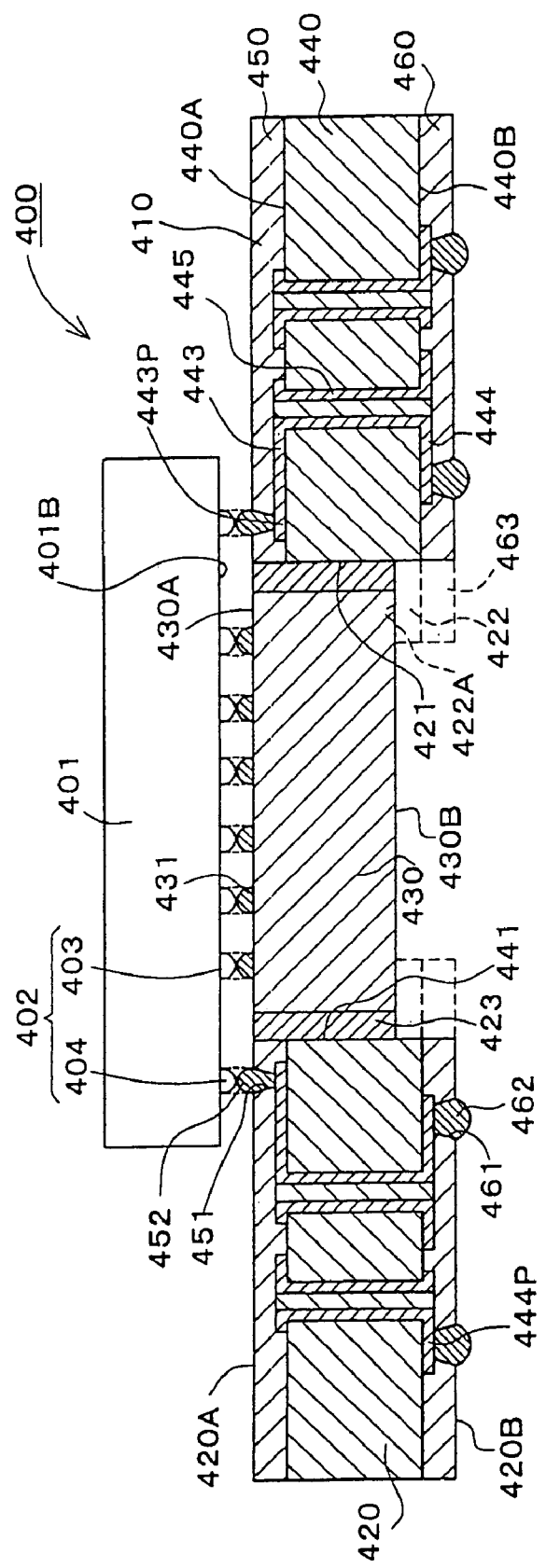
FIG. 11 is a sectional view showing a capacitor-built-in-type printed wiring substrate according to modified embodiment 3 in which a capacitor is disposed in a through capacitor accommodation cavity which is formed in a printed wiring substrate in such a manner as to open upward and downward in the drawing.

Embodiment 1 and modified embodiments 1 and 2 are described while mentioning a printed wiring substrate in which the capacitor accommodation cavity 121 assumes the form of a closed-bottomed depression. However, the cavity may assume the form of a through-hole. For example, as shown in FIG. 11, a capacitor-built-in-type printed wiring substrate 400 of the present embodiment on which an IC chip is mounted differs from embodiment 1 in that a capacitor accommodation cavity 421 formed in a printed wiring substrate 420 assumes the form of a through-hole. Other features are similar to those of embodiment 1. Different features will be mainly described.

The capacitor-built-in-type printed wiring substrate 400 on which an IC chip is mounted includes an IC chip 401 and a capacitor-built-in-type printed wiring substrate 410, on which the IC chip 401 is mounted. As in the case of embodiment 1, the IC chip 401 includes a number of hemispheric connection terminals 402 formed on a lower surface 401B. The connection terminals 402 is composed of connection-to-capacitor bumps 403 and connection-to-substrate bumps 404.

The capacitor-built-in-type printed wiring substrate 410 includes a printed wiring substrate 420 which assumes a substantially square shape and in which a capacitor accommodation cavity-which assumes the form of a through-hole having a square shape as viewed from above-(hereinafter may be referred to merely as a through-cavity) 421 is formed substantially at the center of the printed wiring substrate 420, and a capacitor 430 disposed within the through-cavity 421. The printed wiring substrate 420 and the capacitor 430 are fixedly attached into a single unit by means of a filling resin 423 made of epoxy resin and filled into a gap therebetween.

A number of connection-to-IC substrate bumps 452 are formed on an upper surface (first substrate main-surface) 420A of the printed wiring substrate 420 in positions corresponding to those of connection-to-substrate bumps 404. When the IC chip 401 is mounted on the printed wiring substrate 420, the molten connection-to-IC substrate bumps 452 are fused with the corresponding connection-to-substrate bumps 404 as represented with a dashed line, thereby flip-chip-bonding the IC chip 401 and the printed wiring substrate 420 together. Likewise, as represented with a dashed line, connection-to-IC capacitor bumps 431 are fused with the corresponding connection-to-capacitor bumps 403, thereby flip-chip-bonding the IC chip 401 and the capacitor 430 together.

As in the case of embodiment 1, the printed wiring substrate 420 includes a wiring layer 443 and an insulating resin layer 450 which are formed on an upper surface 440A of a core substrate 440, and a wiring layer 444 and an insulating resin layer 460 which are formed on a lower surface 440B of the core substrate 440. The wiring layers 443 and 444 are electrically connected by means of through-hole conductors 445 extending through the core substrate 440.

A through-hole 441 which assumes a square shape as viewed from above is formed in the core substrate 440 at the center thereof.

As in the case of embodiment 1, openings 451 are formed in a periphery of the through-cavity 421. A portion of the wiring layer 443 exposed in each of the openings 451 serves as a connection-to-IC substrate pad 443P. The openings 451 are each filled with solder in such a manner as to project beyond the upper surface 420A, thereby forming the connection-to-IC substrate bumps 452.

Also, as in the case of embodiment 1, openings 461 are formed in grid array in a portion of the insulating resin layer 460 corresponding to a peripheral portion of the printed wiring substrate 420. A portion of the wiring layer 444 exposed in each of the openings 461 serves as a connection pad 444P. The openings 461 are each filled with solder, thereby forming the solder bumps 462 on a grid. Thus, the printed wiring substrate 420 is of BGA type.

As in the case of the printed wiring substrate 110 of embodiment 1, in the capacitor-built-in-type printed wiring substrate 410, the IC chip 401 can be connected to the printed wiring substrate 420. Also, the capacitor 430 can be directly connected to the IC chip 401. Accordingly, the present embodiment can yield effects similar to those yielded by embodiment 1; for example, noise can be reliably eliminated.

Since the printed wiring substrate 420 does not require formation of a bottom portion with respect to the core substrate 440, there is no need to involve the step of affixing two core substrate bodies 147 and 148 as in the case of embodiment 1, thereby facilitating fabrication.

In order to facilitate positioning of the capacitor 430 with respect to the depth direction, as represented with a dashed line, a capacitor rest portion 422 is formed in the vicinity of the lower surface 440B of the core substrate 440 in such a manner as to project inward in the through-cavity 421. A lower surface 430B of the capacitor 430 may be caused to abut an upper surface 422A of the capacitor rest portion 422. In this case, the insulating resin layer 460, together with the capacitor rest portion 422, may be caused to project so as to form a protrusion 463. Further, the wiring layer 444 and the solder bumps 462 may be formed on the protrusion 463.

In the present embodiment, a single insulating resin layer 450 (460) is formed on the upper (lower) surface of a core substrate. However, a plurality of insulating resin layers may be formed on either side of the core substrate, while a through-cavity is formed in the core substrate.

In fabrication of the above-described printed wiring substrate 120 of embodiment 1 (320 of modified embodiment 2 or 420 of modified embodiment 3), a printed wiring substrate in which the capacitor accommodation cavity 121 (321 or 421) is not formed is fabricated by means of a known buildup process. Subsequently, a central portion of the printed wiring substrate may be gouged from the side of the upper surface 120A by means of a rooter, to thereby form the capacitor accommodation cavity 121 which assumes the form of a closed-bottomed depression or through-hole.

Modified Embodiments 4, 5, and 6

Figure 12:
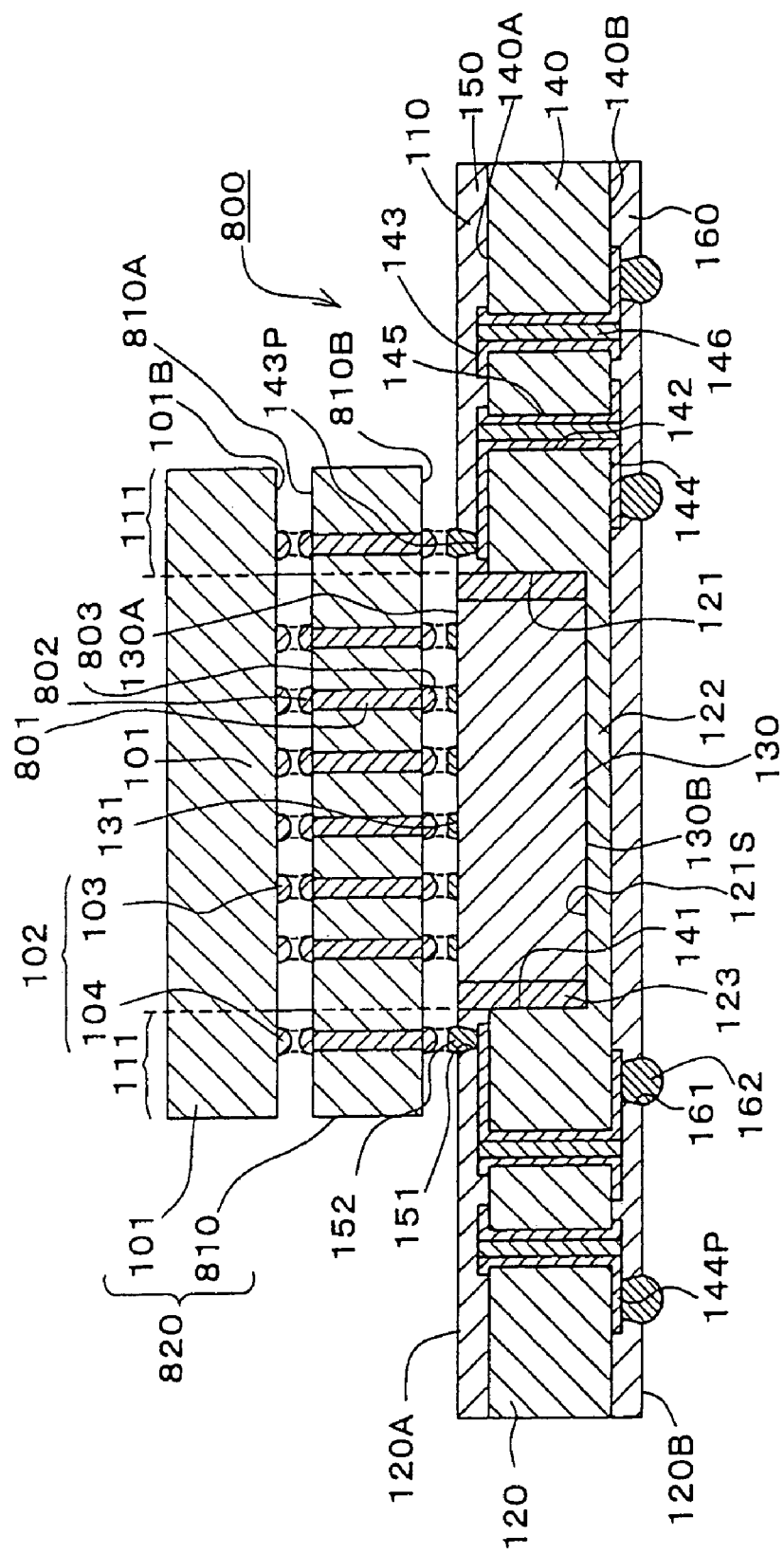
FIG. 12 is a sectional view showing a capacitor-built-in-type printed wiring substrate according to modified embodiment 4 in which a CSP on which an IC chip is mounted is mounted on the capacitor-built-in-type printed wiring substrate of embodiment 1 (FIG. 1).
Figure 13:
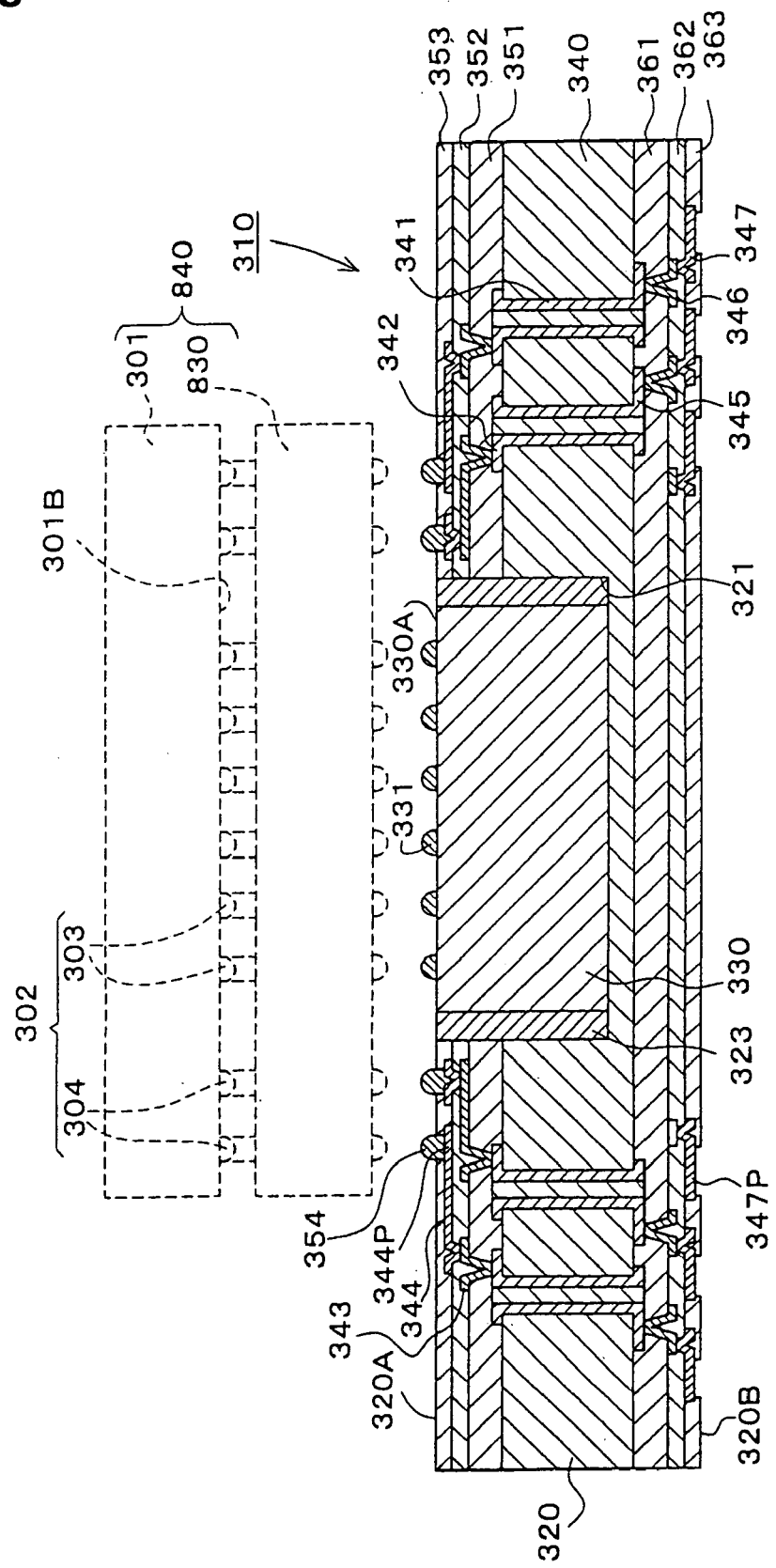
FIG. 13 is a sectional view showing a capacitor-built-in-type printed wiring substrate according to modified embodiment 5 in which an IC-chip-carrying CSP is mounted on the capacitor-built-in-type printed wiring substrate of modified embodiment 2 (FIG. 10).
Figure 14:
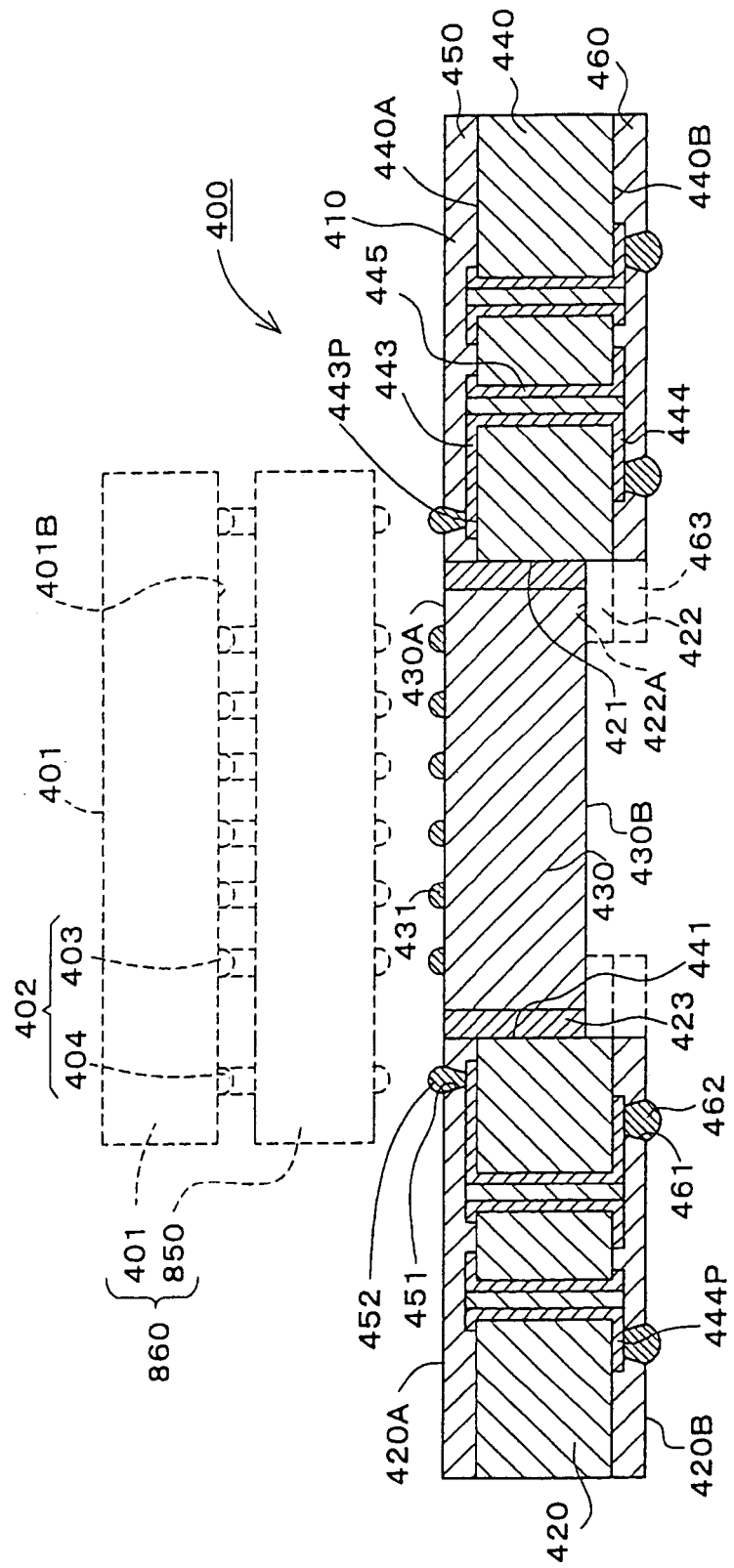
FIG. 14 is a sectional view showing a capacitor-built-in-type printed wiring substrate according to modified embodiment 6 in which an IC-carrying CSP is mounted on the capacitor-built-in-type printed wiring substrate of modified embodiment 3 (FIG. 11).

Embodiment 1 and modified embodiments 1 to 3 are described while respectively referring to the capacitor-built-in-type printed wiring substrate 100 on which the IC chip 101 is mounted, and the capacitor-built-in-type printed wiring substrates 110, 210, 310, and 410 on which the IC chips 101, 301, and 401 are mounted respectively. However, in place of an IC chip, a printed wiring substrate on which an IC chip is mounted; i.e., an IC-chip-carrying printed wiring substrate may be mounted. According to modified embodiment 4, the IC chip 101 is mounted beforehand on a CSP 810 to thereby form an IC-carrying CSP 820. Subsequently, the IC-carrying CSP 820 instead of the IC chip 101 is mounted on the capacitor-built-in-type printed wiring substrate 110 of embodiment 1, thereby forming a capacitor-built-in-type printed wiring substrate 800 on which the IC-carrying CSP 820 is mounted as shown in FIG. 12.

The CSP 810 is made of alumina ceramic and assumes a planar shape substantially similar to that of the IC chip 101. The CSP 810 includes a number of via conductors 801 of tungsten extending therethrough between an upper surface 810A and a lower surface 810B. The via conductors 801 are positioned so as to correspond to the positions of the connection terminals 102 of the IC chip 101. On the side of the upper surface 810A, bumps 802 to be connected to the corresponding connection terminals 102 of the IC chip 101 are formed on the corresponding via conductors 801B. The bumps 802 are made of a high-melting-point solder of 95Pb-5Sn. On the side of the lower surface 810B, bumps 803 are formed on the corresponding via conductors 801 and are to be connected to the capacitor-built-in-type printed wiring substrate 110; specifically, to the corresponding substrate bumps 152 of the printed wiring substrate 120 and to the corresponding capacitor bumps 131 of the capacitor 130. The bumps 803 are made of a eutectic solder of Pb—Sn.

Through fusing of the bumps 802 on the corresponding connection terminals 102, the IC chip 101 is mounted on the CSP 810; i.e., the IC-carrying CSP 820 is formed. As in the case of the IC chip 101 of embodiment 1, the IC-carrying CSP 820 can be mounted on the capacitor-built-in-type printed wiring substrate 110 such that the lower surface (connection face) 810B of the CSP 810 faces the upper surface (connection face) 120A of the printed wiring substrate and the upper surface (connection face) 130A of the capacitor.

Use of the CSP 810 on which the IC chip 101 is mounted, instead of using IC chip 101, prevents a breakage in the connection terminals 102 or a breakage in the IC chip 101 itself which would otherwise be caused by the difference in coefficient of thermal expansion between the IC chip 101 and the capacitor-built-in-type printed wiring substrate 110. When the IC chip 101 is found defective, the CSP 810 may be removed from the capacitor-built-in-type printed wiring substrate 110, and then the CSP 810 on which a defect-free IC chip is mounted may be mounted again on the capacitor-built-in-type printed wiring substrate 110. Thus, repairs are easy. When the capacitor 130 is found defective, the CSP 810 may be removed from the capacitor-built-in-type printed wiring substrate and may be then mounted again on a defect-free capacitor-built-in-type printed wiring substrate 110. Thus, repairs are easy.

Also, in the case of the above-described capacitor-built-in-type printed wiring substrate 310 (410) of modified embodiment 2 (modified embodiment 3), an IC-carrying CSP 840 (860) instead of the IC chip 301 (401) may be mounted. The IC-carrying CSP 840 (860) is a CSP 830 (850) which assumes a planar size substantially equal to that of the IC chip 301 (401) and on which the IC chip 301 (401) is mounted (modified embodiment 5 (6)).

The structure and material of a CSP used are not limited to the above-described structure and alumina ceramic, and material for via conductors is not limited to tungsten. The CSP may assume any other known structure and may be made from any other known material, such as glass ceramic or resin.

Embodiment 2

Figure 15:
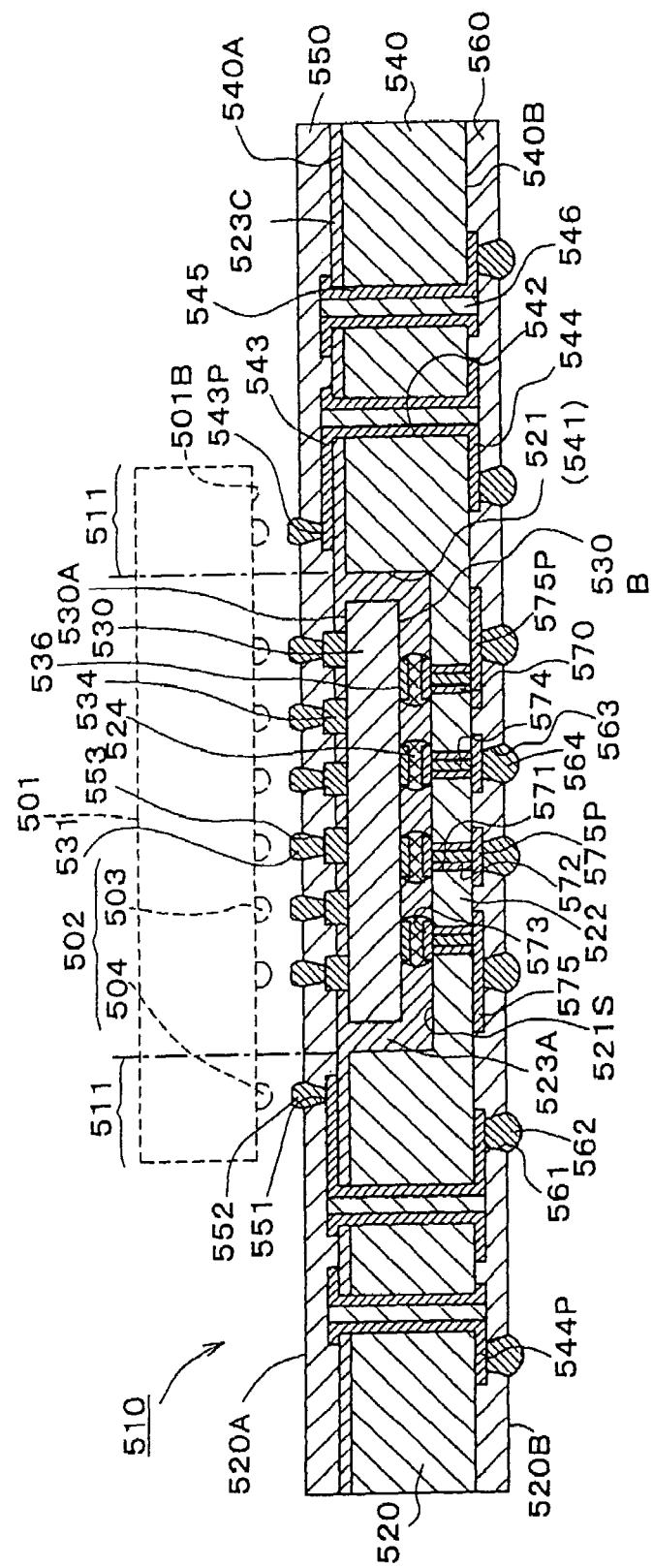
FIG. 15 is a sectional view showing a capacitor-built-in-type printed wiring substrate according to embodiment 2 in which a capacitor having capacitor terminals formed on its upper and lower sides is disposed in and connected to a closed-bottomed capacitor accommodation cavity having through-hole conductors formed in its bottom portion and formed in a printed wiring substrate.

A second embodiment of the present invention will next be described. As shown in FIG. 15, a capacitor-built-in-type printed wiring substrate 510 of the present embodiment differs from embodiment 1 described above in that a lower surface 530B of a capacitor 530 is connected to connection lines formed on the bottom surface of a closed-bottomed capacitor accommodation cavity 521 formed in a printed wiring substrate 520 to thereby permit connection to the capacitor 530 from underneath, in addition to the feature that an upper surface 530A of the capacitor 530 can be directly connected to an IC chip 501. Accordingly, different features will be mainly described, while description of similar features will be omitted or given briefly.

The capacitor-built-in-type printed wiring substrate 510 allows the IC chip 501 represented with a dashed line to be mounted thereon and includes a printed wiring substrate 520 and the capacitor 530. As in the case of embodiment 1, the IC chip 501 includes a number of hemispheric connection terminals 502 formed on a lower surface 501B. The connection terminals 502 are composed of connection-to-capacitor bumps 503 and connection-to-substrate bumps 504.

Figure 16:
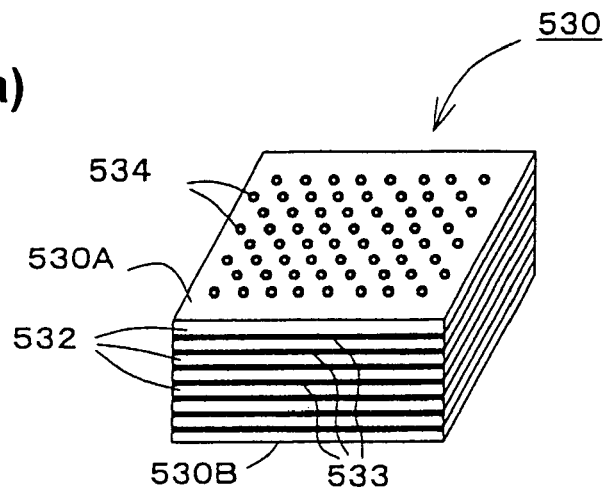
Figure 16:
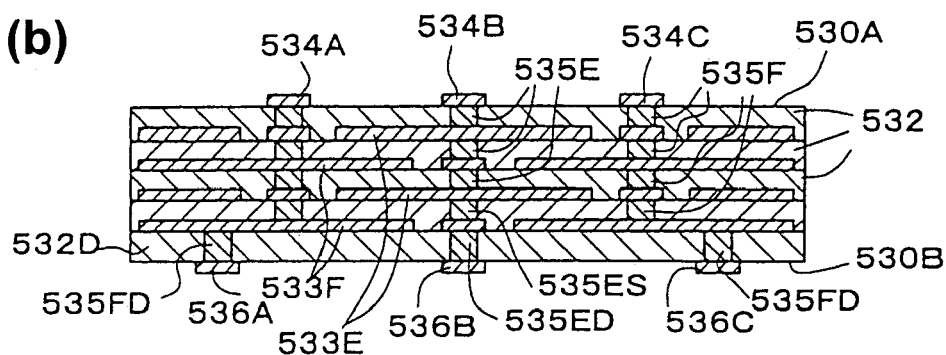
Figure 16:
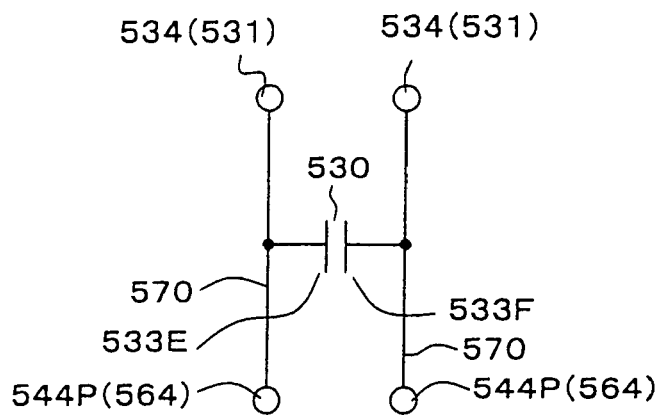

The printed wiring substrate 520 assumes a substantially square shape and includes a closed-bottomed capacitor accommodation cavity (hereinafter may be referred to merely as a depression) 521, which depression 521 is formed substantially at the center of the printed wiring substrate 520 and assumes a square shape as viewed from above. The printed wiring substrate 520 and the capacitor 530 are fixedly attached into a single unit by means of a filling resin 523A. The internal structure of the capacitor 530 is not described here, but will be described later (with reference to FIG. 16).

A number of connection-to-IC bumps 552 are formed on an upper surface (first substrate main-surface) 520A of the printed wiring substrate 520 in positions corresponding to those of the connection-to-substrate bumps 504 of the IC chip 501. The connection-to-IC bumps 552 can be flip-chip-bonded to the corresponding connection-to-substrate bumps 504.

The printed wiring substrate 520 includes a core substrate 540 made of a glass-epoxy-resin composite material, a wiring layer 543 of copper formed on a filling resin layer 523C formed on an upper surface 540A of the core substrate 540, and wiring layers 544 and 575 formed on a lower surface 540B of the core substrate 540. The printed wiring substrate 520 further includes an insulating resin layer 550 which contains epoxy resin as a main component and covers the filling resin layer 523C and the wiring layer 543, and an insulating resin layer 560 which contains epoxy resin as a main component and covers the lower surface 540B and the wiring layers 544 and 575. The wiring layers 543 and 544 are electrically connected by means of a through-hole conductor 545 formed on the inner wall of each core through-hole 542.

The through-hole conductors 545 are filled with a filling resin 546 made of epoxy resin. A closed-bottomed depression 541 which assumes a square shape as viewed from above is formed at the center of the core substrate 540.

As in the case of embodiment 1, openings 551 are formed in a cavity periphery region 511 of the insulating resin layer 550 located around the depression 541, in such a manner as to correspond to the connection-to-substrate bumps 504. A portion of the wiring layer 543 exposed in each of the openings 551 serves as a connection-to-IC substrate pad 543P. The openings 551 are each filled with solder such that the solder assumes a substantially hemispheric shape which is truncated flat and projects beyond the upper surface 520A, thereby forming the connection-to-IC substrate bumps 552. The top portions of the bumps 552 exhibit high coplanarity as in the case of embodiment 1.

As in the case of modified embodiment 1 described above, the insulating resin layer 550 is also formed on the upper surface 530A of the capacitor 530, which will be described later.

As in the case of embodiment 1, openings 561 are formed in grid array in the insulating resin layer 560 to reach the printed wiring substrate 520. A portion of the wiring layer 544 exposed in each of the openings 561 serves as a connection pad 544P for connection to another printed wiring substrate, such as a motherboard. Further, openings 563 are formed in grid array in a central portion of the insulating resin layer 560. A portion of the wiring layer 575 exposed in each of the openings 563 serves as a connection pad 575P. These openings 561 and 563 are each filled with solder such that the solder assumes a substantially hemispheric shape which is truncated flat and projects beyond the lower surface 520B, thereby forming solder bumps 562 and 564.

The insulating resin layers 550 and 560 serve as solder resist layers during formation of the connection-to-IC substrate bumps 552, connection-to-IC capacitor bumps 531, and solder bumps 562, or during connection of the bumps.

In the printed wiring substrate 520, the wiring layer 575, the openings 563, the connection pads 575P exposed through the corresponding openings 563, and the solder bumps 564 are formed at a substantially central portion of the lower surface 520B; i.e., at a bottom portion 522 of the depression 521. Through-holes 571 extend through the bottom portion 522 between a bottom surface 521S of the depression 521 and the lower surface 540B of the core substrate 540. Bottom through-hole conductors 572 are formed on the corresponding inner walls of the through-holes 571. Connection-to-capacitor pads 573 are formed on the bottom surface 521S. That is, connection lines 570 are formed in such a manner as to extend from the solder bumps 564 and connection pads 575P to the bottom surface 521S.

The connection lines 570; specifically, the connection-to-capacitor pads 573 are connected to second-surface capacitor pads 536 of the capacitor 530, which will be described below.

As in the case of embodiment 1, the capacitor 530 shown in FIG. 16(a) includes dielectric layers 532 which contain $BaTiO_3$ as a main component, and electrode layers 533 which contain Pd as a main component. The dielectric layers 532 and the electrode layers 533 are arranged in alternating layers, thereby forming a laminated ceramic capacitor assuming the form of a substantially square plate. As shown in FIG. 16(b), the capacitor 530 includes a number of connection-to-IC capacitor pads 534 (534A, 534B, and 534C in FIG. 16(b)) which are arranged on a capacitor upper-surface (first capacitor main-surface) 530A in positions corresponding to the connection-to-capacitor bumps 503. The connection-to-IC capacitor pads 534 can be flip-chip-bonded to the connection-to-capacitor bumps 504 of the IC chip 501 by means of solder. Specifically, the connection-to-IC capacitor bumps 531 are formed and are then flip-chip-bonded to the connection-to-capacitor bumps 504.

As schematically shown in FIG. 16(b), the electrode layers 533 of the capacitor 530 are divided into a pair of groups 533E and 533F of electrode layers as in the case of embodiment 1. Electrode layers belonging to the groups 533E and 533F are electrically connected every other layer by means of via conductors 535E and 535F. The group 533E of electrode layers and the group 533F of electrode layers are insulated from each other. Thus, two (a pair of) electrode groups 533E and 533F serve as two electrodes of the capacitor 530.

A portion of the connection-to-IC capacitor pads 534 (central pads 534B in FIG. 16(b)) are connected to the electrode group 533E. The remaining portion of the connection-to-IC capacitor pads 534 (left-hand pads 534A and right-hand pads 534C in FIG. 16(b)) are connected to the other electrode group 533F.

This capacitor 530 further includes a number of second-surface pads 536 (536A, 536B, and 536C in FIG. 16(b)) formed on the lower surface (second capacitor main-surface) 530B. A portion of the second-surface capacitor pads 536 (left-hand pads 536A and right-hand pads 536C in FIG. 16(b)) are connected to the electrode group 533F by means of via conductors 535FD formed in a lowermost dielectric layer 532D. The remaining portion of the second-surface capacitor pads 536 (central pads 536B in FIG. 16(b)) are connected to the other electrode group 533E by means of via conductors 535ED formed in the dielectric layer 532D and via conductors 535ES formed in a dielectric layer 532 located on the dielectric layer 532D.

That is, a number of second-surface capacitor pads 536 are also connected to either one of the paired electrode groups 533E and 533F, which serve as two electrodes of the capacitor 530. Also, the paired electrode groups 533E and 533F are each connected to at least one of the plurality of second-surface capacitor pads 536. That is, certain second-surface capacitor pads 536 (for example, 536B) among the second-surface capacitor pads 536 are connected to one electrode group 533E. Other second-surface capacitor pads 536 (for example, 536A) among the second-surface capacitor pads 536 are connected to the other electrode group 533F.

Further, this capacitor 530 is disposed in the depression 521 of the printed wiring substrate 520. The second-surface capacitor pads 536 are connected to the corresponding connection lines 570 formed in the bottom portion 522; specifically, to the corresponding connection-to-capacitor pads 573 by means of Ag—Sn solder 524, thereby being electrically connected to the corresponding connection pads 575P and solder bumps 564.

As shown in a circuit diagram of FIG. 16(c), the capacitor 530 and the connection lines 570 of the printed wiring substrate 520 are connected in the following manner. The connection-to-IC capacitor bumps 531 (and connection-to-IC capacitor pads 534) and the solder bumps 564 (and connection pads 544P) are connected by means of the connection lines 570 and one electrode group 533E or by means of the connection lines 570 and the other electrode group 533F, while the capacitor 530 is inserted therebetween. Accordingly, power potential or ground potential can be supplied at low resistance and low inductance from the solder pumps 564 to the IC chip 501 via the connection lines 570, the electrode groups 533E and 533F of the capacitor 530, and the connection-to-IC capacitor bumps 531. Noise which may be superposed somewhere therebetween can be reliably eliminated by means of the capacitor 530. Also, signals can be input to or output from the IC chip 501 via the printed wiring substrate 520; specifically, via the solder bumps 562, the wiring layer 544, the core through-hole conductors 545, the wiring layer 543, and the connection-to-IC substrate bumps 552.

In this capacitor 530, intervals at which the second-surface capacitor pads 536 are arranged are greater than those at which the connection-to-IC capacitor pads 534 are arranged, so as to cope with the following general tendency. Generally, as shown in FIG. 15, connection terminals formed on another printed wiring substrate and the corresponding solder bumps 564 formed on the lower surface 520B are arranged at intervals greater than those at which the connection-to-IC capacitor pads 534 and the connection-to-capacitor bumps 503 to be directly connected thereto are arranged.

Next, a process for fabricating the capacitor-built-in-type printed wiring substrate 510 will be described.

The capacitor 530 may be formed according to a process substantially similar to that according to which the capacitor 130 of embodiment 1 described above is formed. Therefore, description of a fabrication process with respect to the capacitor 530 is omitted. Notably, the second-surface capacitor terminals 536 of the capacitor 530 may be formed in the following manner. Unfired dielectric layers which each bear unfired via conductors and an unfired electrode layer are laminated under pressure. Subsequently, a pattern which represents the second-surface capacitor terminals 536 is printed on the lower surface of the resultant laminate by use of Pd paste. Then, the thus-prepared laminate undergoes firing.

First, a double-sided copper-clad substrate 547P as shown in FIG. 17(a) is prepared. The double-sided copper-clad substrate 547P includes a core substrate body 547 which is made of a glass-epoxy-resin composite material and will define a bottom portion, and copper foils 547C and 547D laid on upper and lower surfaces 547A and 547B, respectively, of the core substrate body 547. Next, as shown in FIG. 17(b), through-holes 571 are drilled in the double-sided copper-clad substrate 547P in predetermined positions located within a region where a depression 521 is to be formed. Notably, when the diameter of or interval between the through-holes 571 is to be reduced, laser ($CO_2$ or YAG) may be employed for drilling.

Subsequently, by means of a known process for forming a through-hole conductor, the bottom through-hole conductors 572 are formed on the interior walls of the corresponding through-holes 571 (see FIG. 17(c)). Specifically, for example, a cylindrical Cu-plating layer is formed on the interior wall of each through-hole 571 by means of electroless copper plating and copper electroplating. Subsequently, a filling resin 574 which contains Cu powder and can undergo electroplating is filled into the through-holes 571 which is cylindrically electroplated with Cu, followed by curing. Then, the upper surface of the copper foil 547C and the lower surface of the copper foil 547D are polished flat and are then electroplated with Cu so as to cover the upper and lower ends of the filling resin 574 with the corresponding electroplating layers. A resist layer is formed on the upper and lower surfaces, followed by exposure and development so as to expose unnecessary portions of the surfaces. Then, the exposed unnecessary portions of the copper plating layers and copper foils are removed through etching, thereby forming the bottom through-hole conductors 572 within the corresponding through-holes 571; the connection-to-capacitor pads 573 on the upper surface 547A; and the wiring layer 575, which is electrically connected to the bottom through-hole conductors 572, on the lower surface 540B of the core substrate 540. The wiring layer 575 includes those which are formed immediately below and in the vicinity of the corresponding through-holes 571 in the form of a pad.

Through forming of the connection-to-capacitor pads 573 on the corresponding through-holes 571 filled with the filling resin 574, the bottom through-hole conductors 572 can be arranged at high density. In addition to the connection-to-capacitor pads 573, a wiring layer which is electrically connected to the bottom through-hole conductors 572 may be formed on the upper surface 547A.

Figure 17:
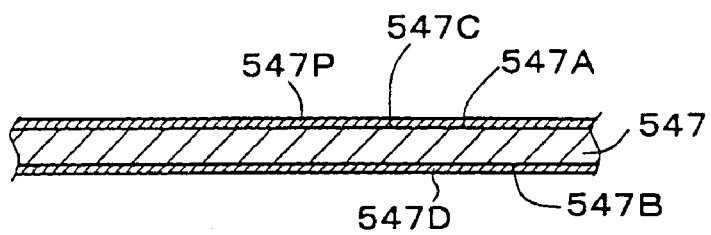
FIGS. 17(a) to 17(f) are views for explaining a process for forming the through-hole conductors in the bottom portion of the capacitor accommodation cavity, in fabrication of the capacitor-built-in-type printed wiring substrate according to embodiment 2.
Figure 17:
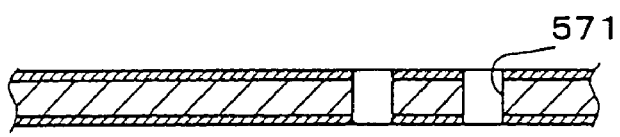
Figure 17:
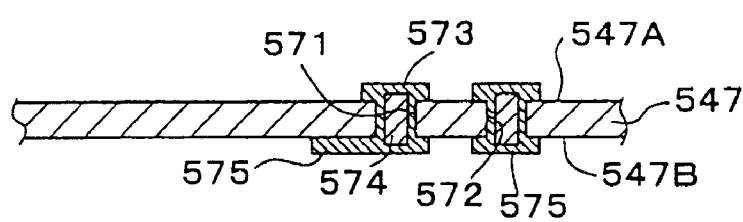
Figure 17:
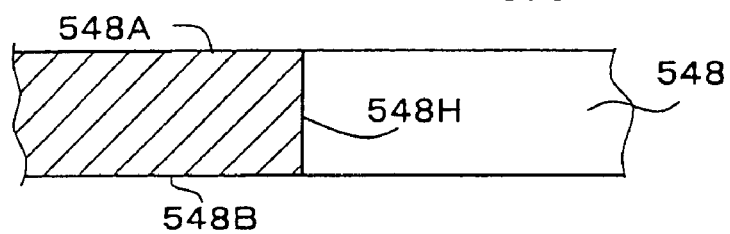
Figure 17:
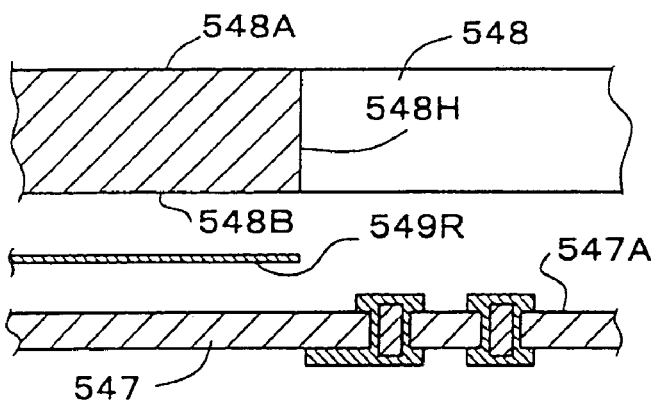
Figure 17:
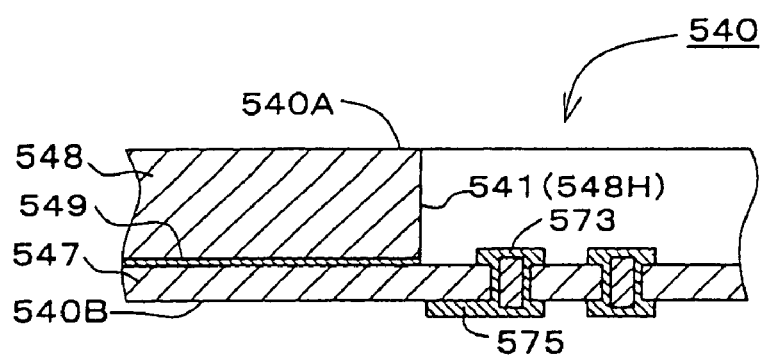

As shown in FIG. 17(*d*), there is prepared a core substrate body 548 which is made of a glass-epoxy-resin composite material, which is thicker than the core substrate body 547 adapted to define a bottom portion, and which is adapted to define a wall portion. A through-hole 548H adapted to define a depression is formed beforehand in the core substrate body 548 in a position corresponding to the depression 521.

Next, as shown in FIG. 17(*e*), the core substrate body 548 is superposed on the core substrate body 547 while an adhesive sheet 549 is sandwiched between the upper surface 547A of the core substrate body 547 and a lower surface 548B of the core substrate body 548. The adhesive sheet 549R is made of tack dry epoxy resin and assumes the form of a substantially square frame corresponding to the through-hole 548H. The resultant laminate is heated while being pressed. Thus, the core substrate bodies 547 and 548 are bonded together while a boding layer 549R is formed therebetween, thereby forming the core substrate 540 having the depression 541 formed therein as shown in FIG. 17(*f*).

Figure 18:
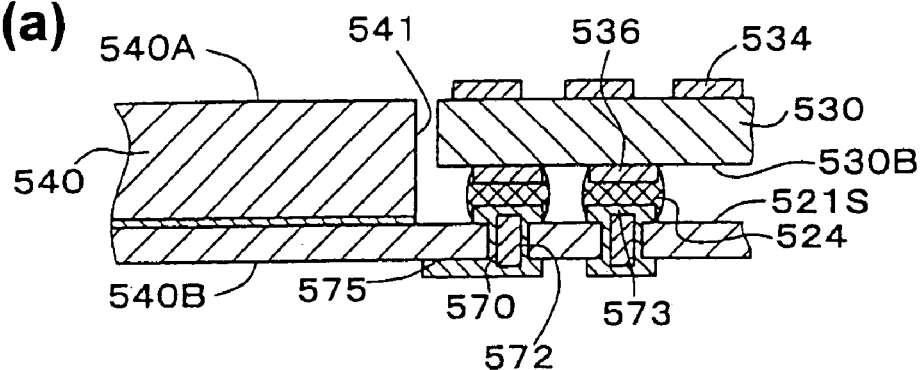
FIGS. 18(a) to 18(c) are views for explaining a process for fixedly disposing the capacitor in the capacitor accommodation cavity, in fabrication of the capacitor-built-in-type printed wiring substrate according to embodiment 2.
Figure 18:
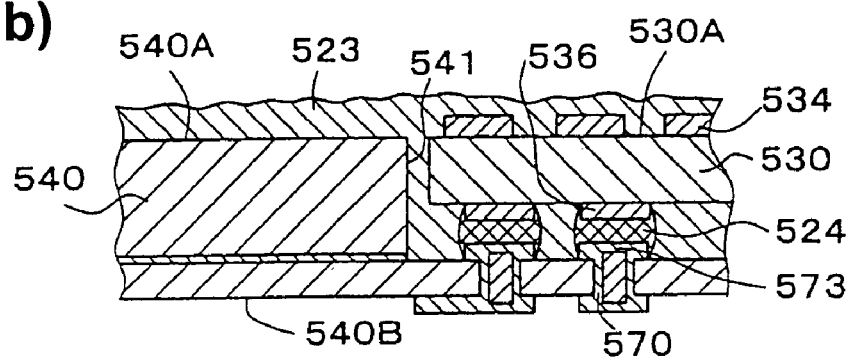
Figure 18:
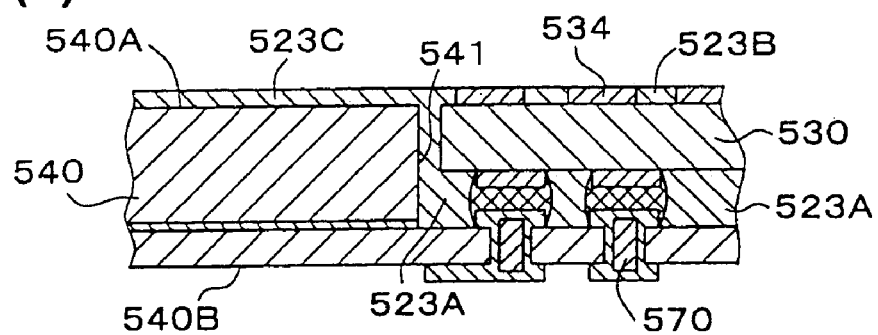

Next will be described the step of disposing the capacitor 530 in the depression 541 formed in the core substrate 540 so as to form the capacitor-built-in-type printed wiring substrate 510. First, as shown in FIG. 18(*a*), the above-described capacitor 530 is disposed in the depression 541 formed in the core substrate 540 such that the lower surface 530B of the capacitor 530 faces down. The second-surface capacitor pads 536 are connected to the corresponding connection lines 570; specifically, to the connection-to-capacitor pads 573 through soldering by use of the solder 524 of Ag—Sn. Specifically, solder paste is printed beforehand on the second-surface capacitor pads 536. After being mated to the corresponding bottom through-hole conductors 573, the printed solder paste is melted through passage through a reflow furnace, thereby effecting soldering.

After cleaning off flux from the depression 541, as shown in FIG. 18(*b*), the filling resin 523 which contains epoxy resin as a main component is injected into the depression 541 and applied to the upper surface 540A of the core substrate 540 and to the upper surface 530A of the capacitor 530, followed by curing. Thus, the capacitor 530 is fixed within the depression 541 by means of the filling resin 523 (523A) while being connected to the connection lines 570. As a result of fixing the capacitor 530 to the core substrate 540 (printed wiring substrate 520) in such a manner, even when heat or vibration is applied to the assembly, rupture which might otherwise arise at the connection between the second-surface capacitor pad 536 and the bottom through-hole conductor 573 can be prevented.

Further, as shown in FIG. 18(*c*), the filling resin 523 lying on the upper surface 540A of the core substrate 540 and on the upper surface 530A of the capacitor 530 is polished flat, thereby forming a filling resin layer 523B on the upper surface 530A and the filling resin layer 523C on the upper surface 540A. Also, the connection-to-IC capacitor pads 534 are exposed substantially flush with the filling resin layers 523B and 523C. This procedure absorbs a level difference which arises as a result of disposing the capacitor 530 in the depression 541 formed in the core substrate 540, thereby preventing an adverse effect of the level difference on coplanarity among the connection-to-IC substrate pads 543P and the connection-to-IC capacitor pads 534, which will be formed in later steps.

Figure 19:
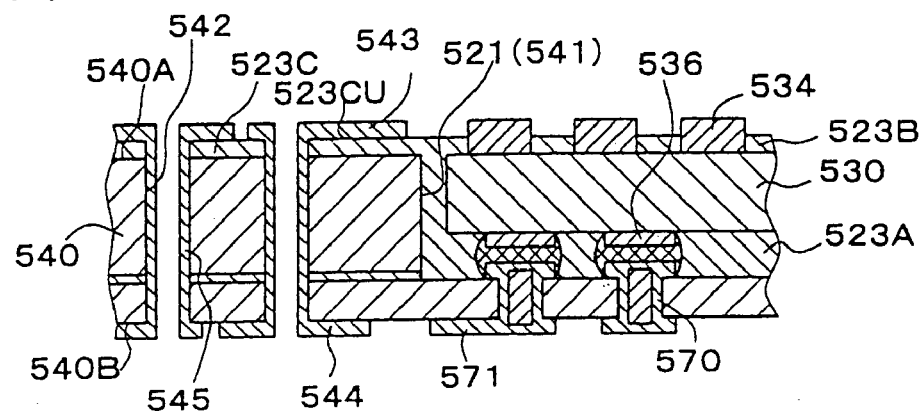
FIGS. 19(a) and 19(b) are views for explaining a process for forming through-hole conductors in the printed wiring substrate and forming an insulating resin layer on the printed wiring substrate and on the capacitor, in fabrication of the capacitor-built-in-type printed wiring substrate according to embodiment 2.
Figure 19:
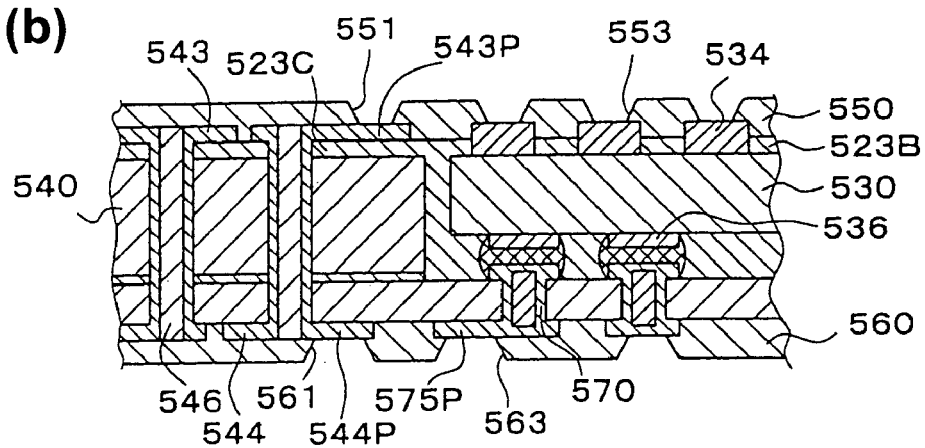

Further, as shown in FIG. 19(*a*), the core through-holes 542 are drilled around the depression 541 in such a manner as to extend between the filling resin layer 523C and the lower surface 540B of the core substrate 540.

Next, according to a known process, a through-hole conductor 545 of Cu is formed on the interior wall of and around each core through-hole 542. A wiring layer 543 (544) extending from the core through-hole conductors 545 is formed on the upper surface 523CU of the filling resin layer 523C (on the lower surface 540B of the core substrate 540). The connection-to-IC capacitor pads 534 which have been polished flush with the filling resin layer 523B are plated with Cu so as to increase thickness thereof, thereby projecting upward beyond the filling resin layer 523B.

Further, as shown in FIG. 19(*b*), the through-hole conductors 545 are filled with the filling resin 546. By means of a known process for forming an insulating resin layer, the insulating resin layer 550 of epoxy resin is formed on the filling resin layers 523B and 523C, the wiring layer 543, and the connection-to-IC capacitor pads 534. The openings 551 and 553 are formed in the insulating resin layer 550 in predetermined positions such that the connection-to-IC substrate pads 543P are exposed through the corresponding openings 551 and such that the connection-to-IC capacitor pads 534 are exposed through the corresponding openings 553. Similarly, the insulating resin layer 560 is formed on the lower surface 540B of the core substrate 540 and the wiring layers 544 and 575. The openings 561 and 563 are formed in the insulating resin layer 560 in predetermined positions such that the connection pads 544P are exposed through the corresponding openings 561 and such that the connection pads 575P are exposed through the corresponding openings 563.

In the present embodiment, assuming a substantially cylindrical shape, the core through-hole conductor 545 is formed on the interior wall of and around each core through-hole 542. However, as in the case of the above-mentioned bottom through-hole conductor 572, the core through-holes 542 may be filled with a filling resin which can undergo electroplating. Then, the upper and lower ends of the core through-hole conductors 545 may be covered with a plating layer. Through employment of this process, the connection-to-IC substrate pads 543P can be formed immediately above the corresponding core through-holes 542, and the connection pads 544P can be formed immediately below the corresponding core through-holes 542.

Subsequently, solder paste is applied into the openings 551, 553, 561, and 563. The applied solder is caused to melt so as to form the connection-to-IC capacitor bumps 531, the connection-to-IC substrate bumps 552, and the solder bumps 562 and 564, thereby completing the capacitor-built-in-type printed wiring substrate 510 shown in FIG. 15. Notably, as in the case of embodiment 1 described above, by use of the jig JG, top portions of the connection-to-IC capacitor bumps 531 and those of the connection-to-IC substrate bumps 552 may be finished flat.

In the thus-formed capacitor-built-in-type printed wiring substrate 510, the insulating resin layers 550 and 560 serve as solder resist layers during formation of the connection-to-IC capacitor pads 534 and during connection of the connection-to-IC capacitor pads 534 to the IC chip 501.

Further, as shown in FIG. 18(c), the filling resin 523 applied onto the upper surface 540A of the core substrate 540 and onto the upper surface 530A of the capacitor 530 is polished flat, thereby eliminating the influence of a dimensional error of the capacitor 530, a dimensional error of the depression 541, and deformation, such as warpage, of the core substrate 540. The wiring layer 543 is thus prevented from suffering breaking of line or short circuit. Also, the coplanarity of the connection-to-IC substrate pads 543P and that of the connection-to-IC capacitor pads 534 can be improved.

Modified Embodiment 7

Figure 20:
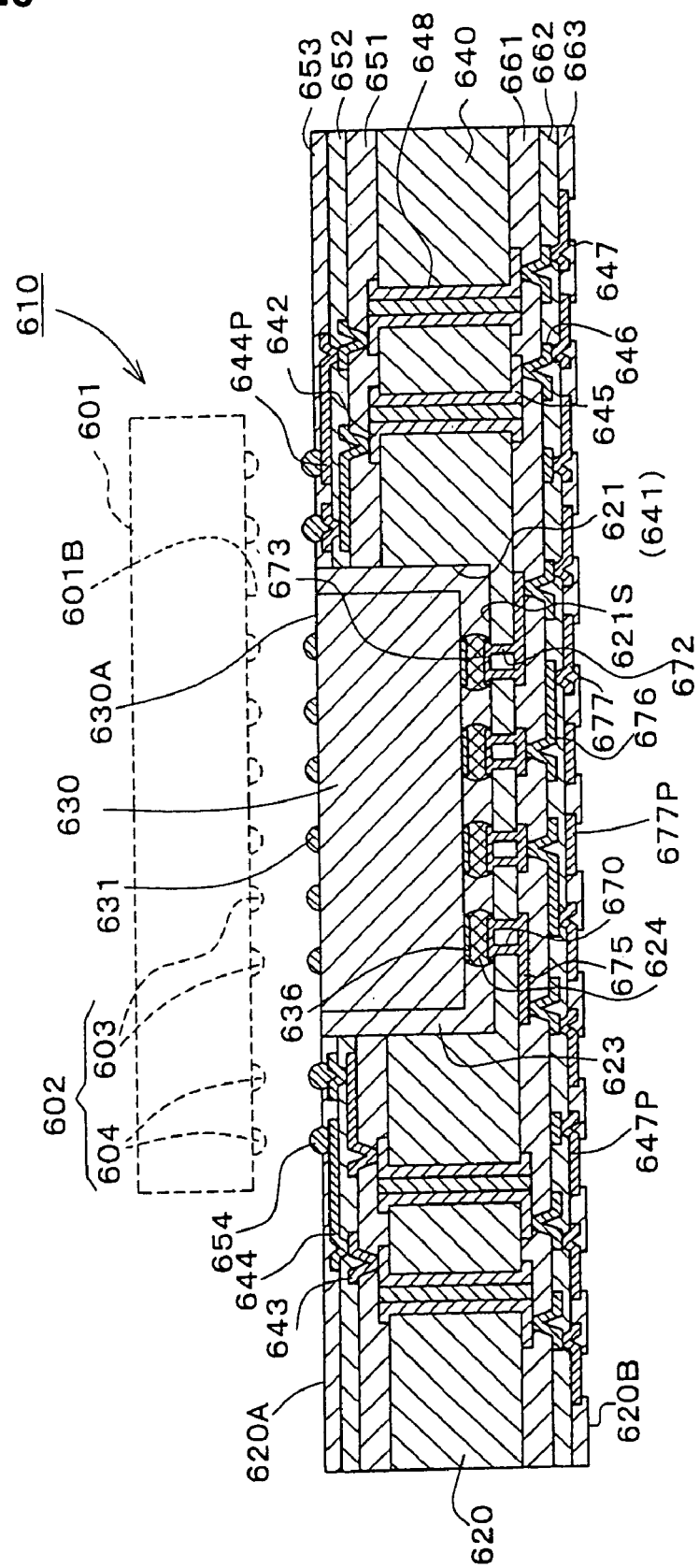
FIG. 20 is a sectional view showing a capacitor-built-in-type printed wiring substrate according to modified embodiment 7 in which a capacitor having capacitor terminals formed on its upper and lower sides is disposed in and connected to a closed-bottomed capacitor accommodation cavity having through-hole conductors formed in its bottom portion and formed in a printed wiring substrate having a number of insulating resin layers formed thereon.

Embodiment 2 is described above while mentioning the printed wiring substrate 540 in which a single insulating resin layer 550 is formed on the upper surface of the core substrate 540, and a single insulating resin layer 560 is formed on the lower surface of the core substrate 540. However, as in the case of modified embodiment 2, a plurality of insulating resin layers may be formed. For example, as shown in FIG. 20, three insulating resin layers 651, 652, and 653 (661, 662, and 663) may be formed on the upper (lower) surface, thereby forming a printed wiring substrate 620 in which a closed-bottomed capacitor accommodation cavity 621 is formed.

The printed wiring substrate 620 includes connection-to-IC substrate bumps 654 formed on its upper surface (first substrate main-surface) 620A, and connection pads 647P formed on its lower surface (second substrate main-surface) 620B. In the printed wiring substrate 620, through-hole conductors 648 are formed in such a manner as to extend through the core substrate 640, and wiring layers 642, 643, 644, 645, 646, and 647 are formed in such a manner as to extend through corresponding insulating resin layers or in such a manner as to be disposed between insulating resin layers, thereby connecting the connection-to-IC substrate bumps 654 and the connection pads 647P.

As in the case of embodiment 2, bottom through-hole conductors 672, connection-to-capacitor pads 673, and a wiring layer 675 are formed at a bottom portion of a depression 641 formed in the core substrate 640. The wiring layer 675 is lead out to the lower surface 620B by means of wiring layers 676 and 677 to thereby be connected to connection pads 677P. That is, there are formed connection lines 670 extending from the connection pads 677P to a bottom surface 621S of the capacitor accommodation cavity 621.

A capacitor 630 disposed in the capacitor accommodation cavity 621 has a dimension which matches the depth of the capacitor accommodation cavity 621. A number of connection-to-IC capacitor bumps 631 are formed on an upper surface 630A of the capacitor 630. Also, as in the case of embodiment 2, second-surface capacitor pads 636 are formed on a lower surface 630B of the capacitor 630.

The connection-to-IC capacitor bumps 631 of the capacitor 630 and the connection-to-IC substrate bumps 654 of the printed wiring substrate 620 can be connected to corresponding connection terminals 602; specifically, connection-to-capacitor bumps 603 and connection-to-substrate bumps 604 formed on a lower surface 601B of an IC chip 601 represented with a dashed line.

The connection lines 670 formed in the wiring substrate 620; specifically, the connection-to-capacitor pads 673 are connected to the second-surface capacitor pads 636 by means of a solder 624 of Ag—Sn, thereby connecting the connection pads 677P and the capacitor 630 via the connection lines 670 and the solder 624.

The printed wiring substrate 620 and the capacitor 630 are fixed together by means of a filling resin 623.

As described above, even when a number of insulating resin layers (in FIG. 20, three layers on the upper side and three layers on the lower side) are formed, power potential or ground potential can be supplied to the IC chip 601 from the connection pads 677 via the connection lines 670 and the solder 624 and through the capacitor 630. Thus, the present embodiment yields effects similar to those yielded by embodiment 2; for example, potentially superposed noise can be reliably eliminated by means of the capacitor 630.

Embodiment 3

Next, a third embodiment of the present invention will be described. A capacitor-built-in-type printed wiring substrate 710 of the present embodiment shown in FIG. 21 differs from those of embodiments 1 and 2 described above in that a capacitor accommodation cavity 721 formed in a printed wiring substrate 720 assumes the form of a through-hole, so that an upper surface 730A of a capacitor 730 can be directly connected to an IC chip 701 while a lower surface 730B can be directly connected to another printed wiring substrate. Accordingly, different features will be mainly described, while description of similar features will be omitted or given briefly.

The capacitor-built-in-type printed wiring substrate 710 allows the IC chip 701 represented with a dashed line to be mounted thereon and includes a printed wiring substrate 720 and the capacitor 730. As in the case of embodiments 1 and 2, the IC chip 701 includes a number of hemispheric connection terminals 702 formed on a lower surface 701B. The connection terminals 702 are composed of connection-to-capacitor bumps 703 and connection-to-substrate bumps 704.

The printed wiring substrate 720 assumes a substantially square shape and includes a capacitor accommodation cavity 721 which assumes the form of a through-hole having a square shape as viewed from above and is formed substantially at the center of the printed wiring substrate 720 (the capacitor accommodation cavity 721 may be referred to merely as a through-cavity). The printed wiring substrate 720 and the capacitor 730 are fixedly attached into a single unit by means of a filling resin 723A. The internal structure of the capacitor 730 is not described here, but will be described later (with reference to FIG. 22).

A number of connection-to-IC pads 743P are formed on an upper surface (first substrate main-surface) 720A of the printed wiring substrate 720 in positions corresponding to those of the connection-to-substrate bumps 704 of the IC chip 701. The connection-to-IC pads 743P can be flip-chip-bonded to the corresponding connection-to-substrate bumps 704.

The printed wiring substrate 720 includes a core substrate body 740 made of a glass-epoxy-resin composite material, a wiring layer 743 of copper formed on a filling resin layer 723C formed on an upper surface 740A of the core substrate body 740, and a wiring layer 744 of copper formed on a filling resin layer 723E (located in a lower position of FIG. 21) formed on a lower surface 740B of the core substrate body 740. The printed wiring substrate 720 further includes an insulating resin layer 750 which contains epoxy resin as a main component and covers the filling resin layer 723C and the wiring layer 743, and an insulating resin layer 760 which contains epoxy resin as a main component and covers the filling resin layer 723E and the wiring layer 744. The wiring layers 743 and 744 are electrically connected by means of a through-hole conductor 745 formed on the inner wall of each core through-hole 742. The through-hole conductors 745 are filled with a filling resin 746 made of epoxy resin.

A through-hole 741 which assumes a square shape as viewed from above is formed at the center of the core substrate 740. A capacitor rest portion (hereinafter may be referred to merely as a rest portion) 747T is formed along the through-hole 741 and at an end portion of the upper surface 740A of the core substrate 740 in such a manner as to project radially (planar direction or horizontal direction in FIG. 21) inward in the through-hole 741, thus assuming the form of a substantially square frame.

As in the case of embodiments 1 and 2, openings 751 are formed in a cavity periphery region 711 of the insulating resin layer 750 located around the through-hole 741, or the through-cavity 721, in such a manner as to correspond to the connection-to-substrate bumps 704. A portion of the wiring layer 743 exposed in each of the openings 751 serves as a connection-to-IC substrate pad 743P.

As in the case of embodiment 2 described above, the insulating resin layer 750 is also formed on the upper surface 730A of the capacitor 730, which will be described later.

Openings 761 are formed in grid array in a portion of the insulating resin layer 760 corresponding to a peripheral portion of the printed wiring substrate 720. A portion of the wiring layer 744 exposed in each of the openings 761 serves as a connection pad 744P for connection to another printed wiring substrate, such as a motherboard.

The insulating resin layers 750 and 760 serve as solder resist layers during connection of the printed wiring substrate 720 and the IC chip 701.

The capacitor 730 assumes a structure similar to that described above in the section of embodiment 2. Specifically, dielectric layers and electrode layers are arranged in alternating layers, and the electrode layers are connected every other layer by means of vias. However, as shown in FIG. 22(a), the capacitor 730 assumes an external shape which slightly differs from that of embodiment 2. Specifically, the level of a peripheral region of the upper surface 730A of the capacitor 730 is rendered lower than that of the central square region by means of a shoulder portion 730P, thereby forming an abutment surface 730C adapted to abut the capacitor rest portion 747T of the core substrate 740, which will be described later. That is, the upper surface 730A of the capacitor 730 has a convex shape.

A number of connection-to-IC capacitor pads 734 are formed on the upper surface (first capacitor main-surface) of the capacitor 730. A number of second-surface capacitor pads 736 are formed on the lower surface (second capacitor main-surface) 730B.

The capacitor 730 is disposed in the through-cavity 721 formed in the printed wiring substrate 720 such that the shoulder portion 730P is fitted inside a radially inward surface 747H of the rest portion 747T and such that the abutment surface 730C abuts an abutment surface 474C (lower surface in FIG. 21) of the rest portion 747T. Thus, the position of the capacitor 730 is restricted in the depth direction (vertical direction in FIG. 21) of the through-cavity 721. Further, since the shoulder portion 730P of the capacitor 730 is fitted to the radially inward surface 747H, the position is also restricted in the radial direction (planar direction or horizontal direction in FIG. 21).

The insulating resin layer 750 is formed on the upper surface 730A of the capacitor 730, while the insulating resin layer 760 is formed on the lower surface 730B of the capacitor 730. Openings 752 are formed in the insulating resin layer 750 such that the connection-to-IC capacitor pads 734 are exposed therethrough. Openings 762 are formed in the insulating resin layer 760 such that the second-surface capacitor pads 736 are exposed therethrough.

As shown in a circuit diagram of FIG. 22(b), the connection-to-IC capacitor pads 734 and the second-surface capacitor pads 736 are connected by means of one electrode group 733E or the other electrode group 733F, while the capacitor 730 is inserted therebetween. Accordingly, another printed wiring substrate connected to the second-surface capacitor pads 736 is connected at low resistance and low inductance to the IC chip 701 connected to the connection-to-IC capacitor pads 734, thereby enabling supply of power potential or ground potential to the IC chip 701. Also, signals can be input to or output from the IC chip 701 via the printed wiring substrate 720; specifically, via the connection pads 744P, the wiring layer 744, the core through-hole conductors 745, the wiring layer 743, and the connection-to-IC substrate pads 743P.

Next, a process for fabricating the capacitor-built-in-type printed wiring substrate 710 will be described.

A process for fabricating the capacitor 730 is similar to that of embodiments 1 and 2 and is therefore omitted. The shoulder portion 730P is formed in the following manner. An unfired dielectric layer of a size smaller than that of other unfired dielectric layer is superposed on the side of the other unfired dielectric layer on which the upper surface 730A of the capacitor 730 is to be defined.

Figure 23:
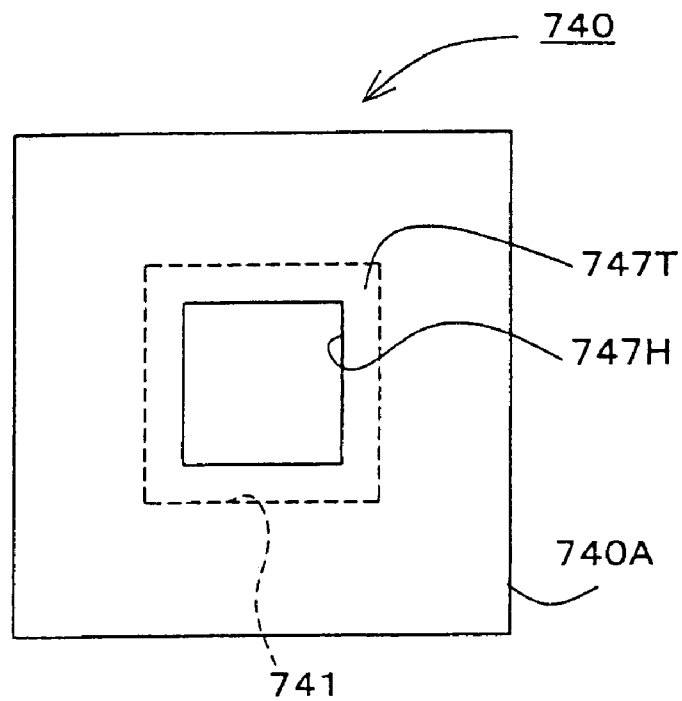
Figure 23:
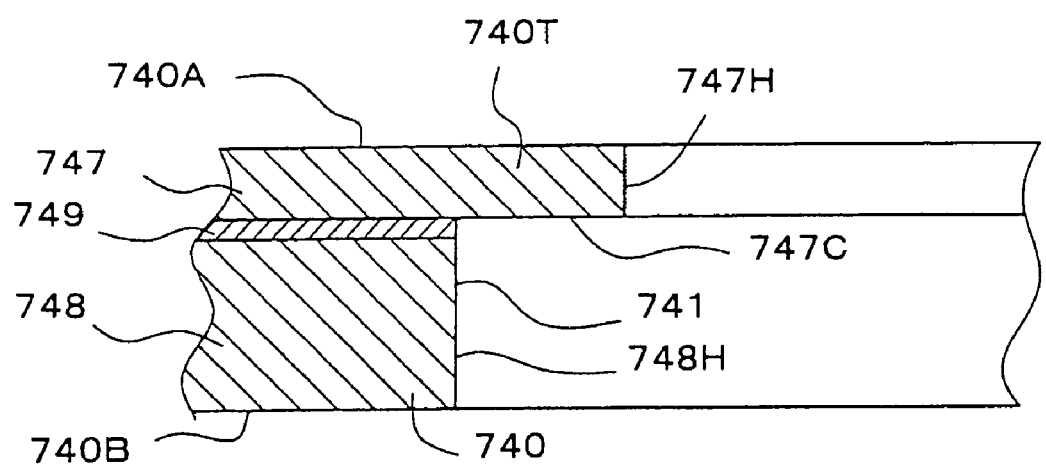

First, the core substrate 740 is formed (see FIG. 23). As shown in FIG. 23(a), the core substrate 740 assumes a substantially square shape as viewed from above and has the square through-hole 741 formed at the center thereof. An end portion of the wall of the through-hole 741 which is located on the side of the upper surface 740A projects radially inward to thereby form the rest portion 747T which assumes the form of a substantially square frame. The lower surface of the protrusion 747T serves as the abutment surface 747C to abut the capacitor 730. The inner wall surface of the protrusion 747T serves as the square, radially inward surface 747H. As will be understood easily from embodiments 1 and 2, the core substrate 740 is formed by the step of affixing together a first core substrate body 747 in which the substantially square through-hole 747H is formed, and a second core substrate body 748 in which a substantially square through-hole 748H greater than the through-hole 747 is formed, by means of a adhesive layer 749.

Next, the capacitor 730 is disposed in the depression 741. Specifically, as shown in FIG. 24(a), the shoulder portion 730P around the upper surface 730A of the capacitor 730 is fitted inside the radially inward surface 747H, and the abutment surface 730C of the capacitor 730 is caused to abut the abutment surface 747C of the rest portion 747T, thereby restricting the position of the capacitor 730.

The dimensional relationship between the core substrate 740 and the capacitor 730 is determined such that, when the core substrate 740 and the capacitor 730 are assembled together, the connection-to-IC capacitor terminals 734 project upward beyond the upper surface 740A of the core substrate 740, and the second-surface capacitor pads 736 project downward beyond the lower surface 740B of the core substrate 740.

Figure 24:
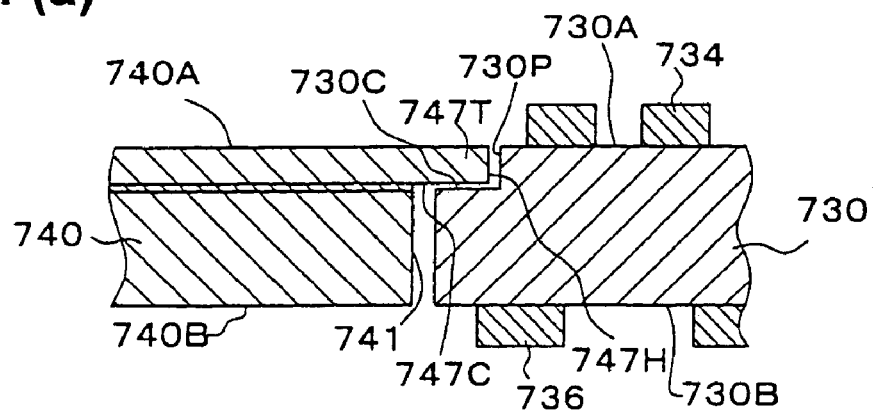
FIGS. 24(a) to 24(c) are views for explaining a process for fixedly disposing the capacitor in the through capacitor accommodation cavity, in fabrication of the capacitor-built-in-type printed wiring substrate according to embodiment 3.
Figure 24:
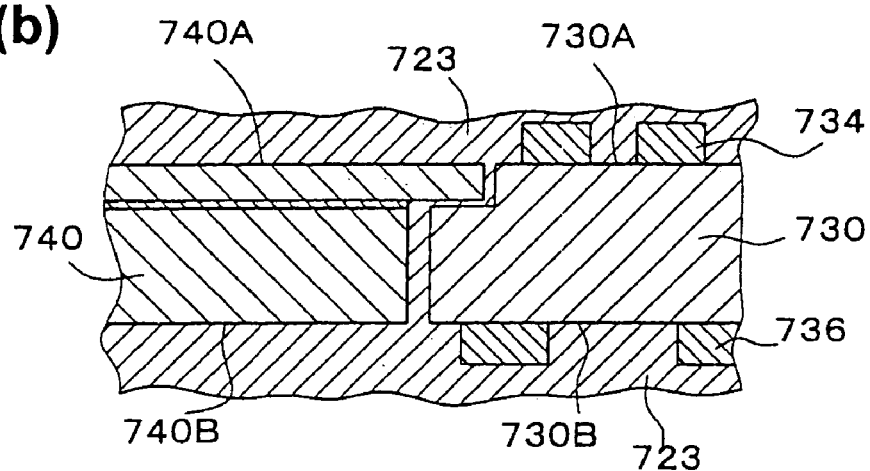
Figure 24:
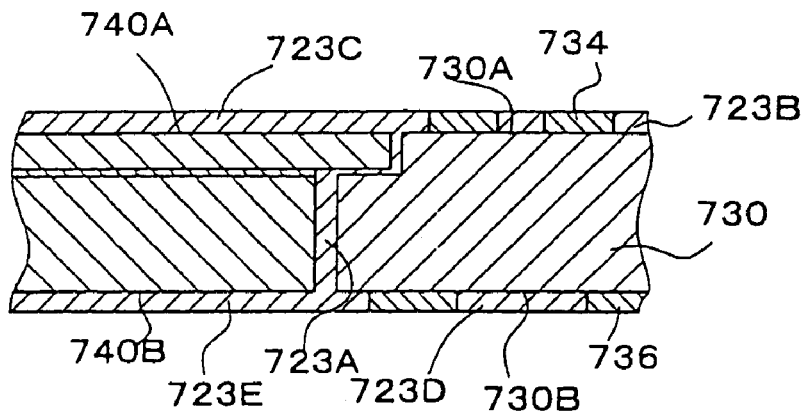

Subsequently, as shown in FIG. 24(b), a filling resin 723 is applied into a gap between the capacitor 730 and the through-hole 741, onto the upper surface 730A of the capacitor 730, the upper surface 740A of the core substrate 740, and onto the lower surface 730B of the capacitor 730 and the core substrate 740B (located in a lower position of FIG. 24), followed by curing. Thus, the capacitor 730 and the core substrate 740 (printed wiring substrate 720) are fixed together.

Further, as shown in FIG. 24(c), the filling resin 723 lying on the upper surface 740A of the core substrate 740 and on the upper surface 730A of the capacitor 730 is polished flat, thereby forming a filling resin layer 723B on the upper surface 730A and the filling resin layer 723C on the upper surface 740A. Also, the connection-to-IC capacitor pads 734 are exposed substantially flush with the filling resin layers 723B and 723C. Further, the filling resin 723 lying on the lower surface 740B of the core substrate 740 and on the lower surface 730B (located in a lower position of FIG. 24) of the capacitor 730 is polished flat, thereby forming a filling resin layer 723D on the lower surface 730B and the filling resin layer 723E on the lower surface 740B. Also, the second-surface capacitor pads 736 are exposed substantially flush with the filling resin layers 723D and 723E.

This procedure absorbs a level difference which arises as a result of disposing the capacitor 730 in the through-hole 741 formed in the core substrate 740, thereby preventing an adverse effect of the level difference on coplanarity among the connection-to-IC substrate pads 743P and the connection-to-IC capacitor pads 734, which will be formed in later steps. Similarly, there is prevented an adverse effect of the level difference on coplanarity among the connection pads 744 and the second-surface capacitor pads 737, which will be formed in later steps.

Figure 25:
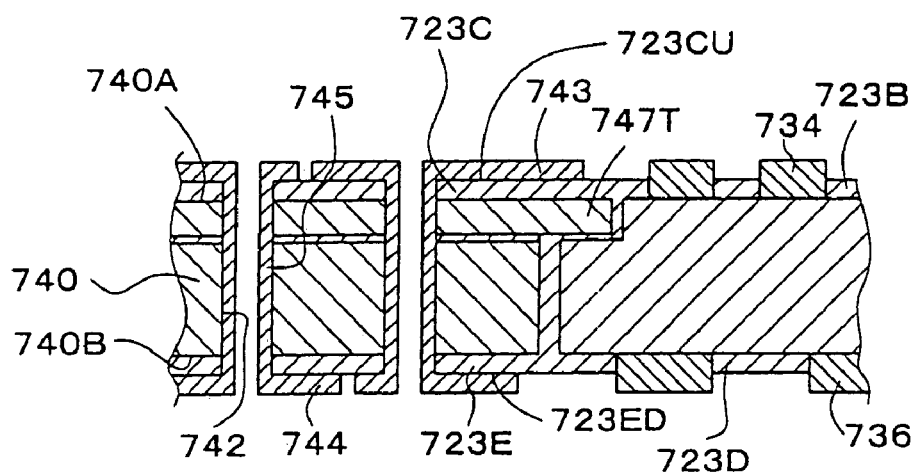
FIGS. 25(a) and 25(b) are views for explaining a process for forming through-hole conductors in the printed wiring substrate and forming an insulating resin layer on the printed wiring substrate and on the capacitor, in fabrication of the capacitor-built-in-type printed wiring substrate according to embodiment 3.
Figure 25:
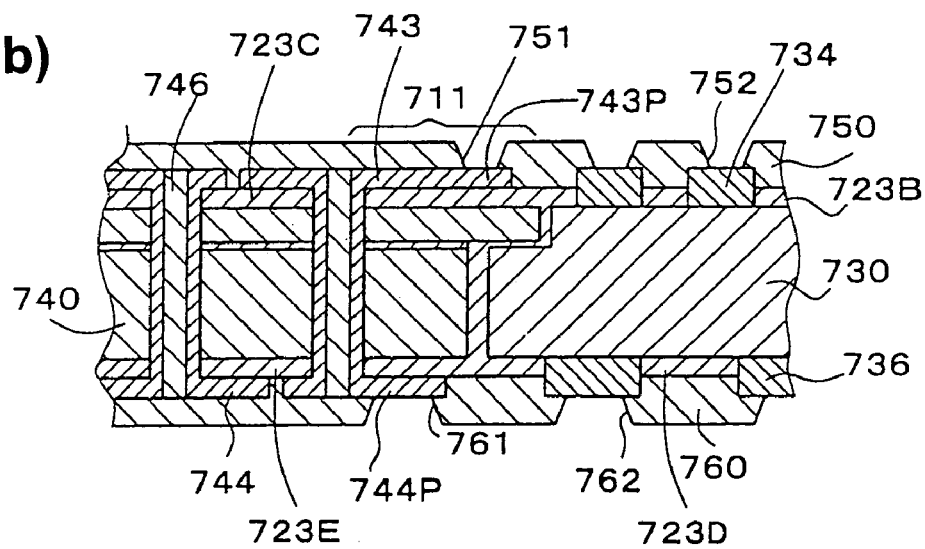

Further, as shown in FIG. 25(a), the core through-holes 742 are formed around the through-hole 741 in such a manner as to extend between the filling resin layer 723C and the filling resin layer 723E.

Next, according to a known process, a through-hole conductor 745 of Cu is formed on the interior wall of and around each core through-hole 742. A wiring layer 743 (744) extending from the core through-hole conductors 745 is formed on the upper surface 723CU of the filling resin layer 723C (on the lower surface 723ED of the filling resin layer 723E). The wiring layer 743 can be extended to a position which is located above the protrusion 747T in FIG. 25. Also, the connection-to-IC capacitor pads 734 which have been polished flush with the filling resin layer 723B are plated with Cu so as to increase thickness thereof, thereby projecting upward beyond the filling resin layer 723B. Similarly, the second-surface capacitor pads 736 which have been polished flush with the filling resin layer 723D are plated with Cu so as to increase thickness thereof, thereby projecting downward beyond the filling resin layer 723D.

Figure 21:
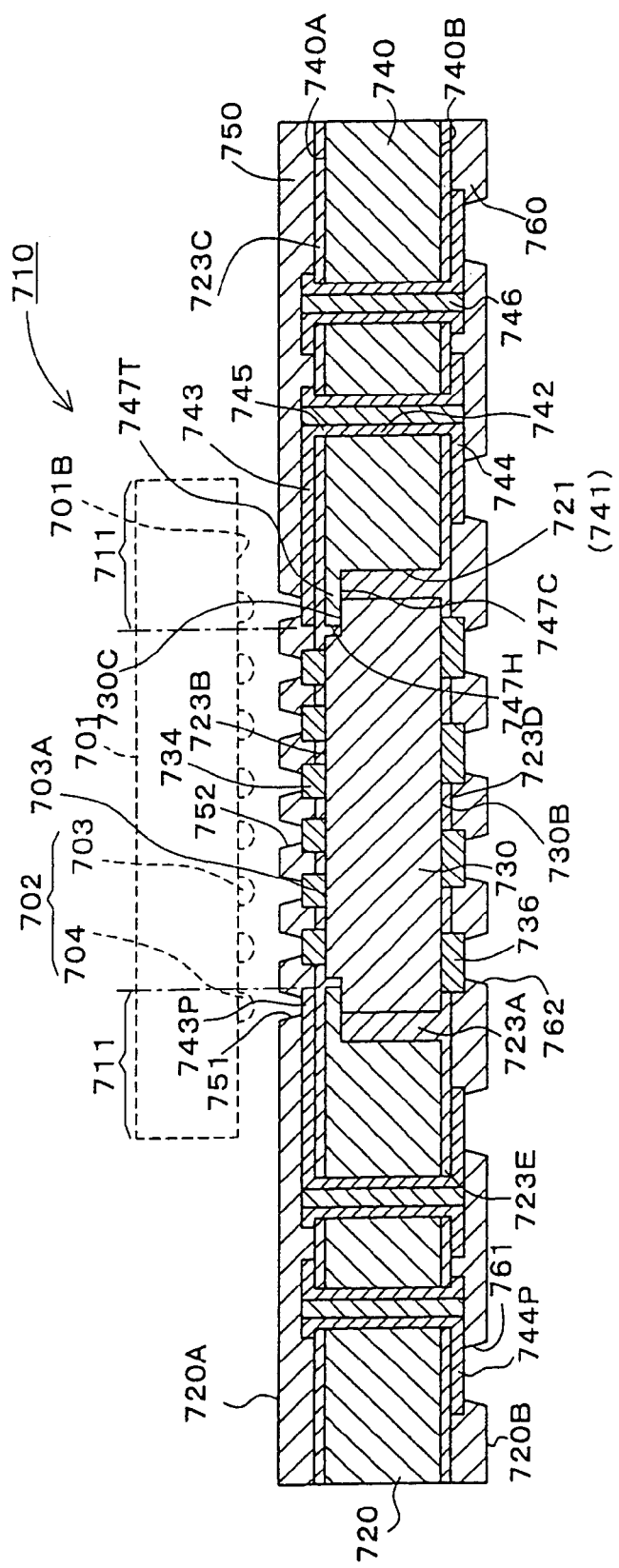
FIG. 21 is a sectional view showing a capacitor-built-in-type printed wiring substrate according to embodiment 3 in which a capacitor having capacitor terminals formed on its upper and lower sides is disposed in a through capacitor accommodation cavity formed in a printed wiring substrate.

Further, as shown in FIG. 25(b), the through-hole conductors 745 are filled with the filling resin 746. By means of a known process for forming an insulating resin layer, the insulating resin layer 750 of epoxy resin is formed on the filling resin layers 723B and 723C, the wiring layer 743, and the connection-to-IC capacitor pads 734. The openings 751 and 752 are formed in the insulating resin layer 750 in predetermined positions of the cavity periphery region 711 such that the connection-to-IC substrate pads 743P are exposed through the corresponding openings 751 and such that the connection-to-IC capacitor pads 734 are exposed through the corresponding openings 752. Similarly, the insulating resin layer 760 is formed on the filling resin layers 723D and 723E, the wiring layer 744, and the second-surface capacitor pads 736. The openings 761 and 762 are formed in the insulating resin layer 760 in predetermined positions such that the connection pads 744P are exposed through the corresponding openings 761 and such that the second-surface capacitor pads 736 are exposed through the corresponding openings 762. Thus, the capacitor-built-in-type printed wiring substrate 710 shown in FIG. 21 is completed.

Embodiment 4

Next, a fourth embodiment of the present invention will be described. A capacitor-built-in-type printed wiring substrate of the present embodiment shown in FIG. 26 serves as a capacitor-built-in-type interposer 910, which does not directly carry an IC chip or IC-carrying CSP, but carries an ordinary IC-carrying substrate 990 on which an IC chip 980 is mounted. Generally, an interposer is interposed between, for example, a motherboard and an IC-carrying substrate for the purpose of easing thermal stress which arises from a difference in coefficient of thermal expansion therebetween or converting a terminal form of LGA or BGA to the form of PGA so as to become connectable to a motherboard or socket through insertion.

The IC-carrying substrate 990 is mounted on the capacitor-built-in-type interposer 910 to thereby form a capacitor-built-in-type interposer 900 on which an IC-carrying substrate is mounted.

The IC-carrying substrate 990 includes a printed wiring substrate 970 and the IC chip 980. Flip-chip terminals 971 formed on an upper surface 970A of the printed wiring substrate 970 are fused on corresponding flip-chip bumps 981 formed on a lower surface 980B of the IC-chip 980, thereby mounting the IC chip 980 on the printed wiring substrate 970 through flip-chip bonding. The printed wiring substrate 970 includes a number of hemispheric connection terminals 972 which are formed in grid array on a lower surface 970B thereof, thereby assuming the form of a printed wiring substrate of so-called BGA type. The connection terminals 972 assume the form of solder bumps made of 90Pb-10Sn solder. A portion of the connection terminals 972 located in a substantially central region of FIG. 26 serve as connection-to-capacitor bumps 973 to be connected to a capacitor 930, which will be described later. The remaining connection terminals 973 located around the central ones (located at the right- and left-hand sides in FIG. 26) serve as connection-to-substrate bumps 974 to be connected to a printed wiring substrate 920, which will be described later.

The flip-chip terminals 971 and the connection terminals 972 are connected by means of internal lines of the printed wiring substrate 970. The connection terminals 972 may assume the form of copper balls fixed by means of solder.

The capacitor-built-in-type interposer 910 includes a printed wiring substrate, or an interposer body 920, which assumes a substantially square shape and in which a closed-bottomed capacitor accommodation cavity 921 is formed, and the capacitor 930 disposed within the depression 921. The depression 921 is formed substantially at the center of the interposer body 920 and assumes a square shape as viewed from above and a closed-bottomed form having a bottom portion 922. The interposer body 920 and the capacitor 930 are fixedly attached into a single unit by means of an insulating filling resin 923 made of epoxy resin and filled into a gap therebetween. The internal structure of the capacitor 930 is substantially similar to that of embodiment 1 (see FIG. 2), and is thus not described herein.

A number of connection-to-IC-carrying-substrate substrate bumps (hereinafter may be referred to merely as substrate pads) 943P are formed on an upper surface (first substrate main-surface) 920A of the interposer body 920, which faces the lower surface 970B of the printed wiring substrate 970, in positions corresponding to those of the connection-to-substrate bumps 974 of the printed wiring substrate 970. The substrate pads 943P and the connection-to-substrate bumps 974 are connected by means of a solder 952. Similarly, a number of connection-to-IC-carrying-substrate capacitor pads (hereinafter may be referred to merely as capacitor pads) 931 are formed on an upper surface 930A of the capacitor 930, which faces the lower surface 970A of the printed wiring substrate 970, in positions corresponding to those of the connection-to-capacitor bumps 973. The capacitor pads 931 and the connection-to-capacitor bumps 973 are connected by means of the solder 952.

The interposer body 920 includes a core substrate 940 made of a glass-epoxy-resin composite material, a wiring layer 943 of copper formed on an upper surface 940A of the core substrate 940, and a wiring layer 944 of copper formed on a lower surface 940B of the core substrate 940. The interposer body 920 further includes an insulating resin layer 950 which is mainly made of epoxy resin and covers the upper surface 940A and the wiring layer 943, and an insulating resin layer 960 which is mainly made of epoxy resin and covers the lower surface 940B and the wiring layer 944. The wiring layers 943 and 944 are electrically connected by means of a through-hole conductor 945 formed on the inner wall of each core through-hole 142 extending through the core substrate 940. The through-hole conductors 945 are hollow without being filled with resin. A closed-bottomed depression 941 which assumes a square shape as viewed from above is formed at the center of the core substrate 940. The core substrate 940 becomes thin at the portion of the depression 941.

Openings 951 are formed in the insulating resin layer 950 in positions corresponding to those of the connection-to-substrate bumps 974, and extend from the upper surface 920A of the insulating resin layer 950 to the wiring layer 943. A portion of the wiring layer 943 exposed in each of the openings 951 serves as the substrate pad 943P to be connected to the connection-to-substrate bump 974. The openings 951 are each filled with the solder 952 of Pb—Sn eutectic solder such that the solder 952 rests on the substrate pad 943P and assumes a substantially hemispheric shape to thereby assume the form of a solder bump (see FIG. 27(*e*)).

When the IC-carrying substrate 990 is to be mounted, the solder bumps 952 are fused with the corresponding connection-to-substrate bumps 974.

Openings 961 are formed in grid array in a portion of the insulating resin layer 960 located outside the depression (located at the right- and left-hand sides in FIG. 26), in such a manner as to extend from a lower surface (second substrate main-surface) 920B of the insulating resin layer 960 to the wiring layer 944. A portion of the wiring layer 944 exposed in each of the openings 961 serves as a connection pad 944P. A nail-headed pin 962 is caused to fixedly abut each of the connection pads 944P by means of a solder 963. The pins 962 are adapted for connection to another printed wiring substrate, such as a motherboard, or a socket. Thus, the lower surface 920B of the interposer body 920 exhibits a feature of a PGA-type printed wiring substrate.

Accordingly, the pins 962 are inserted or brought into contact with another printed wiring substrate, such as a motherboard, or a socket for connection, whereby the IC-carrying substrate 990 or the IC chip 980 can be connected to, for example, the motherboard via the interposer body 920.

The insulating resin layers 950 and 960 serve as solder resist layers during soldering by means of the bump-shaped solder 952 or the solder 963 of the pins 962, or during connection between the solder 952 and the IC-carrying substrate 990 (printed wiring substrate 970).

In the interposer body 920 of the present embodiment, the connection pads 944P and the pins 962 are arranged in positions identical to those of the substrate pads 943P as viewed from above. Accordingly, the interposer body 920 converts the BGA-type connection-to-substrate bumps 974 to the PGA-type pins 962 while the planar position thereof is held unchanged.

As mentioned above, the capacitor 930 is substantially similar to the capacitor 130 of embodiment 1. The capacitor pads 931 are formed on the upper surface 930A. Accordingly, also in this capacitor 930, connection to a pair of electrode groups formed in the capacitor 930 can be established via the capacitor pads 931.

Since the capacitor pads 931 are formed in positions corresponding to those of the connection-to-capacitor bumps 973 of the printed wiring substrate 970, the capacitor pads 931 are arranged at intervals wider than those at which the connection-to-IC capacitor bumps 131 formed in positions corresponding to those of the connection-to-capacitor bumps 103 of the IC chip 101 are arranged.

Figure 26:
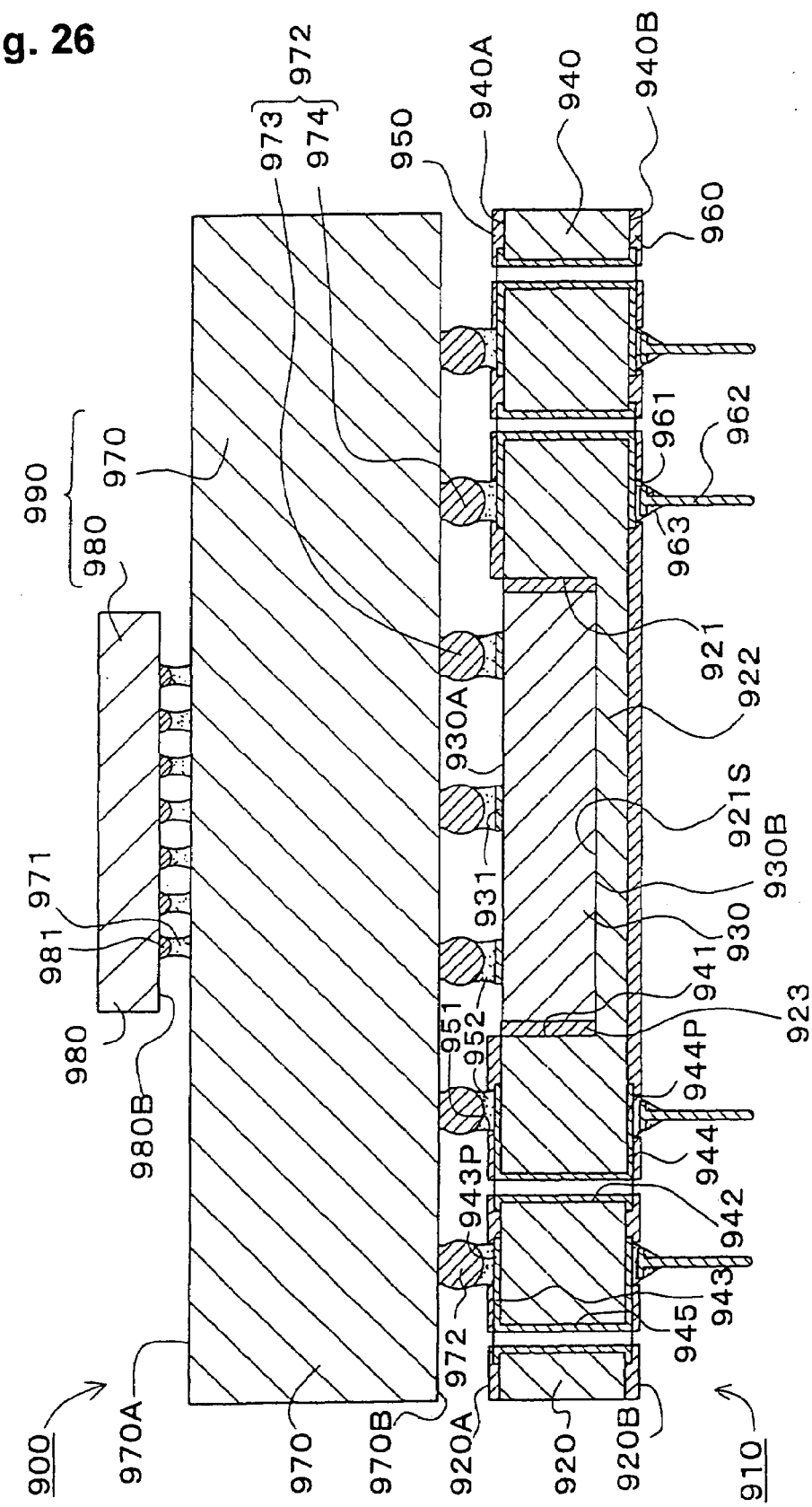
FIG. 26 is a sectional view showing a capacitor-built-in-type interposer according to embodiment 4 in which a capacitor is disposed in a closed-bottomed capacitor accommodation cavity formed in a printed wiring substrate serving as an interposer body.

Further, as shown in FIG. 26, a lower surface (second capacitor main-surface) 930B of the capacitor 930 abuts a bottom surface 921S of the depression 921, whereby the position of the capacitor 930 is determined with respect to the depth direction (in the vertical direction in FIG. 26), thereby restricting the position of the capacitor pads 931 with respect to the depth direction.

In the capacitor-built-in-type interposer 900 on which the IC-carrying substrate 990 is mounted, various signals can be exchanged between the IC-carrying substrate 990 and another printed wiring substrate, such as a motherboard, or a socket connected by means of the pins 962, through the wiring layer 944 formed in the interposer body 920, the through-hole conductors 945, the wiring layer 943, the solder 952, and the connection-to-substrate bumps 974. Similarly, various signals can be input to or output from the IC chip 980 via the printed wiring substrate 970. Also, power potential or ground potential can be supplied in a similar manner. Through connection of the capacitor 930 to power and ground lines formed in the printed wiring substrate 970, noise which may enter the power and ground lines can be eliminated.

Further, the capacitor 930 is disposed in the depression 921 formed in the interposer body 920 of a simple structure. Thus, even in the case where, after the IC-carrying substrate 990 is mounted on the capacitor-built-in-type interposer 910, a short circuit or lack of capacitance caused by a defect in the capacitor 930 itself or by defective mounting is found in the capacitor 930, there is no need to discard the expensive IC chip 980 or the expensive printed wiring substrate 970 on which the IC chip 980 is mounted and which generally bears complicated wiring. Specifically, the IC-carrying substrate 990 may be separated from the capacitor-built-in-type interposer 910, and then merely the capacitor-built-in-type interposer 910 may be discarded. Loss which arises from a defective capacitor can be reduced.

Next will be described a process for fabricating the capacitor-built-in-type interposer 910 as well as a process for fabricating the interposer body 920, which is a component member of the capacitor-built-in-type interposer 910. Notably, since the capacitor 930 may be formed in a manner similar to that of embodiment 1, description of a process for fabricating the capacitor 930 is omitted.

Figure 27:
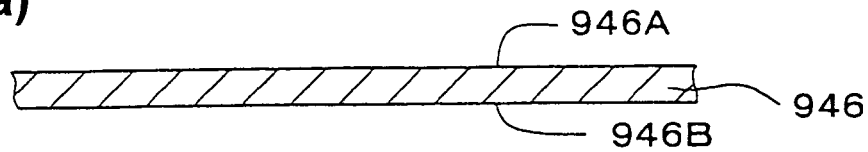
FIGS. 27(a) to 27(e) are views for explaining a process for fabricating the interposer body of embodiment 4 having the capacitor accommodation cavity formed therein.
Figure 27:
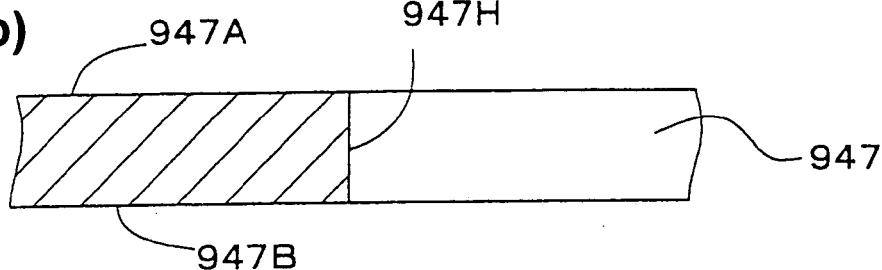
Figure 27:
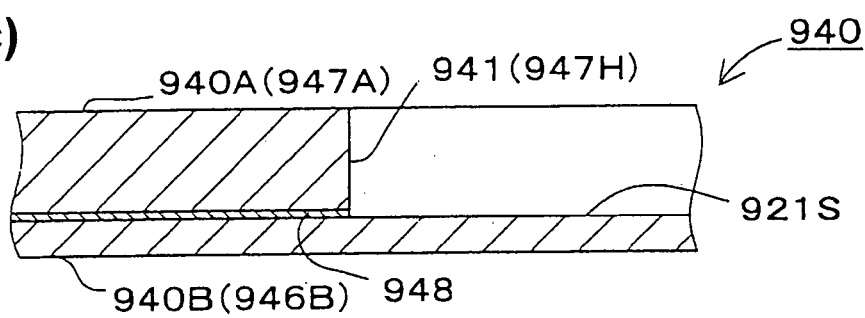
Figure 27:
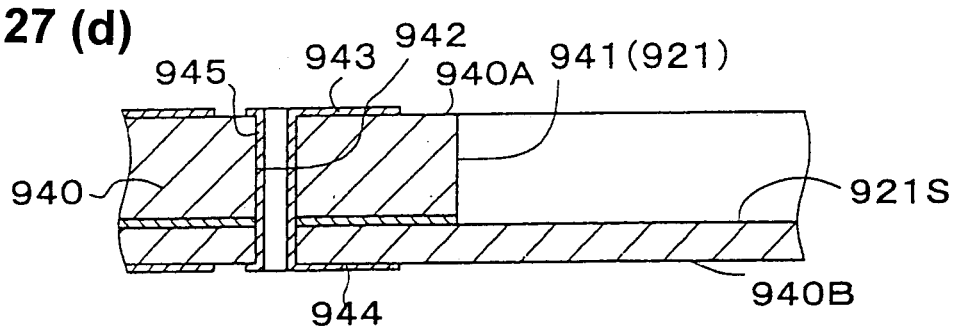
Figure 27:
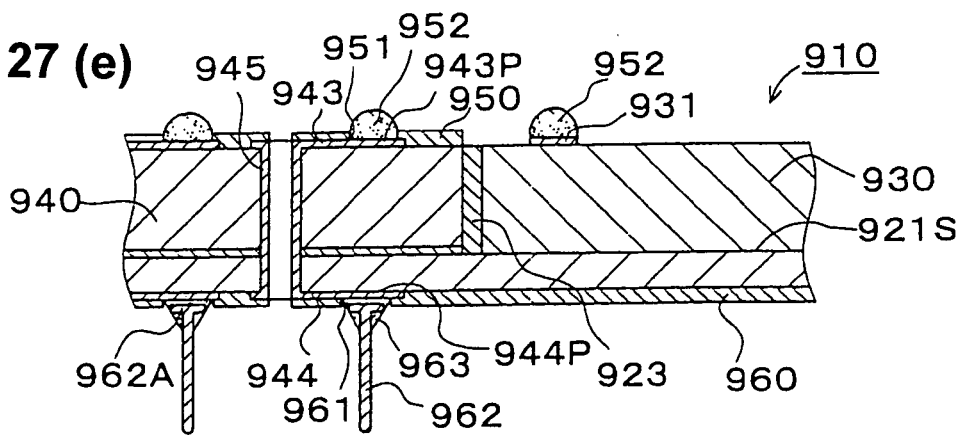

First, as shown in FIG. 27(*a*), there is prepared a core substrate body 946 which is made of a glass-epoxy-resin composite material and is adapted to define a bottom portion.

As shown in FIG. 27(*b*), there is prepared a core substrate body 947 which is made of the glass-epoxy-resin composite material, which is thicker than the core substrate body 946 adapted to define a bottom portion, and which is adapted to define a wall portion. A through-hole 947H adapted to define a depression is formed beforehand in the core substrate body 947 in a position corresponding to the depression 921 (941).

Next, as shown in FIG. 27(*c*), through bonding by means of an adhesive layer 949 of epoxy resin, the core substrate 940 is formed. The depression 941 (497H) is formed on the core substrate 940. A portion of an upper surface 946A of the core substrate body 946 which is exposed in the depression 941 serves as the bottom surface 921S of the capacitor accommodation cavity 921.

Next, core through-holes 942 are drilled in the core substrate 940 outside the depression 941 in such a manner as to extend between the upper surface 940A and the lower surface 940B of the core substrate 940. Further, by means of a known process for forming a wiring layer and a through-hole conductor, the wiring layers 943 and 944 of Cu are formed on the upper surface 940A of the core substrate 940 and on the lower surface 940B of the core substrate 940, respectively, and the through-hole conductors 945 of Cu are formed on the interior walls of and around the corresponding core through-holes 942 in such a manner as to be connected to the wiring layers 943 and 944.

Subsequently, by means of a known process, the insulating resin layer 950 of epoxy resin is formed on the wiring layer 943 and the upper surface 940A of the core substrate 940; and the insulating resin layer 960 of epoxy resin is formed on the wiring layer 944 and the lower surface 940B of the core substrate 940. Openings 951 are formed in the insulating resin layer 950 in predetermined positions such that the substrate pads 943P of the wiring layer 943 are exposed therethrough; and openings 961 are formed in the insulating resin layer 960 in predetermined positions such that the connection pads 944P of the wiring layer 944 are exposed therethrough.

Next, the previously formed capacitor 930 is placed in the depression 921. The filling resin 923 is injected into a gap between the depression 921 and the capacitor 930 and is then allowed to set, thereby fixing the capacitor 930 within the depression 921.

Further, solder paste is applied into the openings 951 and onto the capacitor pads 931, and also solder paste is applied into the openings 961. The pins 962 are set such that head portions 962A abut the corresponding connection pads 944P. Then, the applied solder paste is caused to melt so as to form the solder 952 assuming the form of a bump and to fixedly attach the pins 962 to the corresponding connection pads 944P, thereby completing the interposer body 920 and the capacitor-built-in-type interposer 910. Since the position of the capacitor 930 is restricted with respect to the depth direction by means of the bottom surface 921S of the depression 921, the solder 952 formed on the capacitor 930 and the solder 952 formed on the interposer body 920 become substantially coplanar. Preferably, as in the case of embodiment 1, the top portions of the solder 952 are flattened by means of the flattening jig JG in order to improve coplanarity.

Subsequently, while the lower surface 970B of the printed wiring substrate 970 on which the IC chip 980 is mounted (IC-carrying substrate 990) is caused to face the upper surface 920A of the interposer 910 and the upper surface 930A of the capacitor 930, the connection terminals 972 are aligned with the solder 952 assuming a bump form. The solder 952 is caused to melt to thereby be fused with the connection terminals 972, whereby the IC-carrying substrate 990 is mounted on the capacitor-built-in-type interposer 910, thereby completing the capacitor-built-in-type interposer 910 on which the IC-carrying substrate is mounted.

Modified Embodiment 8

In the above-described embodiment 4, the nail-headed pins 962 are fixedly attached to the interposer body 920 such that the head portions 962A abut the corresponding connection pads 944P. However, another process may be employed in order to fixedly attach pins to an interposer body (printed wiring substrate).

Figure 28:
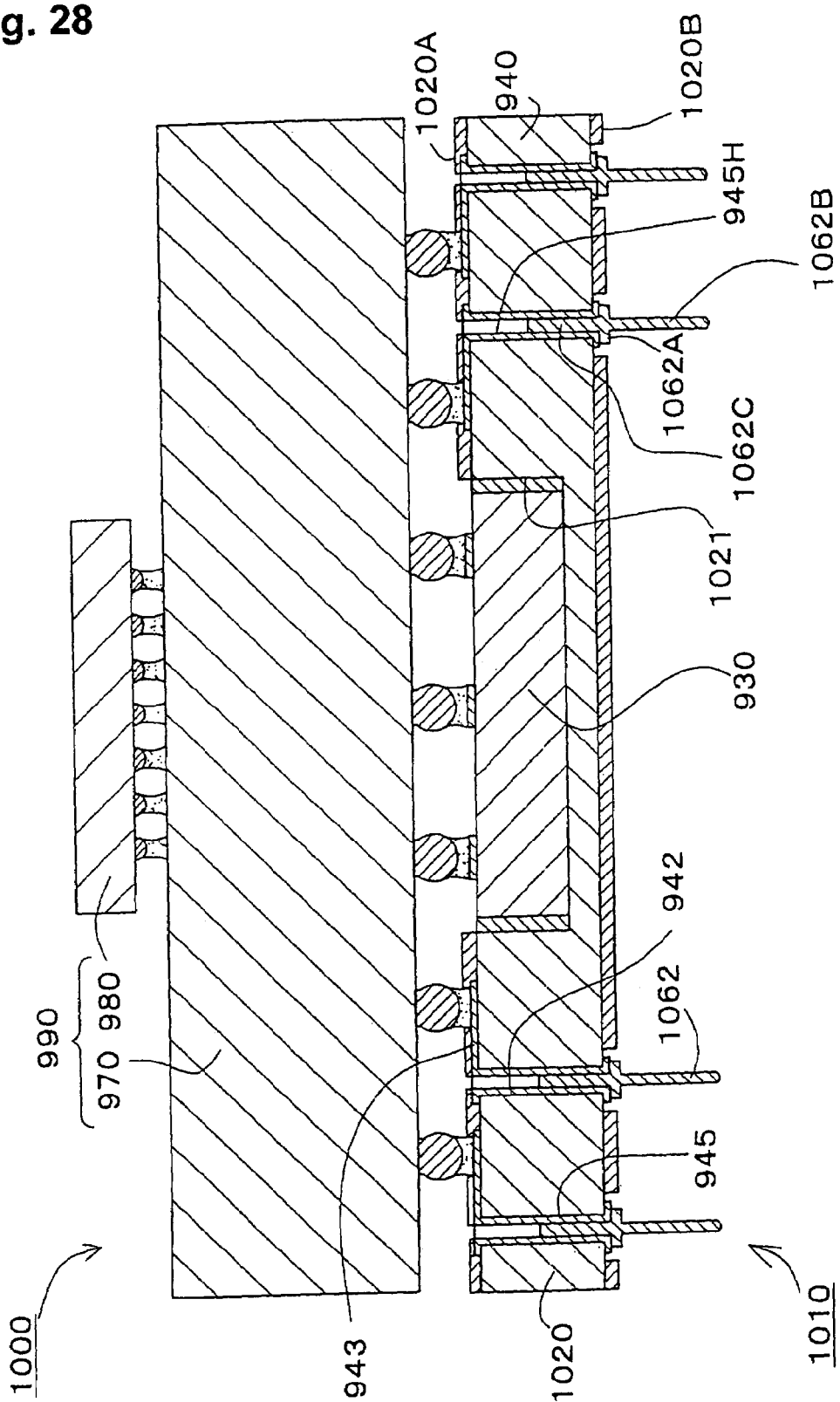
FIG. 28 is a sectional view showing a capacitor-built-in-type interposer according to modified embodiment 8 in which pins are inserted into an interposer body for connection.

For example, an interposer body 1020 shown in FIG. 28 may be employed. Specifically, the present embodiment employs a pin 1062 which includes a large-diameter portion 1062A, a body portion 1062B having a diameter smaller than that of the large-diameter portion 1062A, and an attachment portion 1062C having a diameter smaller than that of the large-diameter portion 1062A. The body portion 1062B and the attachment portion 1062C extend from the large-diameter portion 1062A in axially opposite directions (in vertically opposite directions in FIG. 28). Each pin 1062 may be fixedly attached to the interposer body 1020 such that the attachment portion 1062C is inserted into a through-hole 945H defined by the interior wall surface of the through-hole conductor 945 formed in the core substrate 940, followed by soldering for fixation.

Alternatively, a nail-headed pin may be inserted into the interposer body 1020 from an upper surface 1020A of the interposer body 1020 such that a tip thereof projects downward beyond a lower surface 1020B, followed by soldering for fixation.

Modified Embodiment 9

Figure 29:
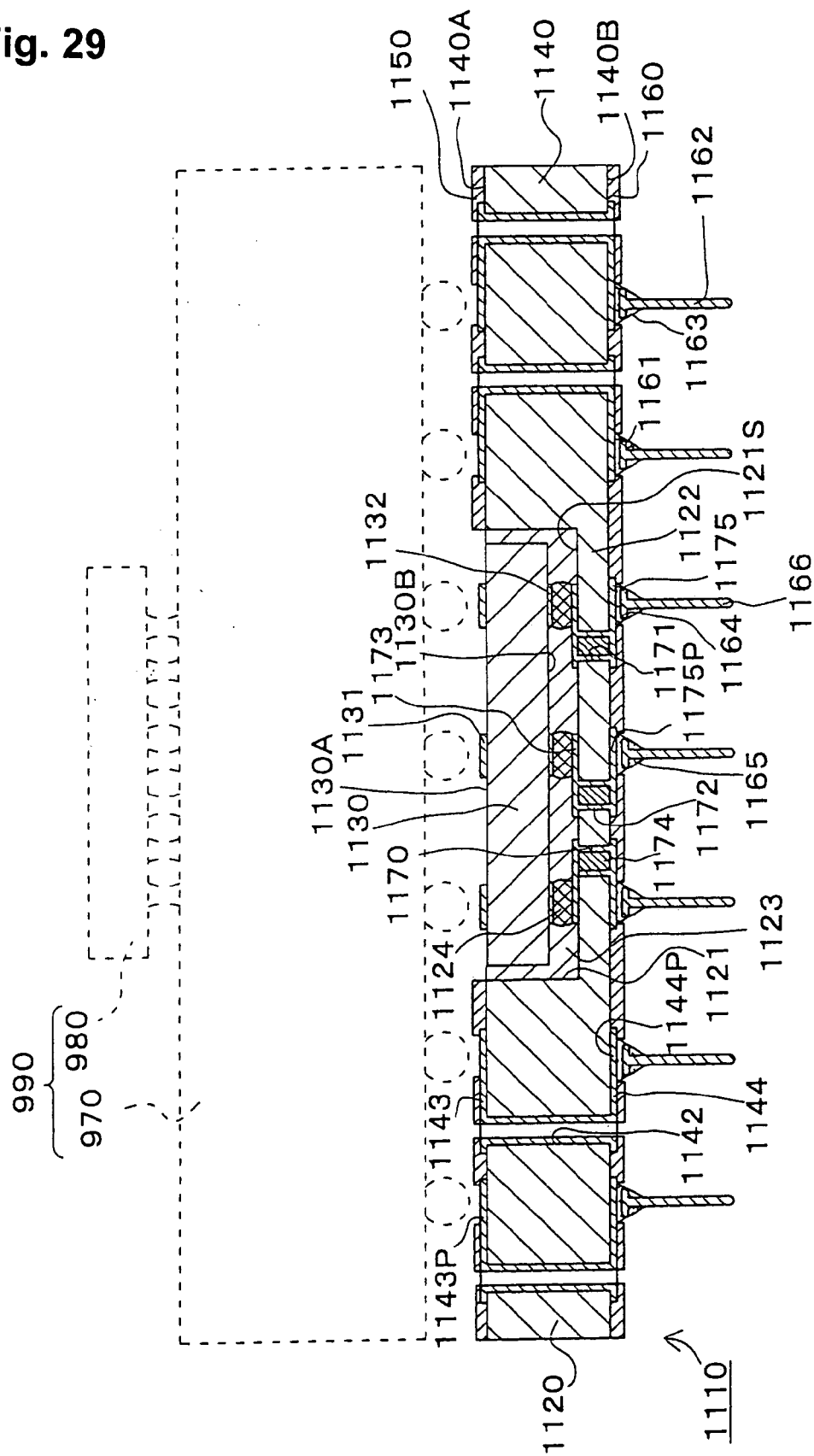
FIG. 29 is a sectional view showing a capacitor-built-in-type interposer according to modified embodiment 9 in which a capacitor having capacitor terminals formed on its upper and lower sides is disposed in and connected to a closed-bottomed capacitor accommodation cavity having through-hole conductors formed in its bottom portion and formed in an interposer body.
Figure 30:
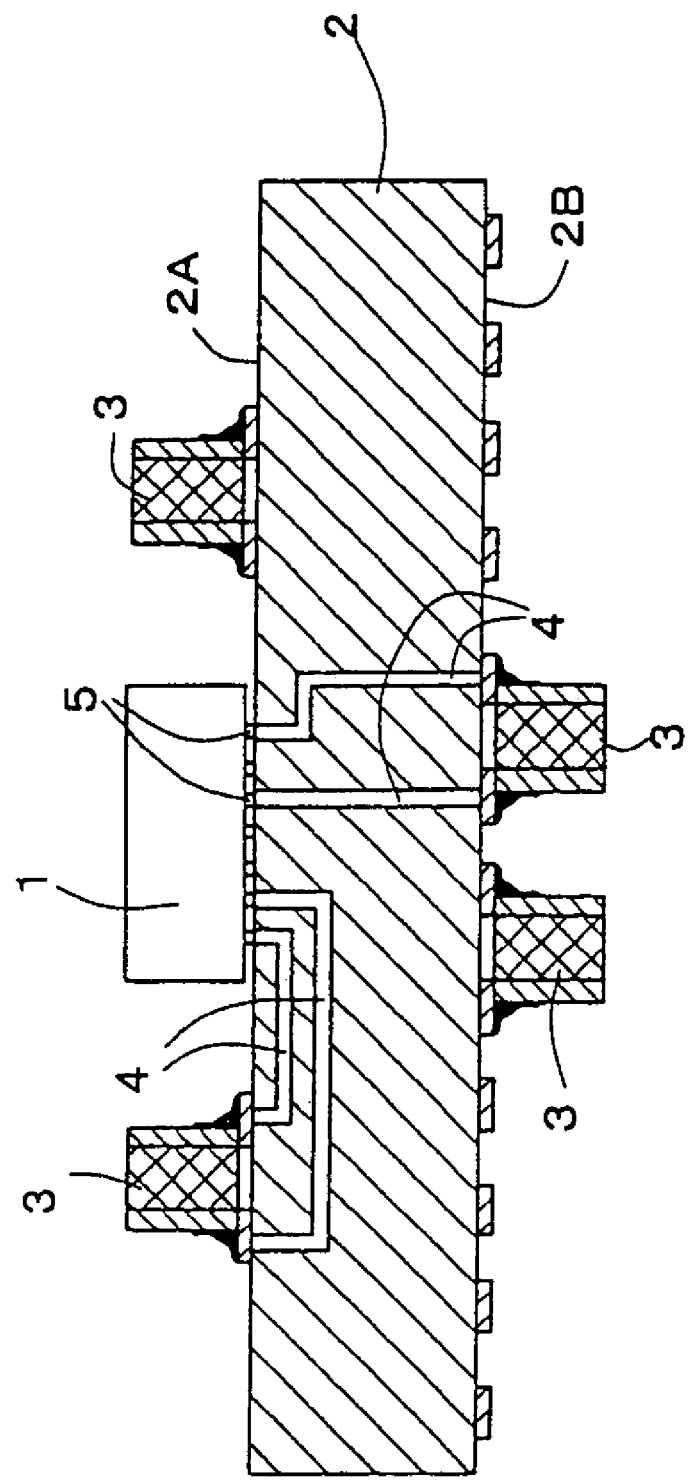
FIG. 30 is a view for explaining wiring for connection to capacitors in a conventional printed wiring substrate in which the capacitors are mounted on upper and lower surfaces thereof.

In the above-described embodiment 4, the capacitor 930, which includes the capacitor pads 931 formed merely on the upper surface 930A thereof, is used, and connection lines, such as vias, are not formed in the bottom portion 922 of the depression 921. However, resembling embodiment 2, a capacitor-built-in-type interposer 1110 of the present modified embodiment 9 shown in FIG. 29 differs from embodiment 4 in that a lower surface 1130B of a capacitor 1130 is connected to connection lines formed in a bottom portion 1122 of a closed-bottomed capacitor accommodation cavity 1121 formed in an interposer body 1120 to thereby permit connection to the capacitor 1130 from underneath, in addition to the feature that an upper surface 1130A of the capacitor 1130 can be connected to an IC-carrying substrate 990. Accordingly, different features will be mainly described, while description of similar features will be omitted or given briefly.

In the capacitor-built-in-type interposer 1110 of modified embodiment 9, the capacitor 1130 includes capacitor pads 1131 formed on the upper surface 1130A thereof and second-surface capacitor pads 1132 formed on the lower surface 1130B thereof. As in the case of the capacitor 530 of embodiment 2, in this capacitor 1130, some of the capacitor pads 1131 are connected to one of paired electrode groups formed in the capacitor 1130, while others are connected to the other electrode group. Similarly, some of the second-surface capacitor pads 1132 are connected to one of the paired electrode groups formed in the capacitor 1130, while others are connected to the other electrode group.

As in the case of embodiment 4, the interposer body 1120 includes substrate pads 1143P, a wiring layer 1143, through-hole conductors 1145, a wiring layer 1144, connection pads 1144P, and pins 1162.

As in the case of the capacitor-built-in-type printed wiring substrate 510 of embodiment 2, the interposer body 1120 further includes, on a lower surface 1140B of the bottom portion 1122, a wiring layer 1175, openings 1164 formed in an insulating resin layer 1160, connection pads 1175P exposed through the corresponding openings 1164, and pins 1166 which are fixed by means of a solder 1165. Bottom through-hole conductors 1172 are formed on the interior walls of corresponding through-holes 1171 extending between a bottom surface 1121S of the depression 1121 and the lower surface 1140B of the core substrate. Connection-to-capacitor pads 1173 are formed on the bottom surface 1121S. That is, connection lines 1170 extend from the pins 1166 and the connection pads 1175P to the bottom surface 1121S.

The connection lines 1170; specifically, the connection-to-capacitor pads 1173 are connected to the second-surface capacitor pads 1132 of the capacitor 1130 by means of an Ag—Sn solder 1124.

In this capacitor-built-in-type interposer 1110, signals can be input to or output from the pins 1162 so as to be input to or output from the IC-carrying substrate 990 via the interposer body 1120. Similarly, power potential or ground potential can be supplied as needed. Also, power potential or ground potential can be input to the pins 1166 located immediately below the depression 1121 so as to be supplied to the IC-carrying substrate 990 or to the IC chip 980 via the connection lines 1170 and the capacitor 1130. The capacitor effectively eliminates noise superposed on, for example, power potential before the power potential is supplied to the IC-carrying substrate 990.

Further, as in the case of embodiment 4, even when the capacitor 1130 becomes defective, the inexpensive capacitor-built-in-type interposer 1110 of a simple structure may be discarded without need to discard the expensive IC-carrying substrate 990.

A process for fabricating the capacitor 1130 and that for fabricating the interposer body 1120 are substantially similar to those of embodiment 2; thus, description thereof is omitted.

While the present invention has been described with reference to the embodiments and modified embodiments, the present invention is not limited thereto, but is capable of being modified as appropriate without departing from the scope of the invention.

For example, in the above-described embodiment 3, a single insulating resin layer 750 is formed on the upper surface of the core substrate 740, and a single insulating resin layer 760 is formed on the lower surface of the core substrate 740. However, as in the case of modified embodiment 2 relative to embodiment 1 and modified embodiment 4 relative to embodiment 2, a number of insulating resin layers may be formed.

In the above-described embodiments and modified embodiments, a glass-epoxy-resin composite material is used as material for the core substrates 140, etc.; more specifically, for the substrate bodies 147, etc. adapted to define a bottom portion and the core substrate bodies 148, etc. adapted to define a wall portion. However, material for the core substrate may be selected in consideration of heat resistance, mechanical strength, flexibility, and workability. Examples of such material include glass-fiber-resin composite material composed of glass fiber, such as glass woven fabric or glass unwoven fabric, and resin, such as epoxy resin, polyimide resin, or BT resin; composite material composed of organic fiber, such as polyamide fiber, and resin; and resin-resin composite material formed by impregnating a three-dimensional network fluorine-containing resin, such as PTFE having continuous pores formed therein, with epoxy resin. Also, a metal plate, such as a copper plate, a ceramic plate, or a porcelain enameled plate may be used as a core substrate. Further, a printed wiring substrate which does not use a core substrate may be employed.

The insulating resin layers 150, etc. contain epoxy resin as a main component. However, material for the insulating resin layers 150, etc. may be selected as adequate in consideration of heat resistance and patterning workability. Examples of such material include polyimide resin, BT resin, PPE resin, and resin-resin composite material formed by impregnating a three-dimensional network fluorine-containing resin, such as PTFE having continuous pores formed therein, with epoxy resin.

Similarly, copper is used as material for the wiring layers 143, etc. However, other material, such as Ni or Ni—Au, may be used. A process for forming the wiring layers 143, etc. is not limited to plating. The wiring layers 143, etc. may be formed through application of conductive resin.

In embodiment 1 described above, in order to establish connection to the IC chip 101, a number of flip-chip pads 143P and a number of flip-chip bumps 152 are formed on the upper surface 120A of the printed wiring substrate. However, connection terminals to be connected to an IC chip or IC-carrying substrate may be selected according to the corresponding terminals formed on the IC chip or IC-carrying substrate. The connection terminals may be composed solely of flip-chip bumps or flip-chip pads.

In the above-described embodiments and modified embodiments, a single capacitor accommodation cavity is formed in the printed wiring substrate substantially at the center thereof. However, the capacitor accommodation cavity is not necessarily positioned substantially at the center of the printed wiring substrate. Also, a plurality of capacitor accommodation cavities may be provided so as to accommodate a plurality of capacitors. By contrast, a plurality of capacitors may be accommodated within a single cavity in order to cope with a plurality of power potentials.

The capacitors 130, etc. are described while mentioning a laminated ceramic capacitor which includes the dielectric layers 132 and the electrode layers 133 arranged in layers and substantially in parallel to the upper and lower surfaces 130A and 130B of the capacitor. However, a capacitor to be disposed within a cavity may assume any form, so long as connection-to-IC capacitor pads or connection-to-IC capacitor bumps are formed on the upper surface thereof, and as needed second-surface capacitor pads are formed on the lower surface thereof. The direction of lamination and the internal structure of the capacitor may be modified as adequate. For example, dielectric layers and electrode layers may be laminated substantially perpendicularly to the upper surface of the capacitor.

The above embodiments are described while mentioning high-dielectric-constant ceramic which contains $BaTiO_3$ as a main component, as material for the dielectric layers 132, etc. However, material for the dielectric layers is not limited thereto. Examples of such material include $PbTiO_3$, $PbZrO_3$, $TiO_2$, $SrTiO_3$, $CaTiO_3$, $MgTiO_3$, $KNbO_3$, $NaTiO_3$, $KTaO_3$, $RbTaO_3$, $(Na_{1/2}Bi_{1/2})TiO_3$, $Pb(Mg_{1/2}W_{1/2})O_3$, and $(K_{1/2}Bi_{1/2})TiO_3$. Material may be selected as adequate according to a required capacitance of the capacitor.

Pb is used as material for the electrode layers 133, etc. and the via conductors 135, etc. However, the material may be selected in consideration of compatibility with material for the dielectric layer. Examples of such material include Pt, Ag, Ag—Pt, Ag—Pd, Cu, Au, and Ni.

The via conductors 135, etc. are used as means for mutually connecting the electrode layers 133, etc. However, the means is not limited thereto. For example, a common electrode may be formed on a side face of the capacitor.

Further, the capacitor may be fabricated such that dielectric layers containing high-dielectric-constant ceramic as a main component and electrode layers made of Pd or the like are combined with resin layers, as well as via conductors and wiring layers formed through Cu plating, Ni plating or the like.

In the above-described embodiment 2, the second-surface capacitor pads 536 and the corresponding connection-to-capacitor pads 573 (connection lines 570) are connected by means of Ag—Sn solder. However, any other appropriate solder may be selected in consideration of soldering performance and soldering temperature. Examples of such solder include Pb—Sn high-melting-point solder, Au—Si, Sn—Ag, Sn—Cu, Sn—Bi, Sn—Zn, Sn—Au, Sn—Ag—Bi, Sn—Zn—Bi, and Sn—Ag—Cu. Alternatively, for example, an anisotropic conductive resin sheet which is conductive only in the vertical direction may be interposed between the capacitor 530 (second-surface capacitor pads 536) and the connection-to-capacitor pads 573 so as to establish connection therebetween.

In embodiment 1 described above, after the capacitor 130 or the like is disposed in the capacitor accommodation cavity 121, the filling resin 123 is filled into a gap therebetween. Further, in embodiment 3, the filling resin layers 723B and 723C are formed on the upper surface 730A of the capacitor and the upper surface 740A of the core substrate, respectively; and the filling resin layers 723D and 723E are formed on the lower surface 730B of the capacitor and the lower surface 740B of the core substrate, respectively (see FIG. 24(*c*)). However, at least, the capacitor may be fixed within the capacitor accommodation cavity by means of filling resin. Accordingly, for example, the filling resin may be injected only into the capacitor accommodation cavity.

In embodiment 3 described above, the capacitor rest portion 747T is formed along the through-hole 741. The abutment surface 730C and shoulder portion 730P of the capacitor 730 abut and fit the capacitor rest portion 747T.

However, through mere abutment to the rest portion 747T, the position of the capacitor 730 can be restricted in the vertical direction in FIG. 21.

According to embodiment 3, as shown in FIG. 23(*a*), the capacitor rest portion 747T of the core substrate 740 assumes the form of a substantially square frame having a substantially constant width and extending along the periphery of the through-hole 741 as viewed from the lower surface 740B of the core substrate 740. However, the capacitor rest portion 747T may assume any other form.

Figure 22:
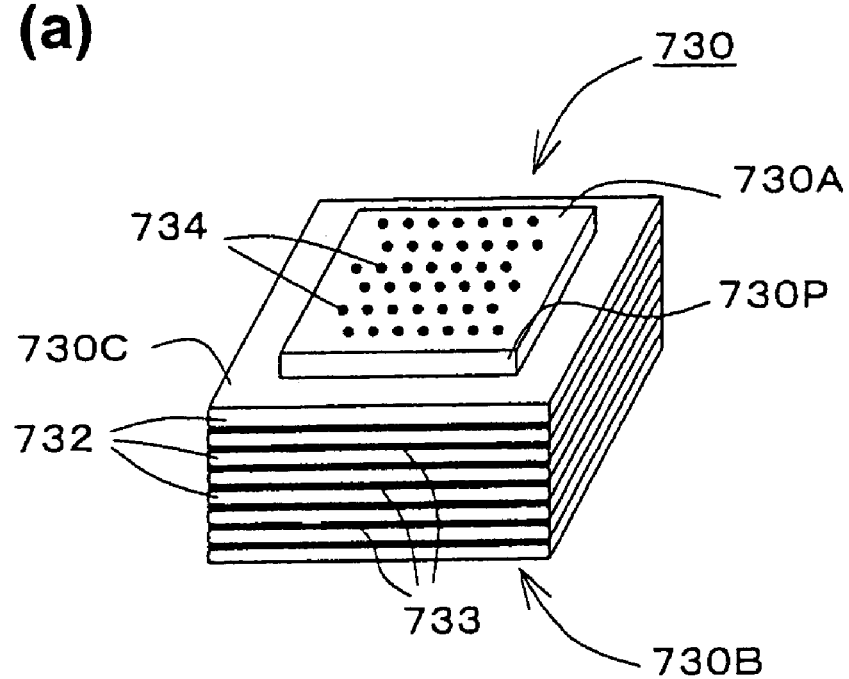
Figure 22:
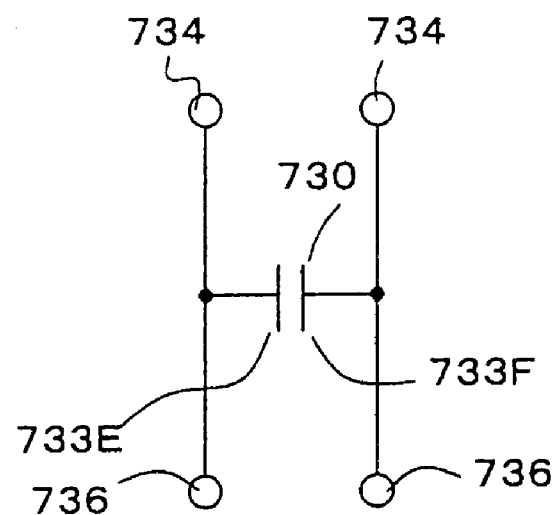

Further, according to embodiment 3, the shoulder portion 730P of the capacitor 730 is provided along the peripheral edge of the upper surface 730A of the capacitor 730 and in the form of a square frame (see FIG. 22). However, the shoulder portion may assume any other form, so long as it fits the capacitor rest portion (for example, the capacitor rest portion 747T in embodiment 3).

In place of the shoulder portion, a protrusion to be engaged with the capacitor rest portion may be formed on the upper surface of the capacitor.

The shape of the capacitor and the shape of the capacitor rest portion of the core substrate are not particularly limited, but may be selected as adequate, so long as they abut and fit each other. For example, both the shoulder portion and the protrusion may be formed.

As easily understood from the above description, the capacitor can be vertically positioned within the through-hole, so long as the capacitor rest portion and the capacitor are shaped such that the inward oriented surface of the capacitor rest portion and the abutment surface of the capacitor abut each other. Further, the capacitor can be horizontally positioned within the through-hole, so long as the capacitor rest portion (inner peripheral edge of the capacitor rest portion) and the shoulder portion of the capacitor are shaped so as to fit each other.

Modified embodiments 4, 5, and 6 are described while mentioning the CSP 810, 830, and 850 having the respective lower surfaces 810B, etc. of a BGA type. However, the type of connection is not limited thereto. An LGA type or butt joint PGA type may be employed.

Similarly, embodiment 4 and modified embodiments 8 and 9 are described while mentioning the interposer bodies 920, 1020, and 1120 having the lower surfaces 920B, etc. on which the pins 962, etc. are provided; i.e., a PGA type. However, the type of connection is not limited thereto. An LGA type or BGA type may be employed.

According to modified embodiments 4, 5, and 6, the IC-carrying CSPs 820, etc. are mounted on the corresponding capacitor-built-in-type printed wiring substrates 110, etc. of embodiment 1 and modified embodiments 1 and 2. However, an IC-carrying CSP may be mounted on the capacitor-built-in-type printed wiring substrates 510 and 710 of embodiments 2 and 3, respectively.

This application is based on Japanese Patent Application Nos. Hei. 11-89490 filed Mar. 30, 1999 and Hei. 11-216837 filed Jul. 30, 1999, which are incorporated herein by reference in their entirety.

What is claimed is:

1. A printed wiring substrate having a planar surface and a built-in capacitor having vertical sides on which an IC chip is mounted, said printed wiring substrate comprising a capacitor accommodation cavity selected from the group consisting of a closed-bottom cavity and a through hole cavity extending in the thickness direction of the printed wiring substrate and a capacitor disposed in said cavity, wherein the vertical sides of the capacitor and the printed wiring substrate are fixed together with an insulating resin filling a gap between the cavity and the capacitor, characterized in that:

the capacitor comprises:

a pair of electrodes or electrode groups; and the capacitor comprises a plurality of capacitor terminals, wherein the respective capacitor terminals are electrically connected to one or the other of the paired electrodes or electrode groups;

the printed wiring substrate comprises a plurality of substrate terminals;

the IC chip comprises a plurality of connection-to-capacitor terminals and a plurality of connection-to-substrate terminals;

the plurality of capacitor terminals of the capacitor are respectively flip-chip-bonded directly to a plurality of connection-to-capacitor terminals of the IC chip; and the plurality of substrate terminals of the printed wiring substrate are respectively flip-chip-bonded to a plurality of connection-to-substrate terminals of the IC chip.

2. The printed wiring substrate according to claim 1, characterized in that:

the printed wiring substrate comprises a core substrate made of resin and a capacitor accommodation cavity for accommodating the capacitor; and the capacitor comprises a dielectric layer made of ceramic and electrodes arranged in alternating layers.

3. A printed wiring substrate having a planar surface and a built-in capacitor having vertical sides on which an IC-chip-carrying printed wiring substrate is mounted, said printed wiring substrate comprising a capacitor accommodation cavity selected from the group consisting of a closed-bottom cavity and a through hole cavity extending in the thickness direction of the printed wiring substrate and a capacitor disposed in said cavity, wherein the vertical sides of the capacitor and the printed wiring substrate are fixed together with an insulating resin filling a gap between the cavity and the capacitor, characterized in that:

the capacitor comprises:

a pair of electrodes or electrode groups; and the capacitor comprises a plurality of capacitor terminals, wherein the respective capacitor terminals are electrically connected to one or the other of the paired electrodes or electrode groups;

the printed wiring substrate comprises a plurality of substrate terminals;

the IC chip-carrying printed wiring circuit comprises a plurality of connection-to-capacitor terminals and a plurality of connection-to-substrate terminals;

the plurality of capacitor terminals of the capacitor are respectively bonded in a connection-face-to-connection-face manner directly to a plurality of connection-to-capacitor terminals of the IC-chip-carrying printed wiring substrate; and the plurality of substrate terminals of the printed wiring substrate are respectively bonded in a connection-face-to-connection-face manner to a plurality of connection-to-substrate terminals of the IC-chip-carrying printed wiring substrate.

4. The printed wiring substrate according to claim 3, wherein the IC-chip-carrying printed wiring substrate is a CSP adapted for mounting an IC chip.

5. The printed wiring substrate according to claim 4, characterized in that:

the printed wiring substrate comprises a core substrate made of resin and a capacitor accommodation cavity for accommodating the capacitor; and the capacitor comprises a dielectric layer made of ceramic and electrodes arranged in alternating layers.

6. A printed wiring substrate having a planar surface and a built-in capacitor having vertical sides for mounting an IC chip or IC-chip-carrying printed wiring substrate having a plurality of connection-to-capacitor terminals and a plurality of connection-to-substrate terminals, said printed wiring substrate comprising a capacitor accommodation cavity selected from the group consisting of a closed-bottom cavity and a through hole cavity extending in the thickness direction of the printed wiring substrate and a capacitor disposed in said cavity, wherein the vertical sides of the capacitor and the printed wiring substrate are fixed together with an insulating resin filling a gap between the cavity and the capacitor, characterized in that:

the capacitor comprises:

a pair of electrodes or electrode groups; and the capacitor comprises a plurality of capacitor terminals capable of being respectively flip-chip-bonded or bonded in a connection-face-to-connection-face manner to a plurality of connection-to-capacitor terminals of the IC chip or IC-chip-carrying printed wiring substrate, wherein the respective capacitor terminals are electrically connected to one or the other of the paired electrodes or electrode group; and the printed wiring substrate comprises a plurality of substrate terminals capable of being respectively flip-chip-bonded or bonded in a connection-face-to-connection-face manner directly to a plurality of connection-to-substrate terminals of the IC chip or IC-chip-carrying printed wiring substrate.

7. The printed wiring substrate according to claim 6, wherein the capacitor and the printed wiring substrate are fixed together with an insulating resin.

8. The printed wiring substrate according to claim 6, characterized in that:

the capacitor comprises a first capacitor main-surface, on which the plurality of capacitor terminals are formed;

the printed wiring substrate comprises a first substrate main-surface, on which the plurality of substrate terminals are formed; and the plurality of capacitor terminals and the plurality of substrate terminals are substantially coplanar.

9. The printed wiring substrate according to claim 6, characterized in that:

the printed wiring substrate comprises:

a capacitor accommodation cavity for accommodating the capacitor; and a cavity periphery region located around the capacitor accommodation cavity; and the plurality of substrate terminals are formed in the cavity periphery region.

10. The printed wiring substrate according to claim 6, characterized in that:

the printed wiring substrate comprises a capacitor accommodation cavity for accommodating the capacitor, said capacitor being disposed in the capacitor accommodation cavity; and the capacitor accommodation cavity comprises a capacitor position restriction portion which abuts the capacitor disposed therein so as to restrict a position of the capacitor in a depth direction of the capacitor accommodation cavity.

11. The printed wiring substrate according to claim 6, characterized in that:

the printed wiring substrate assumes a substantially plate shape having a first substrate main-surface and a second substrate main-surface and comprises:

a closed-bottomed capacitor accommodation cavity which is sunk below the first substrate main-surface toward the second substrate main-surface and is adapted to accommodate the capacitor;

a plurality of second-surface substrate terminals formed on the second substrate main-surface; and a plurality of connection lines extending from some of the plurality of second-surface substrate terminals to a bottom surface of the closed-bottomed capacitor accommodation cavity;

the capacitor is disposed in the closed-bottomed capacitor accommodation cavity and comprises:

a first capacitor main-surface;

a second capacitor main-surface substantially parallel to the first capacitor main-surface; and a plurality of second-surface capacitor terminals formed on the second capacitor main-surface, wherein the respective second-surface capacitor terminals are electrically connected to one or the other of the paired electrodes or electrode groups;

the plurality of substrate terminals are formed on the first substrate main-surface;

the plurality of capacitor terminals are formed on the first capacitor main-surface; and the plurality of second-surface capacitor terminals are connected to corresponding connection lines which extend to the bottom surface of the closed-bottomed capacitor accommodation cavity.

12. The wiring substrate according to claim 6, characterized in that:

the printed wiring substrate assumes a substantially plate shape having a first substrate main-surface and a second substrate main-surface and comprises:

a through capacitor accommodation cavity which extends through the printed wiring substrate between the first substrate main-surface and the second substrate main-surface and is adapted to accommodate the capacitor; and a plurality of second-surface substrate terminals formed on the second substrate main-surface;

the capacitor is disposed in the through capacitor accommodation cavity and comprises:

a first capacitor main-surface;

a second capacitor main-surface substantially parallel to the first capacitor main-surface; and a plurality of second-surface capacitor terminals formed on the second capacitor main-surface, wherein the respective second-surface capacitor terminals are electrically connected to one or the other of the paired electrodes or electrode groups;

the plurality of substrate terminals are formed on the first substrate main-surface; and the plurality of capacitor terminals are formed on the first capacitor main-surface.

13. The printed wiring substrate according to claim 11, wherein the plurality of second-surface capacitor terminals are disposed at intervals greater than those of the plurality of capacitor terminals.

14. The printed wiring substrate according to claim 12, wherein the plurality of second-surface capacitor terminals are disposed at intervals greater than those of the plurality of capacitor terminals.

15. The printed wiring substrate according to claim 6, wherein the printed wiring substrate serves as an interposer between the IC-chip-carrying printed wiring substrate and another printed wiring substrate.

16. The printed wiring substrate according to claim 6, characterized in that:

the printed wiring substrate comprises a core substrate made of resin and a capacitor accommodation cavity for accommodating the capacitor; and the capacitor comprises a dielectric layer made of ceramic and electrodes arranged in alternating layers.

* * * * *